US007661893B2

(12) United States Patent
Kureishi et al.

(10) Patent No.: US 7,661,893 B2
(45) Date of Patent: Feb. 16, 2010

(54) LENS BARREL

(75) Inventors: Tatsuo Kureishi, Tokyo (JP); Nobuaki Aoki, Tokyo (JP)

(73) Assignee: Sony Corporation, Tokyo (JP)

( * ) Notice: Subject to any disclaimer, the term of this patent is extended or adjusted under 35 U.S.C. 154(b) by 487 days.

(21) Appl. No.: 11/526,000

(22) Filed: Sep. 25, 2006

(65) Prior Publication Data
US 2007/0092247 A1  Apr. 26, 2007

(30) Foreign Application Priority Data
Oct. 20, 2005  (JP) ............................. 2005-306465

(51) Int. Cl.
 G03B 9/02   (2006.01)
 G03B 17/00  (2006.01)
 H05K 1/00   (2006.01)
 H04N 5/225  (2006.01)
(52) U.S. Cl. ................... 396/505; 396/542; 348/360; 361/749
(58) Field of Classification Search ................ 396/72, 396/462, 436, 505, 542; 361/749
 See application file for complete search history.

(56) References Cited
U.S. PATENT DOCUMENTS

| 4,864,348 A | 9/1989 | Fujiwara et al. ............. 396/542 |
| 4,951,083 A | 8/1990 | Okura et al. ................ 396/542 |
| 5,950,019 A * | 9/1999 | Azegami et al. .............. 396/72 |
| 6,118,666 A * | 9/2000 | Aoki et al. .................. 361/749 |
| 2006/0103756 A1* | 5/2006 | Shiozaki .................... 348/360 |
| 2007/0189766 A1* | 8/2007 | Kuwahara et al. ........... 396/542 |

FOREIGN PATENT DOCUMENTS

JP    6-3727    1/1994

OTHER PUBLICATIONS

U.S. Appl. No. 11/550,523, filed Oct. 18, 2006, Aoki, et al.

* cited by examiner

*Primary Examiner*—Melissa J Koval
(74) *Attorney, Agent, or Firm*—Oblon, Spivak, McClelland, Maier & Neustadt, L.L.P.

(57) ABSTRACT

A lens barrel includes a light amount adjuster capable of adjusting a light amount of a lens system and which can be moved in the optical axis direction of the lens system, an adjacent member adjacent to the light amount adjuster and which can be moved relatively in the optical axis direction and a flexible wiring board one end of which is fixed to the light amount adjuster and of which the other end is led out through the adjacent member, wherein a fixed portion of one end of the flexible wiring board is fixed to the light amount adjuster in a two-dimensional fashion and an intermediate portion of the flexible wiring board is bent like a U shape at a space portion formed between the light amount adjuster and the adjacent member, inverted approximately 180 degrees and opposed to the fixed portion.

2 Claims, 35 Drawing Sheets

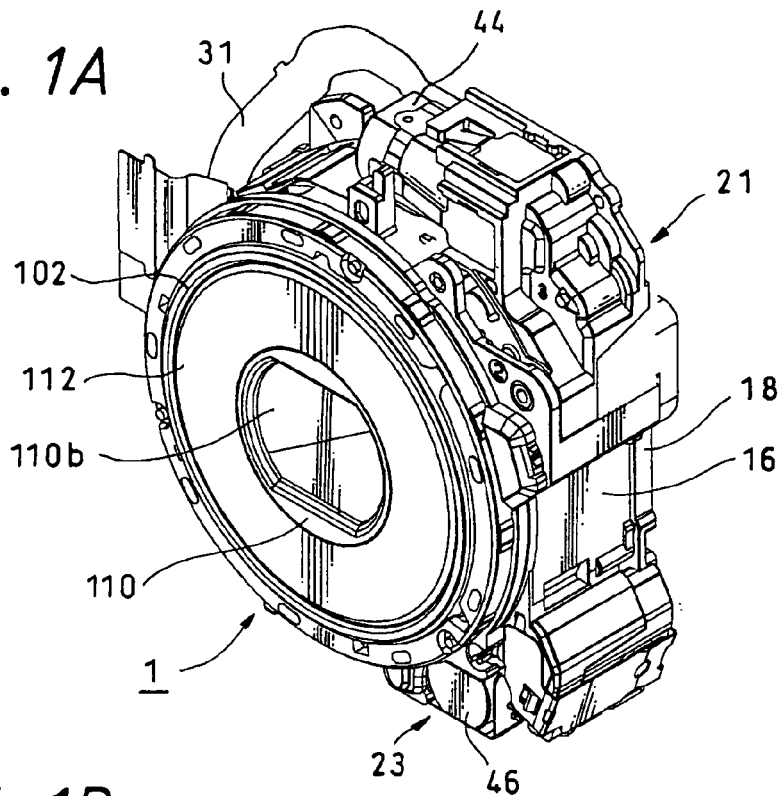
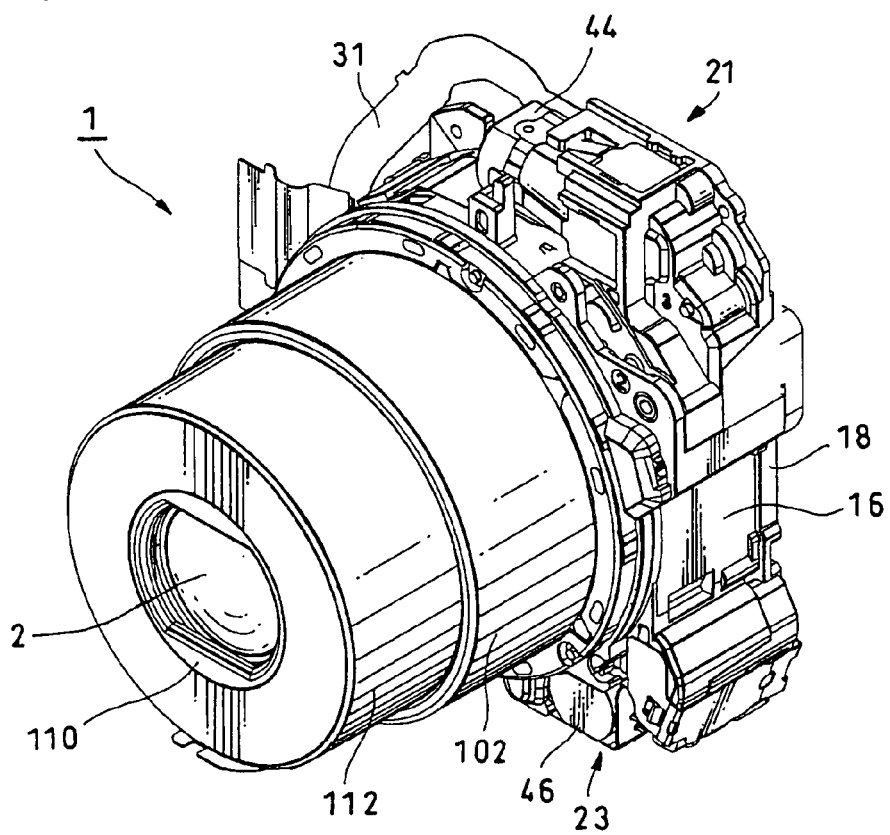

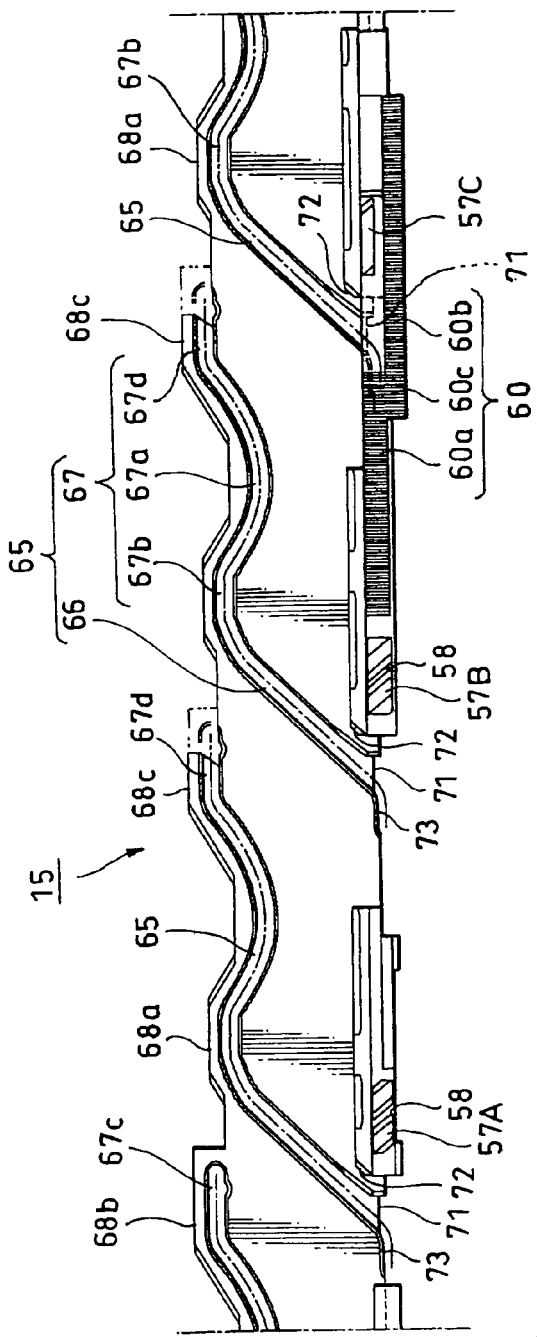
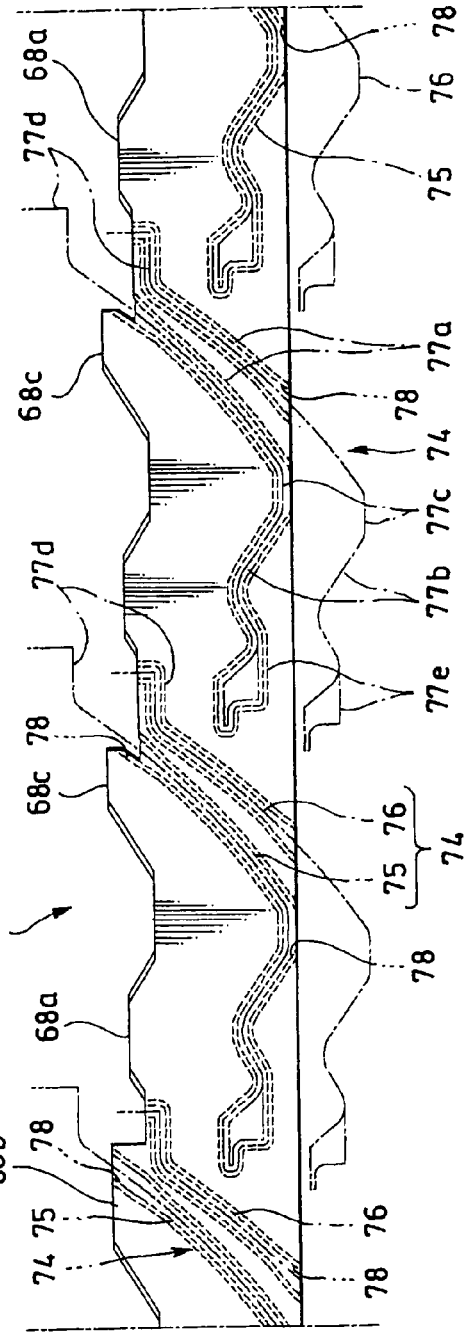
FIG. 9A
FIG. 9B

LENS BARREL

CROSS REFERENCES TO RELATED APPLICATIONS

The present invention contains subject matter related to Japanese Patent Application JP 2005-306465 filed in the Japanese Patent Office on Oct. 20, 2005, the entire contents of which being incorporated herein by reference.

BACKGROUND OF THE INVENTION

1. Field of the Invention

The present invention relates to a lens barrel incorporating a light amount adjuster located in the light path of a lens system.

2. Description of the Related Art

Cited Patent Reference 1, for example, has hitherto described this kind of lens barrel cam mechanism. That is, the Cited Patent Reference 1 described technologies relating to a light amount adjusting apparatus located in a light path of an optical system and a camera incorporating therein a light amount adjusting apparatus (hereinafter referred to a "first related-art example". A camera according to this first related-art example includes an optical system having a first lens group of which light exit surface is formed as a concave surface and a second lens group including a convex surface on which light from the first lens group becomes incident and which can be magnified with its optical iris position between the first lens group and the second lens group. There are also included a filter apparatus having predetermined transmittance located behind the second lens group and which can be moved between the position to open an exposure opening and the position to shut the exposure opening and a control unit for controlling based on the magnified states of the optical system and shutter speeds whether the filter apparatus is to be moved to the position to shut the exposure opening. This camera according to the first related-art example is characterized in that, if the shutter speed becomes higher than a predetermined value in the state in which the filter apparatus is located at the position to open the exposure opening, then the filter apparatus is moved to the position to shut the exposure opening so that the camera becomes able to take a picture at a lower shutter speed.

According to the camera having the above-mentioned arrangement described in the Cited Patent Reference 1, there can be achieved effects in which the arrangement of a shutter diaphragm can be optimized, the occurrence of a shutter light amount difference of the shutter diaphragm can be decreased, more suitable exposure can be executed and the size of the camera can be miniaturized (paragraph [0094] in the Japanese patent specification of the Cited Patent Reference 1).
[Cited Patent Reference 1]: Japanese unexamined patent publication No. 2004-252367

However, in the lens barrel having the arrangement described in the Cited Patent Reference 1, since a space between an automatic exposure apparatus and a two group ring is narrowed in the non-shooting mode, slackening is generated in a flexible wiring board and hence such slackening may be absorbed by a space provided in the outside of the two group ring. For this reason, the two group ring needs a large space in its outside and this hinders the lens barrel from being miniaturized. Also, since the flexible wiring board has slackening, the slackened portion is brought in slidable contact with other member so that breaking of wire occurs in the sliding portion or that the sliding portion is damaged unavoidably. Further, when the flexible wiring board is accommodated into the lens barrel, slackening of the flexible wiring board is changed. There is then a disadvantage that stress will be applied to a soldered portion connected to the automatic exposure apparatus.

SUMMARY OF THE INVENTION

Problems to be solved by the present invention are as follows. That is, in the lens barrel according to the related art, since a large space is required in order to absorb slackening generated in the flexible wiring board, it was difficult to miniaturize the lens barrel. Also, the slackening portion of the flexible wiring board is brought in contact with other portion and it is unavoidable that the sliding portion is damaged or breaking of wire occurs in the sliding portion.

According to an aspect of the present invention, there is provided a lens barrel which includes a light amount adjuster capable of adjusting a light amount of a lens system and which can be moved in the optical axis direction of the lens system, an adjacent member adjacent to the light amount adjuster and which can be moved relatively in the optical axis direction and a flexible wiring board one end of which is fixed to the light amount adjuster and of which the other end is led out through the adjacent member. In this lens barrel, a fixed portion of one end of the flexible wiring board is fixed to the light amount adjuster in a two-dimensional fashion and an intermediate portion of the flexible wiring board is bent like a U shape at a space portion formed between the light amount adjuster and the adjacent member, inverted approximately 180 degrees and opposed to the fixed portion.

According to the lens barrel of the present invention, since the intermediate portion of the flexible wiring board is bent like U-shape at the space portion between the light amount adjuster and the adjacent member, inverted approximately 180 degrees and opposed to the fixed portion, a slackened portion of the flexible wiring board can be accommodated into a small space. In addition, since the slackened portion of the flexible wiring board can be prevented from contacting with other member, the slackened portion of the flexible wiring board can be prevented from contacting with other member so that the sliding portion can be prevented from being damaged and that breaking of wire may not occur in the sliding portion.

BRIEF DESCRIPTION OF THE DRAWINGS

FIGS. 1A and 1B are respectively perspective views showing a cam mechanism of a lens barrel according to a first embodiment of the present invention, wherein FIG. 1A shows a barrel retracted state of the lens barrel and FIG. 1B shows a barrel extended state of the lens barrel;

FIGS. 7A, 7B and 7C show the cam ring according to the lens barrel shown in FIG. 1, wherein FIG. 7A is a perspective view thereof, FIG. 7B is a front view thereof and FIG. 7C is a cross-sectional view taken along the line X-X in FIG. 8A, respectively;

FIGS. 8A and 8B show the cam ring shown in FIG. 7, wherein FIG. 8A is a plan view thereof and FIG. 8B is a bottom view thereof, respectively;

FIGS. 9A and 9B are respectively developed views of the cam ring shown in FIG. 7, wherein FIG. 9A is a developed view showing the cam groove on the outer peripheral surface and FIG. 9B is a developed view showing the cam groove on the inner peripheral surface by broken lines;

FIGS. 16A and 16B show a state in which the one group ring and the cam ring of the lens barrel shown in FIG. 1 are combined, wherein FIG. 16A is a perspective view showing the assembled state of the one group ring and the cam ring from the bottom side and FIG. 16B is an explanatory diagram showing a main portion of FIG. 16A in an enlarged-scaled, respectively;

FIGS. 17A and 17B are respectively diagrams to which reference will be made in explaining a relationship between an assembly body of the one group ring and the cam ring shown in FIGS. 16A and 16B and a drive gear, wherein FIG. 17A is a front view thereof and FIG. 17B is a bottom view thereof;

FIGS. 18A and 18B are respectively diagrams to which reference will be made in explaining a relationship between the assembly body of the first group cam and the cam ring shown in FIGS. 16A and 16B and the drive gear, wherein FIG. 18A is a right-hand side elevational view thereof and FIG. 18B is a cross-sectional view taken along the line Y-Y in FIG. 17B;

FIGS. 19A and 19B are respectively diagrams to which reference will be made in explaining a relationship between the assembly body of the one group ring and the cam ring shown in FIGS. 17A and 17B and the drive gear, wherein FIG. 19A is a perspective view showing a state in which a cam follower of the one group ring is completely moved to the outside from a cam groove opening portion of the cam ring and FIG. 19B is a semi cross-sectional view thereof;

FIGS. 20A and 20B are respectively diagrams to which reference will be made in explaining a relationship between the assembly body of the one group ring and the cam ring shown in FIGS. 19A and 19B and the drive gear, wherein FIG. 20A is a developed view of a main portion of the one group ring and the cam ring and FIG. 20B is a developed view of the cam groove opening portion, showing the gear portion of FIG. 20A in a partially cross-sectional fashion;

FIGS. 21A, 21B and 21C are respectively diagrams to which reference will be made in explaining a relationship between the assembly body of the one group ring and the cam ring shown in FIGS. 17A and 17B and the drive gear, wherein FIG. 21A is a perspective view showing a state in which the cam follower of the one group ring is moved to the cam groove opening portion of the cam ring, FIG. 21B is a semi cross-sectional view thereof and FIG. 21C is a developed view of the one group ring and the cam ring and the cam groove opening portion, showing a part of the gear portion in a cross-sectional fashion;

FIGS. 22A, 22B and 22c are respectively diagrams to which reference will be made in explaining a relationship between the assembly body of the one group ring and the cam ring shown in FIGS. 17A and 17B and the drive gear, wherein FIG. 22A is a perspective view showing a state in which the cam follower of the one group ring is moved into the cam groove from the cam groove opening portion of the cam ring, FIG. 22B is a semi cross-sectional view thereof and FIG. 22C is a developed view of the cam groove opening portion, showing a part of the gear portion in a cross-sectional fashion;

FIGS. 23A and 23B are respectively diagrams to which reference will be made in explaining a relationship between the assembly body of the one group ring and the cam ring shown in FIGS. 17A and 17B and the drive gear, wherein FIG. 23A is a perspective view showing the state in which the cam follower of the one group ring is moved into the cam groove from the cam groove opening portion of the cam ring and FIG. 23B is a semi cross-sectional view thereof;

FIGS. 26A and 26B are respectively diagrams to which reference will be made in explaining a relationship between the assembly body of the one group ring shown in FIGS. 17A and 17B and the drive gear, wherein FIG. 26A is a semi cross-sectional view thereof and FIG. 26B is a developed view showing the one group ring and the cam ring shown in FIG. 25 in a developed fashion and which also shows a part of the gear portion in a cross-sectional fashion to expose the cam groove opening portion;

FIGS. 27A and 27B are respectively diagrams to which reference will be made in explaining a relationship between the assembly body of the one group ring and the cam groove shown in FIGS. 17A and 17B and the drive gear, wherein FIG. 27A is a perspective view showing the state in which the cam follower of the one group ring is moved into the optical zooming area of the cam groove of the cam ring and FIG. 27B is a developed view showing the one group ring and the cam ring shown in FIG. 27A in a developed fashion and which also shows a part of the gear portion to expose the cam groove opening portion;

FIGS. 28A and 28B are respectively diagrams to which reference will be made in explaining a relationship between the assembly body of the one group ring and the cam groove shown in FIGS. 17A and 17B and the drive gear, wherein FIG. 28A is a perspective view showing the state in which the cam follower of the one group ring is passed through the optical zooming area of the cam groove of the cam ring and FIG. 28B is a developed view showing the one group ring and the cam ring shown in FIG. 28A in a developed fashion and which also shows a part of the gear portion to expose the cam groove opening portion;

FIGS. 31A and 31B are respectively diagrams to which reference will be made in explaining slackened states of the flexible wiring board according to the lens barrel of the present invention and the automatic exposure apparatus, wherein FIG. 31A shows the state presented before the slackened portion contacts with the convex portion of the two group ring and FIG. 31B shows the state presented after the slackened portion contacted with the convex portion of the two group ring;

DESCRIPTION OF THE PREFERRED EMBODIMENTS

According to the present invention, since an intermediate portion of a flexible wiring board is bent like U-shape at a space portion and it is then inverted at an angle of approximately 180 degrees, a lens barrel in which a slackened portion of the flexible wiring board can be prevented from being damaged and breaking of wire can be prevented from occurring in the slackened portion and which can contribute to miniaturization and decrease of weight of the whole of the apparatus can be realized by a simple arrangement.

Figure 2:
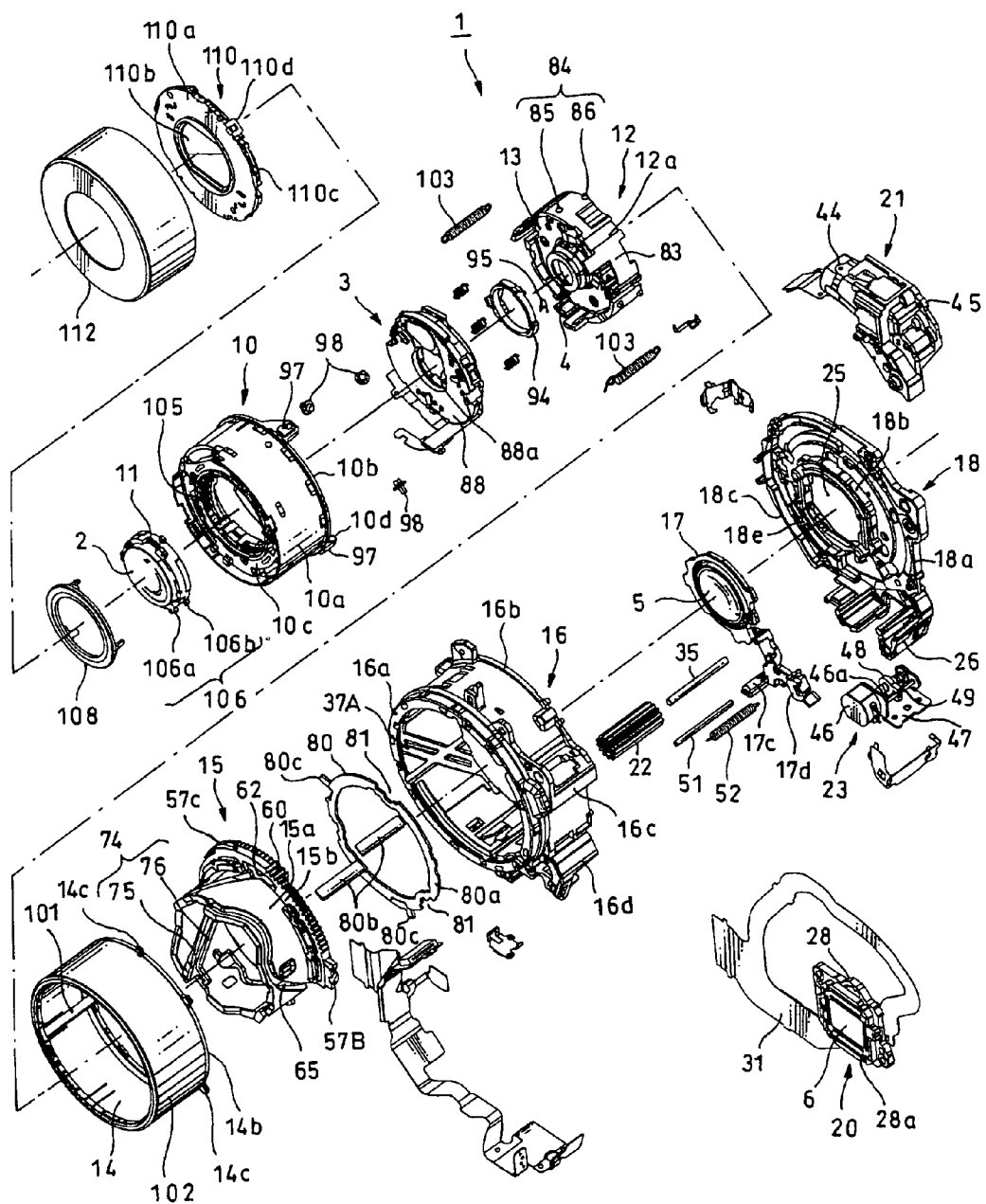
FIG. 2 is an exploded perspective view of the lens barrel shown in FIG. 1.
Figure 3:
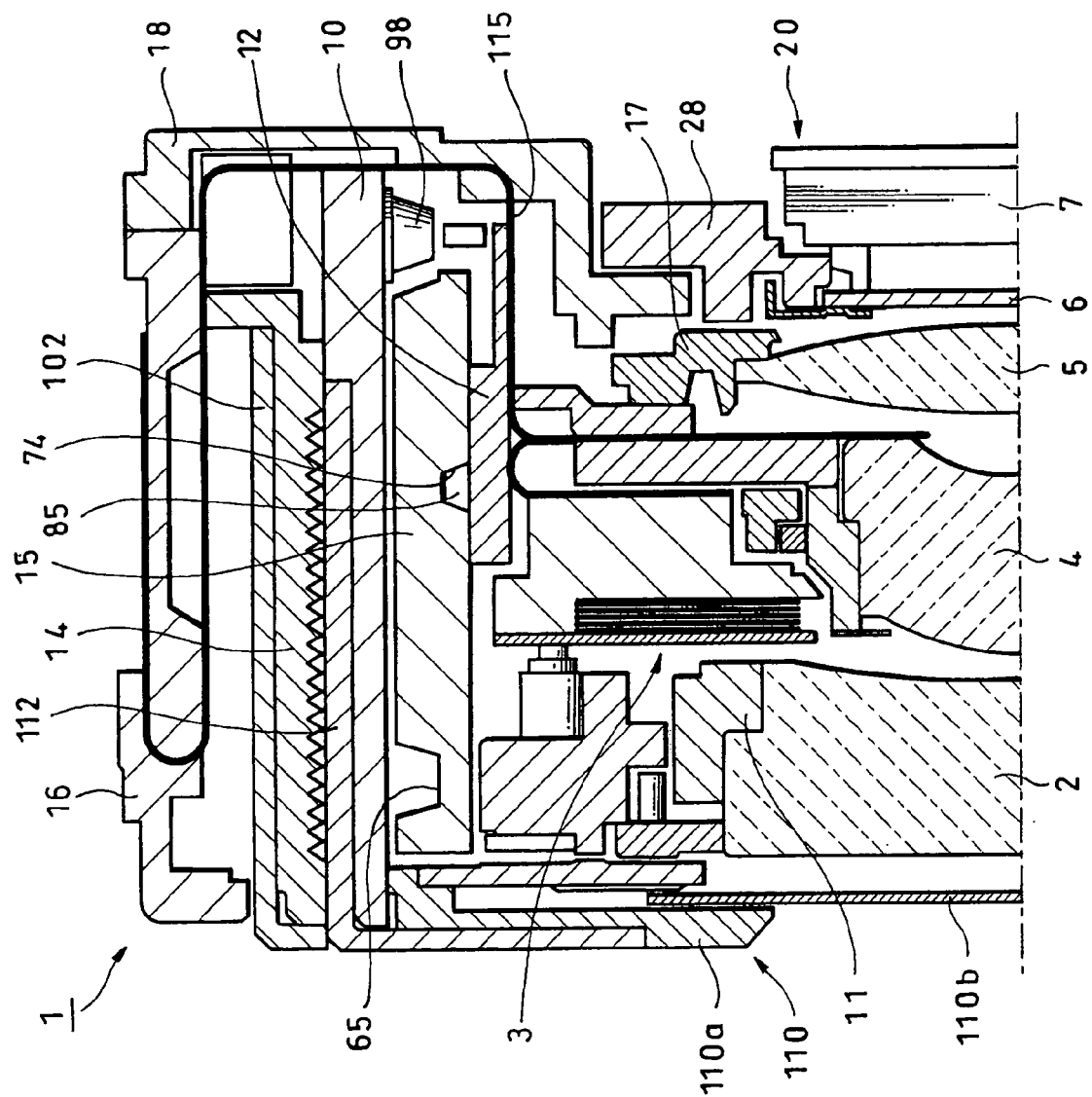
FIG. 3 is a cross-sectional view showing the barrel retracted state of the lens barrel shown in FIG. 1.
Figure 4:
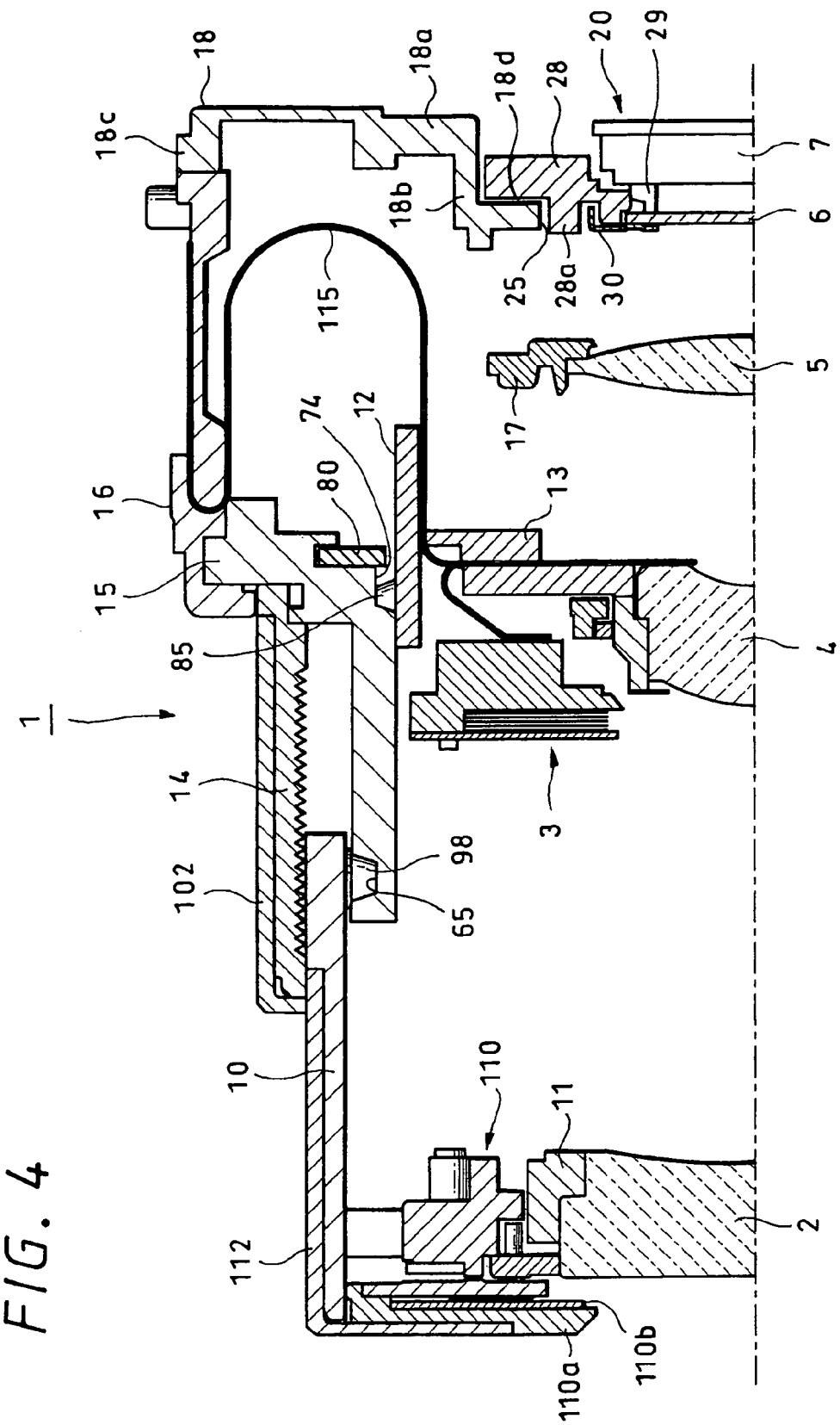
FIG. 4 is a cross-sectional view showing the barrel extended state of the lens barrel shown in FIG. 1.
Figure 5:
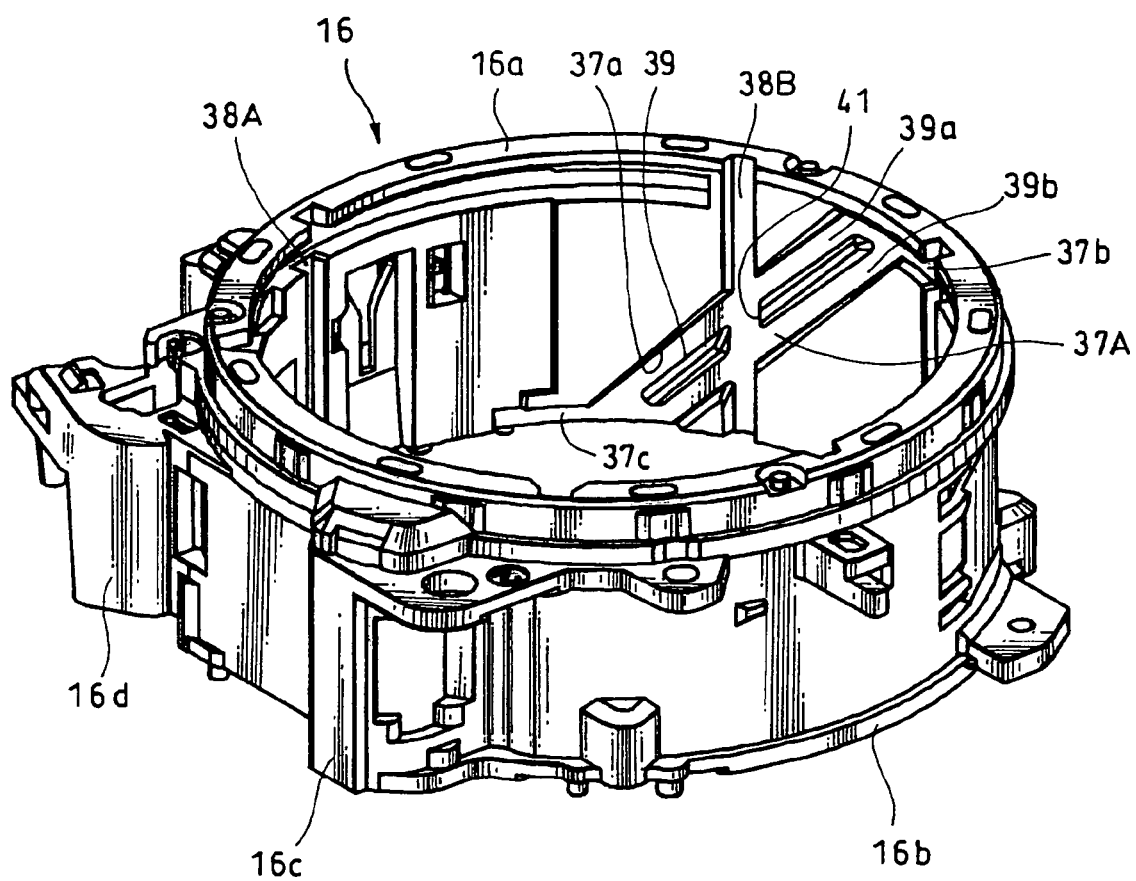
FIG. 5 is a perspective view showing a fixed ring according to the lens barrel shown in FIG. 1.
Figure 6:
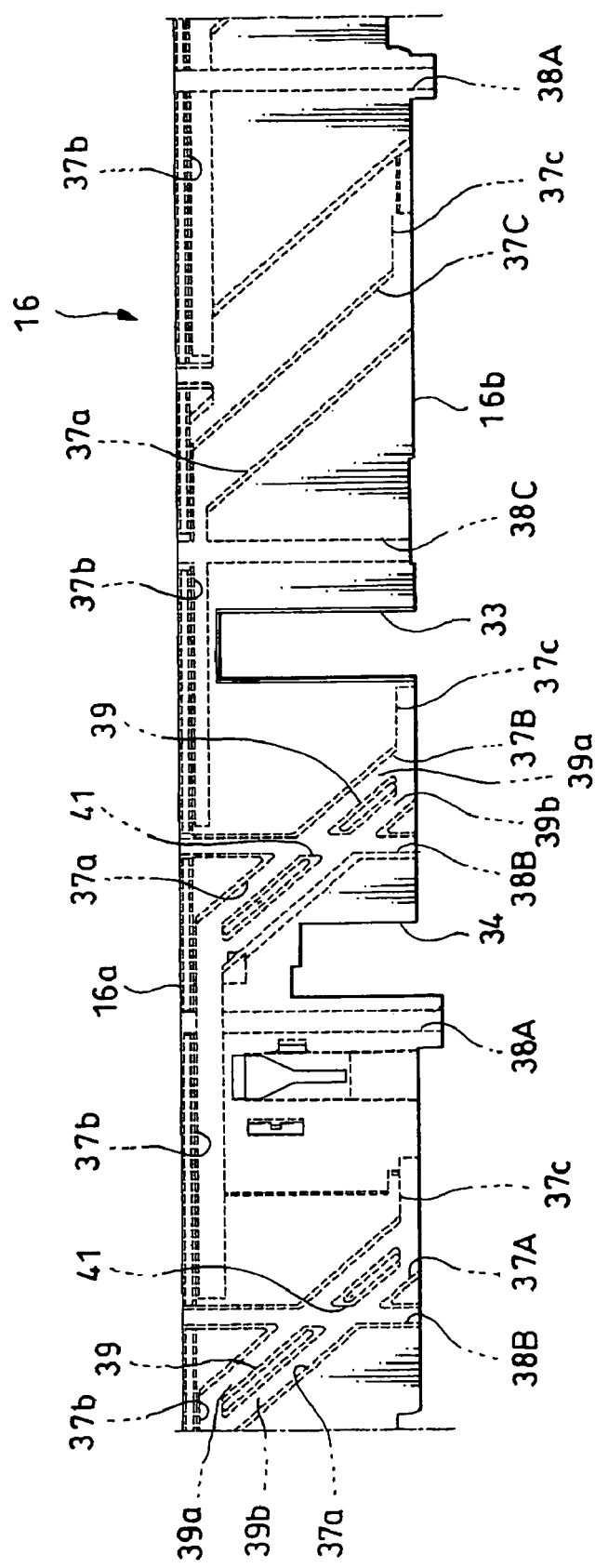
FIG. 6 is a developed view showing the fixed ring shown in FIG. 5 in a developed fashion wherein a cam groove on the inner peripheral surface and the like are shown by broken lines.
Figure 7A:
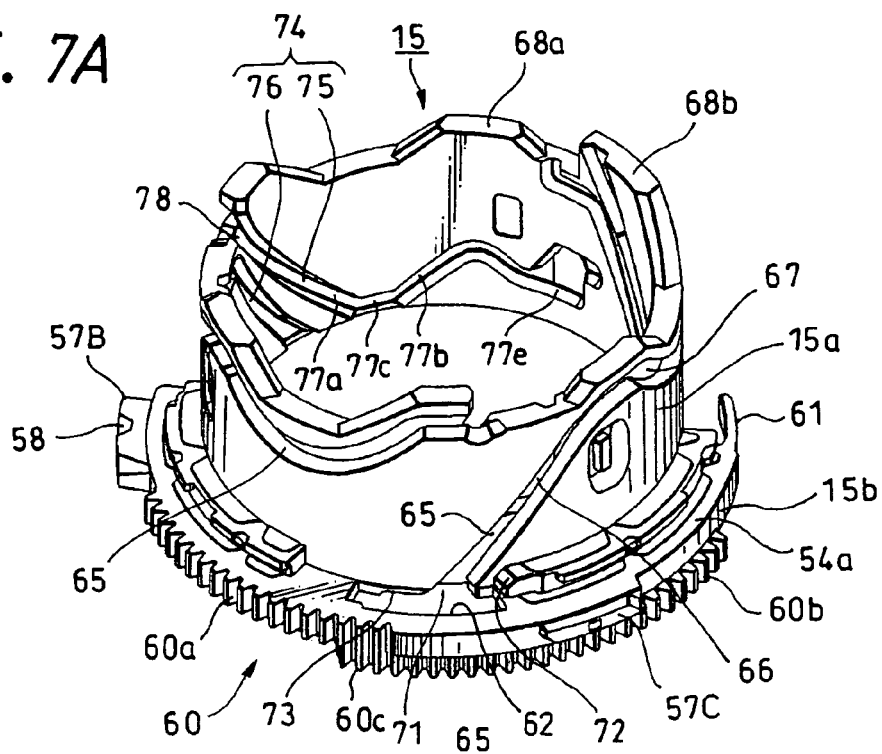
Figure 7B:
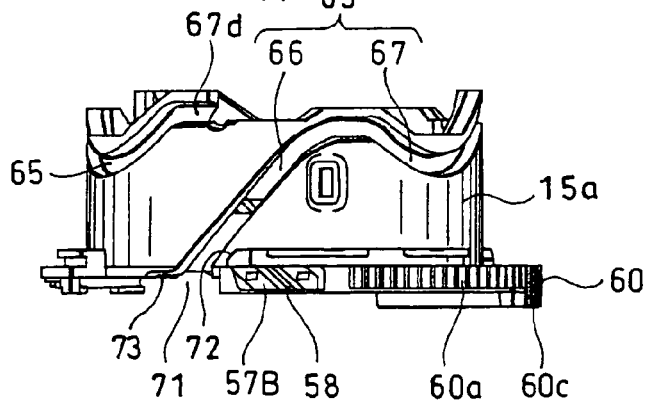
Figure 7C:
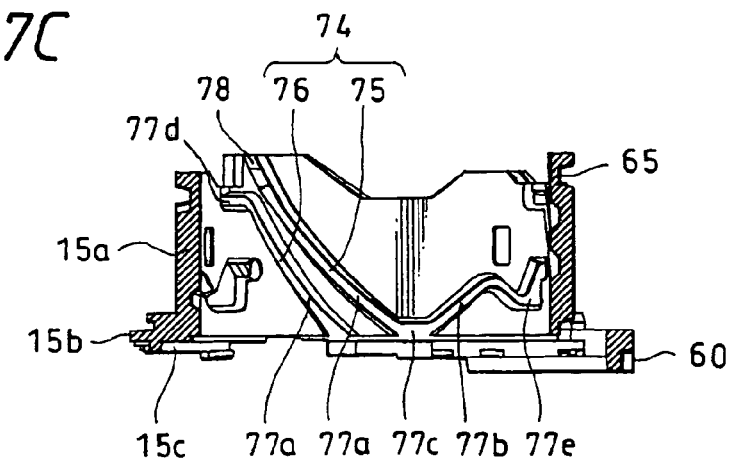
Figure 8A:
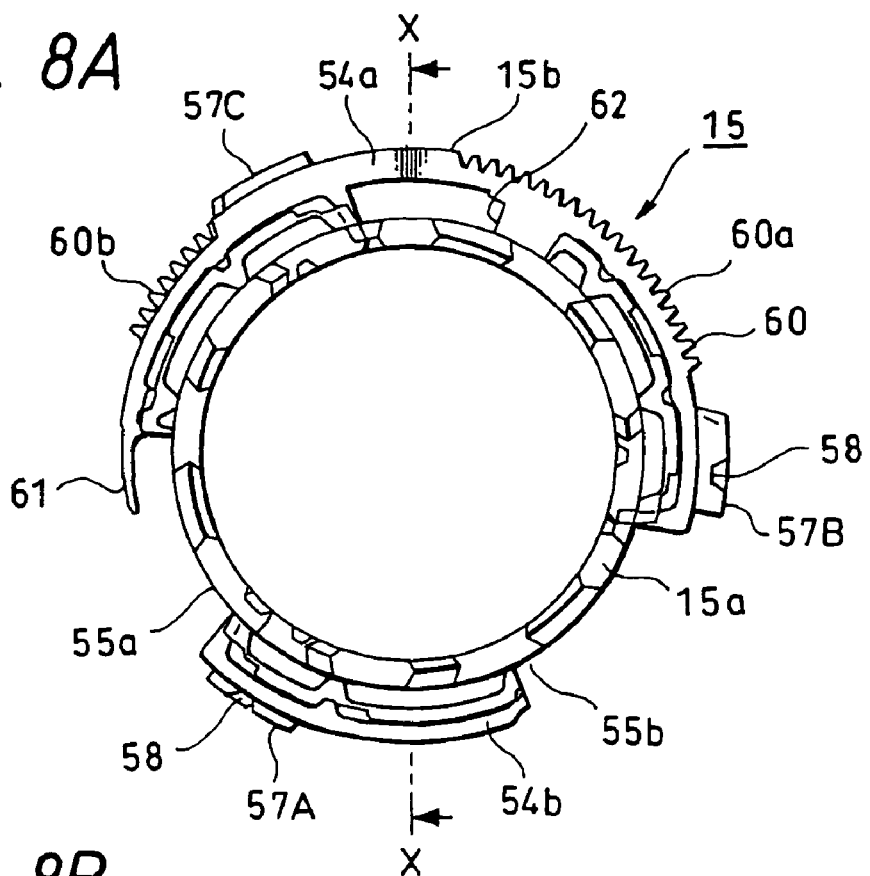
Figure 8B:
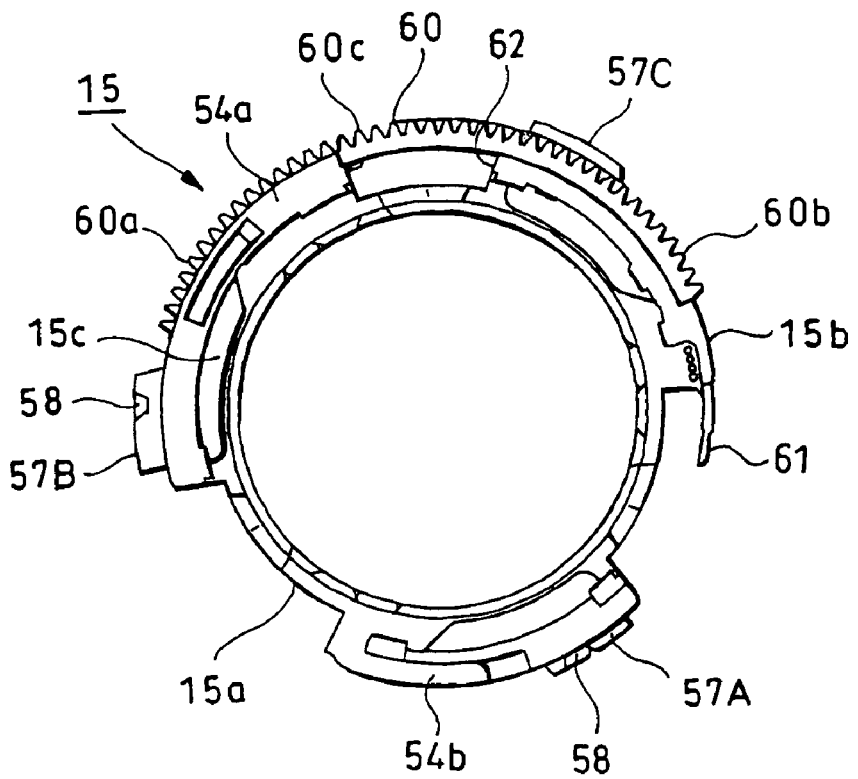
Figure 10:
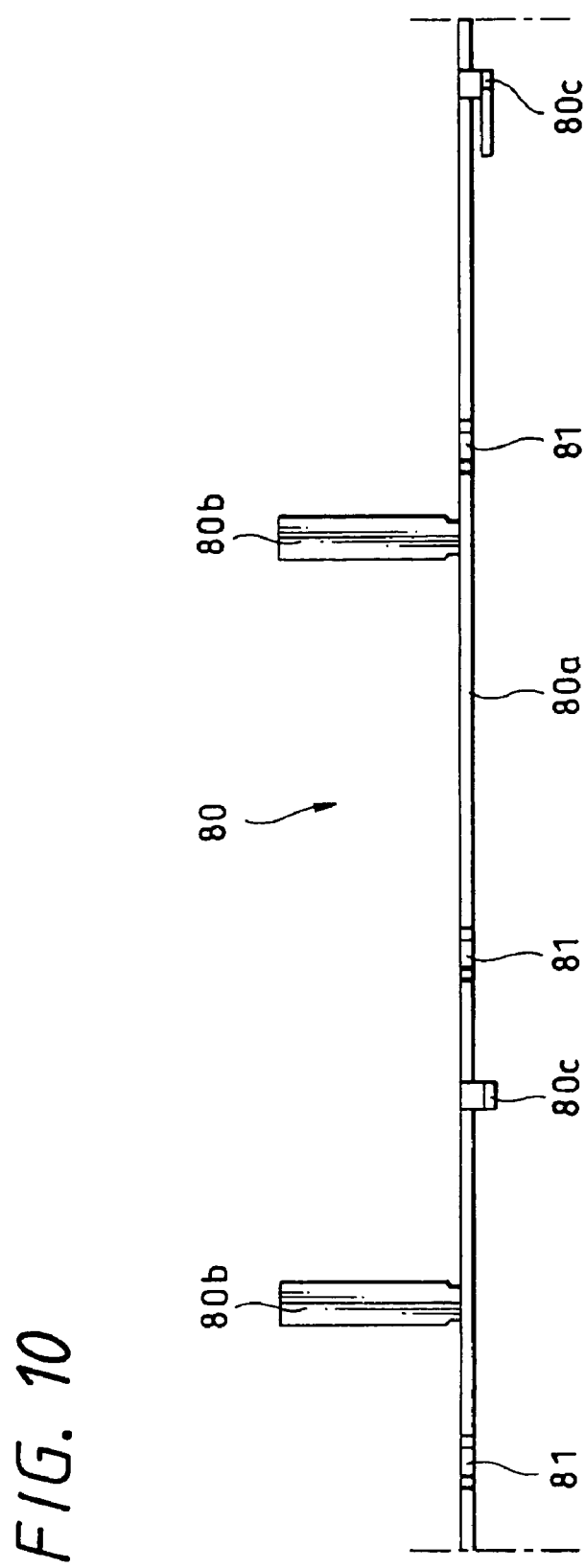
FIG. 10 is a developed view showing a rotation restricted member of the lens barrel shown in FIG. 2 in a developed fashion.
Figure 11:
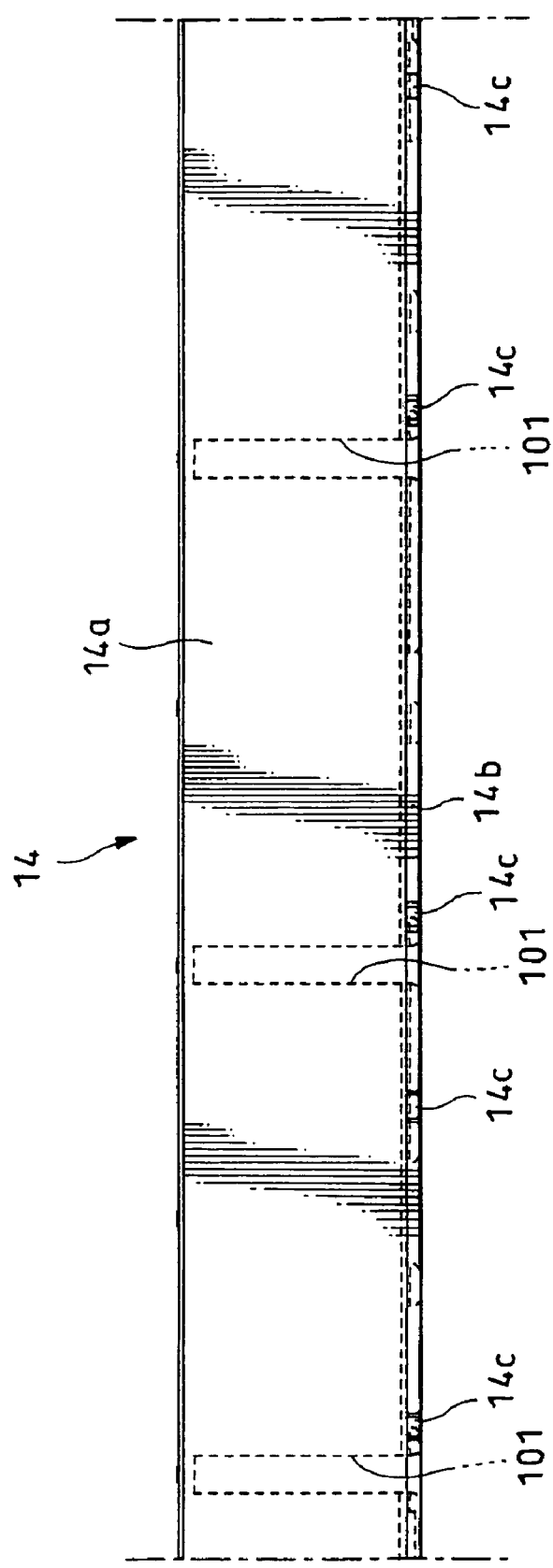
FIG. 11 is a developed view of a linearly movable ring of the lens barrel shown in FIG. 2, showing the guide groove on the inner peripheral surface by a broke line.

Embodiments of the present invention will be described below with reference to the accompanying drawings. FIGS. 1A, 1B to FIG. 35 are diagrams useful for explaining the embodiments of the present invention. More specifically, FIGS. 1A and 1B are respectively perspective views showing a first embodiment of a lens barrel cam mechanism according to the present invention, wherein FIG. 1A shows a lens barrel retracted state and FIG. 1B shows a lens barrel extending state. FIG. 2 is an exploded perspective view of the lens barrel shown in FIGS. 1A and 1B. FIG. 3 is a cross-sectional view showing the lens barrel retracted state. FIG. 4 is a cross-sectional view showing the lens barrel extending state. FIG. 5 is a perspective view of a fixed ring. FIG. 6 is a developed view of the fixed ring. FIGS. 7A, 7B and 7C are a perspective view of a cam ring, a front view of the cam ring and a cross-sectional view taken along the line X-X in FIG. 8A, respectively. FIGS. 8A and 8B are respectively a plan view of the cam ring and a bottom view of the cam ring. FIGS. 9A and 9B are respectively developed views of an outer peripheral surface of the cam ring and an inner peripheral surface of the cam ring. FIG. 10 is a developed view of a rotation restricting member and FIG. 11 is a developed view of a linearly movable ring.

Figure 12:
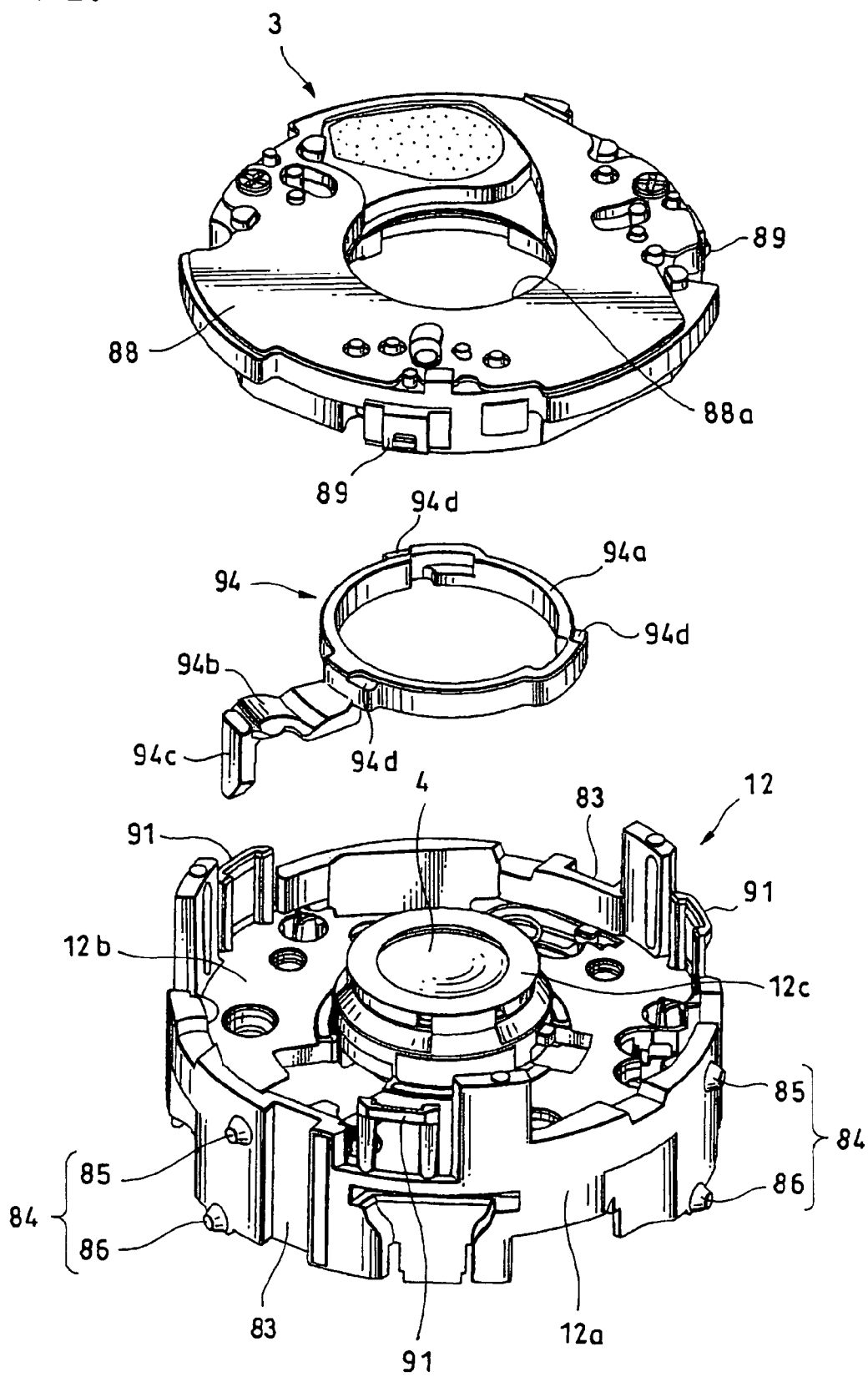
FIG. 12 is an exploded perspective view showing an automatic exposure apparatus, a space restricting member and a two group ring of the lens barrel shown in FIG. 2.
Figure 13:
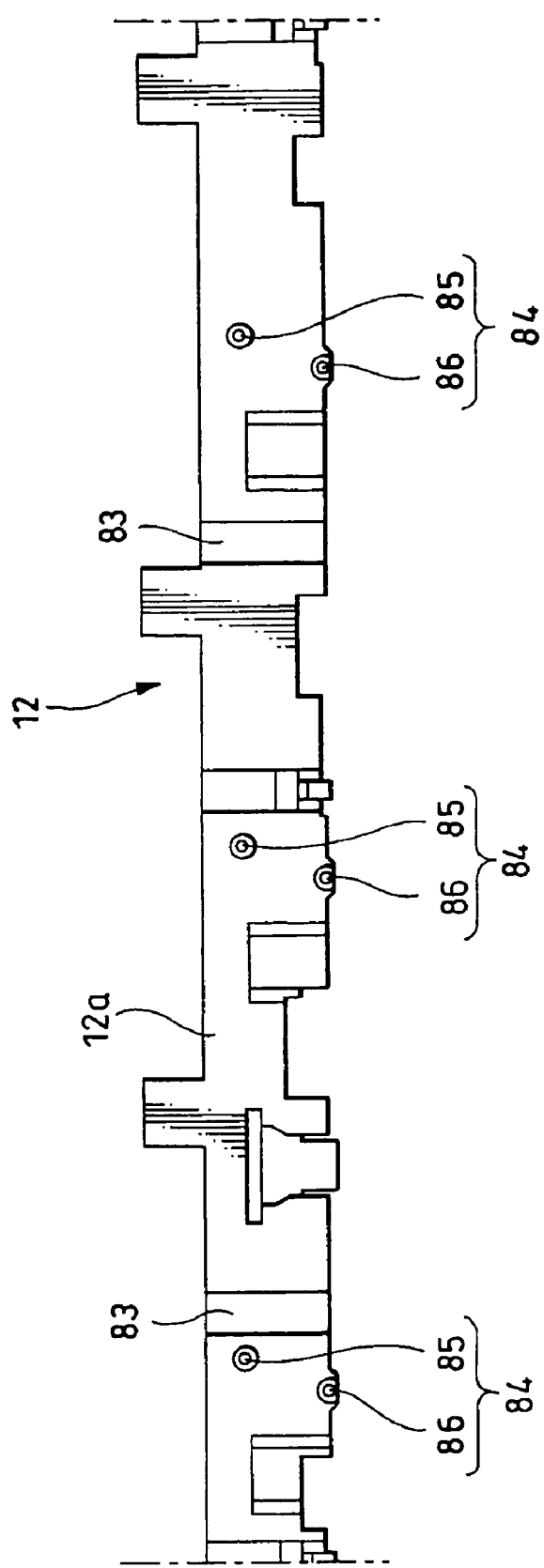
FIG. 13 is a developed view of the two group ring of the lens barrel shown in FIG. 2.
Figure 14:
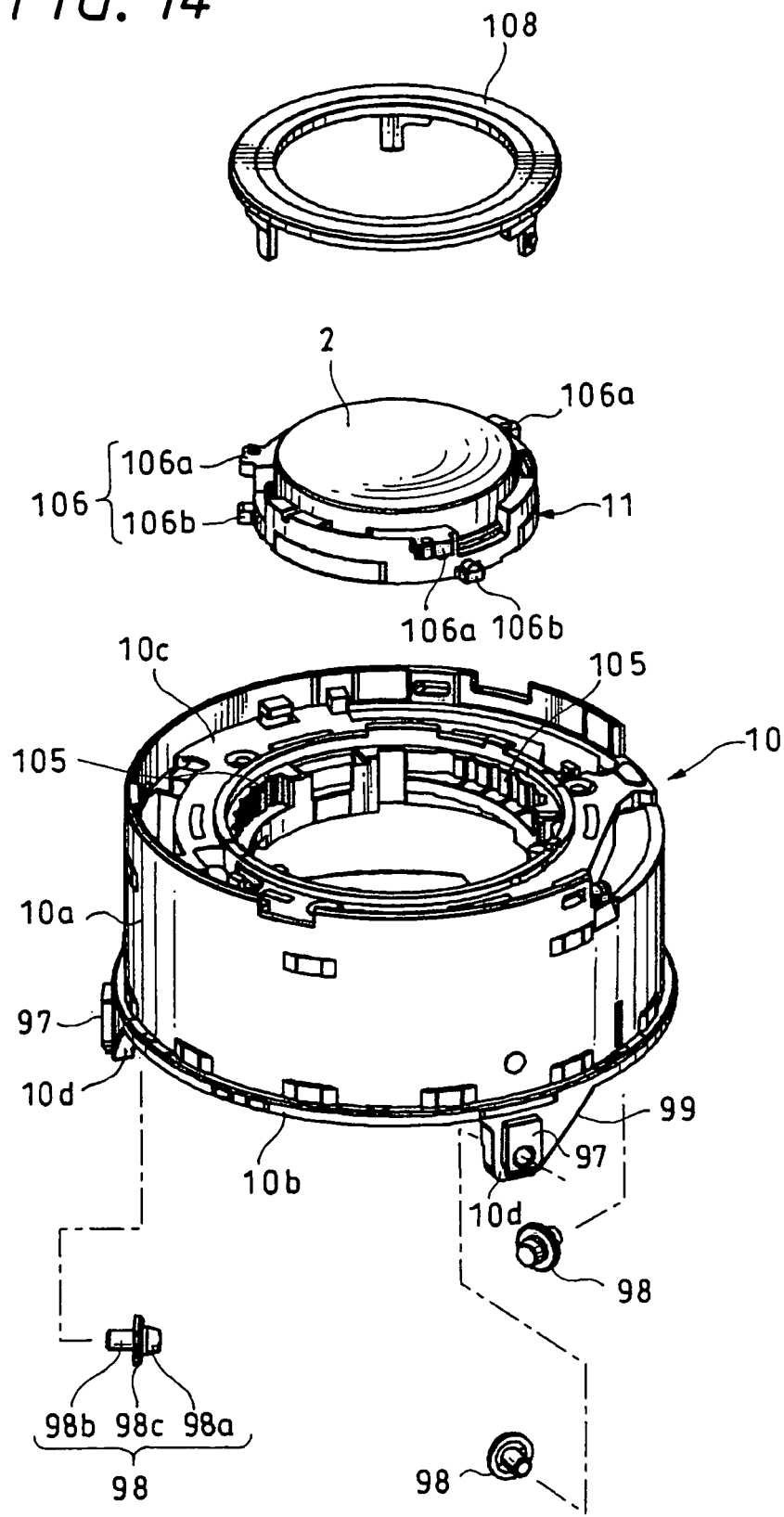
FIG. 14 is an exploded perspective view showing the one group ring, the first group lens frame and the like of the lens barrel shown in FIG. 2.
Figure 15:
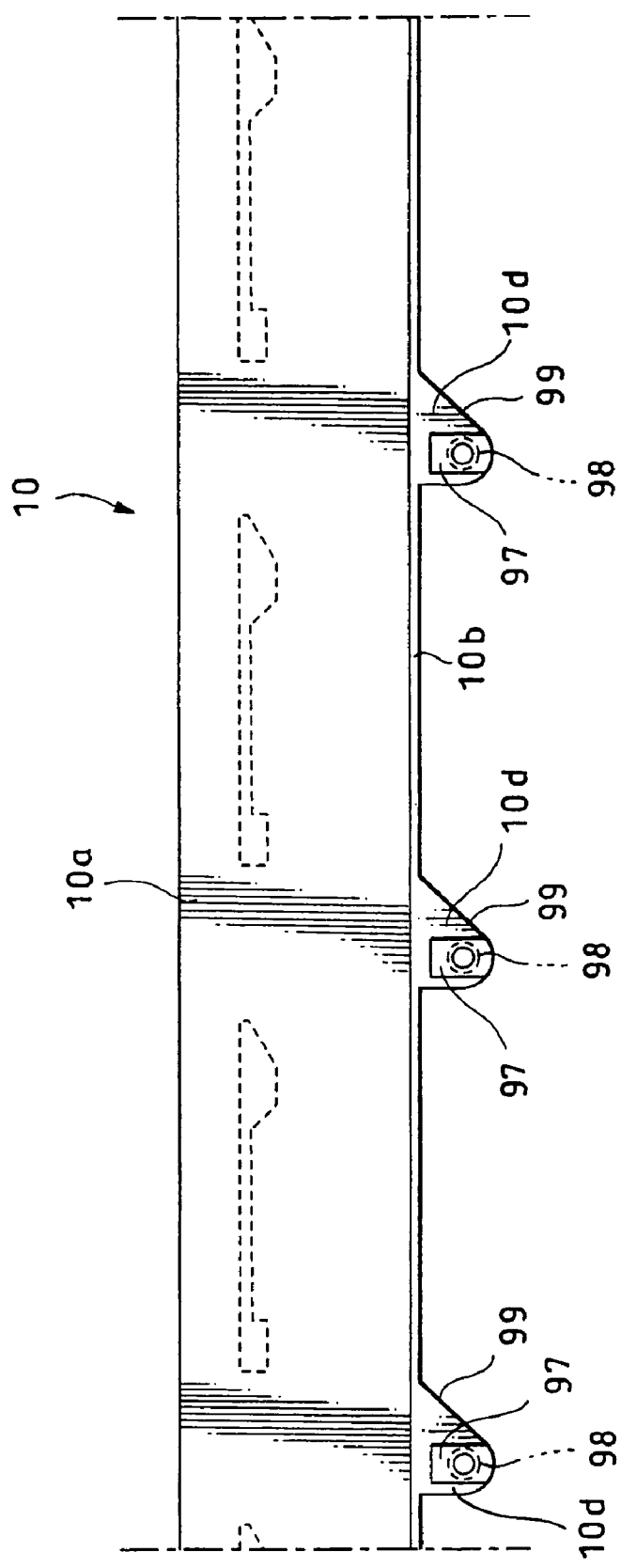
FIG. 15 is a developed view of the first group lens frame shown in FIG. 14, showing an engagement portion of the inner surface by a broken line.
Figure 16A:
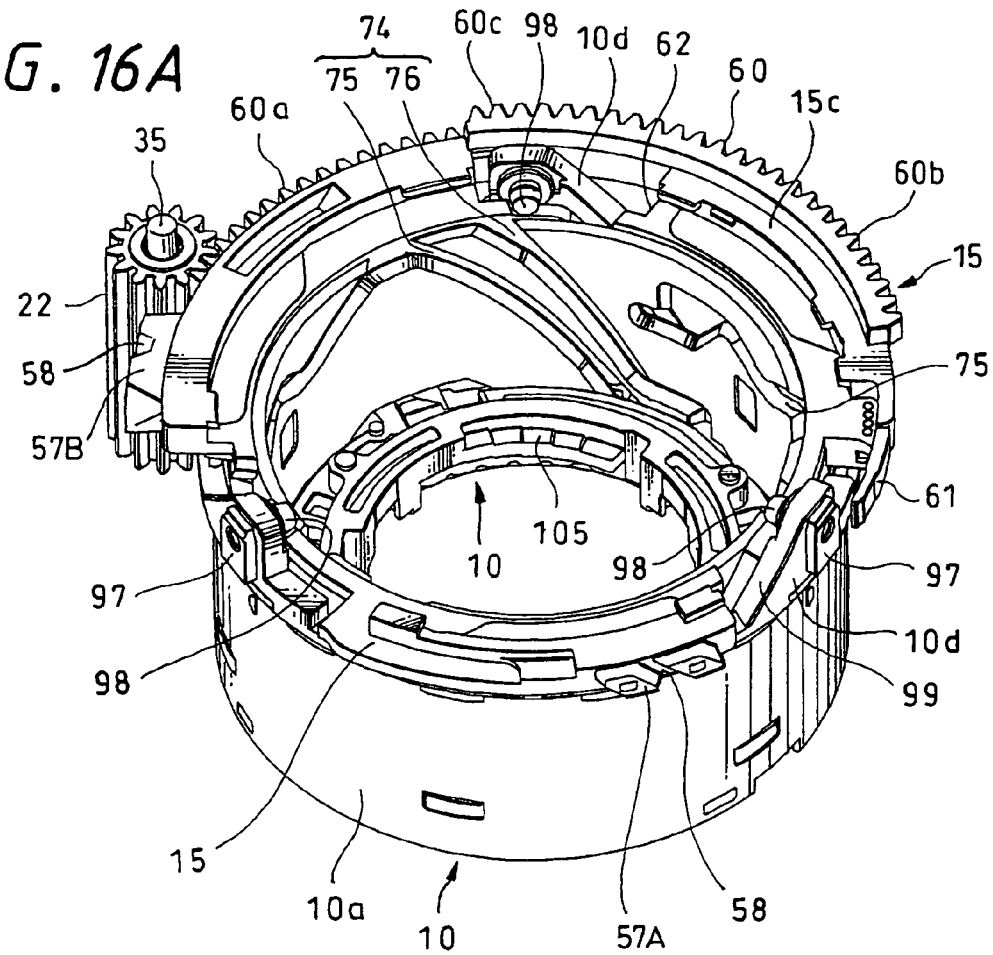
Figure 16B:
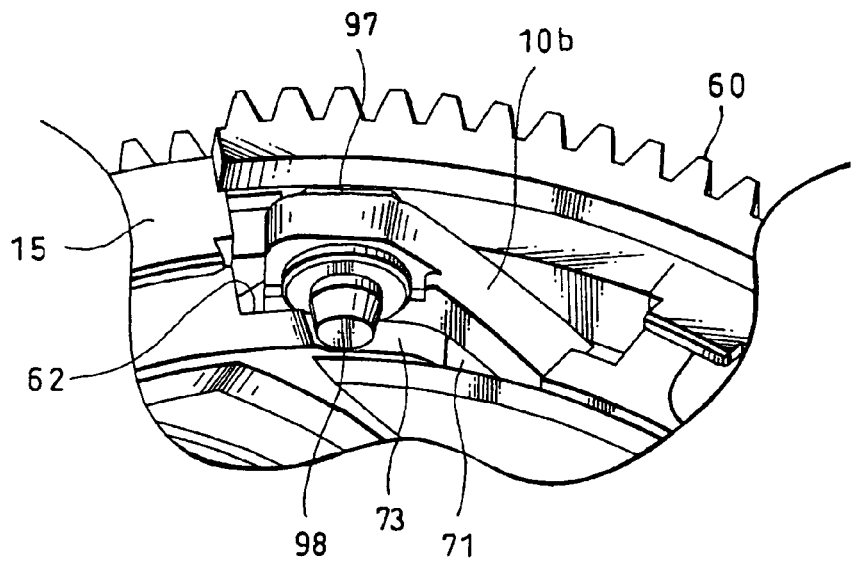
Figure 17A:
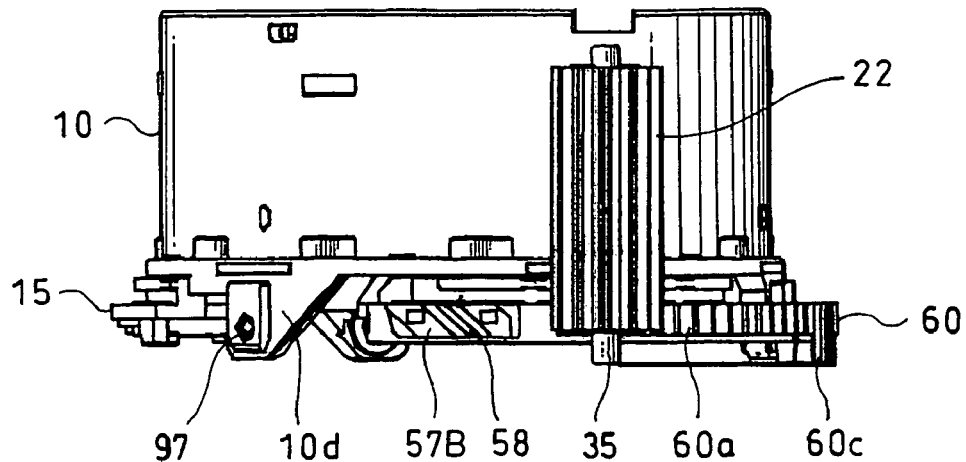
Figure 17B:
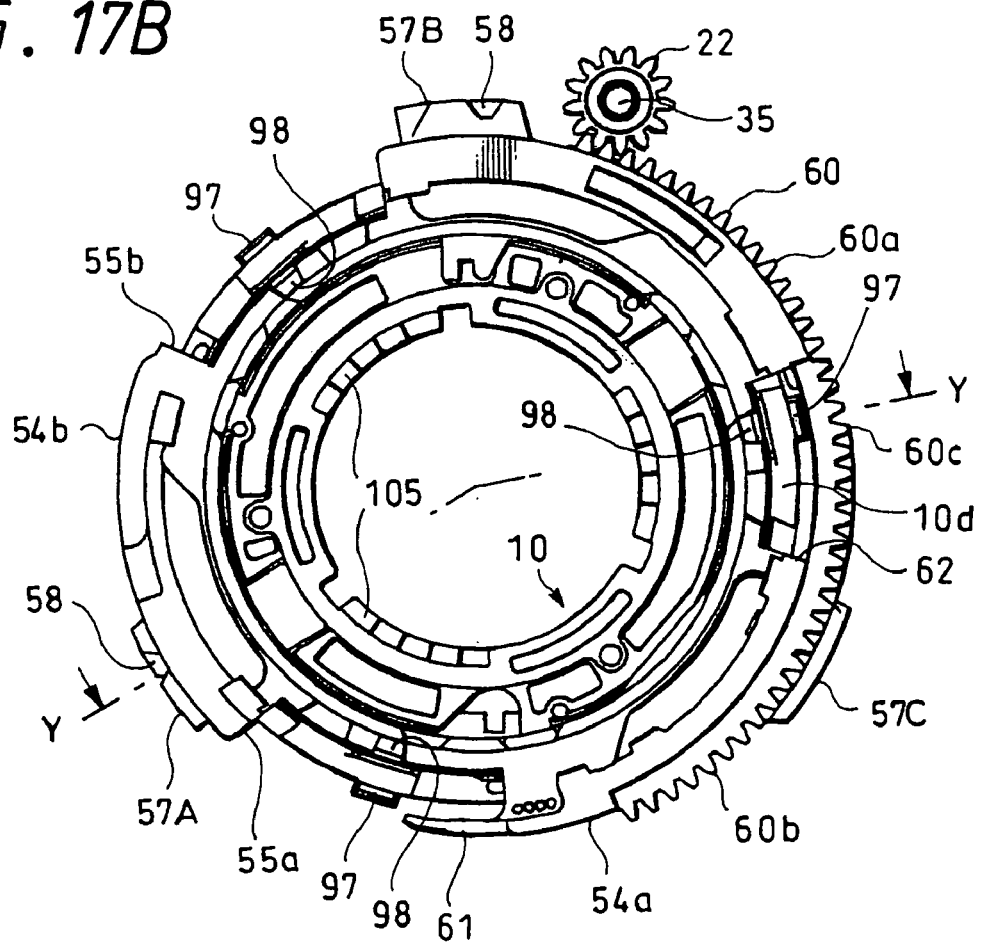
Figure 18A:
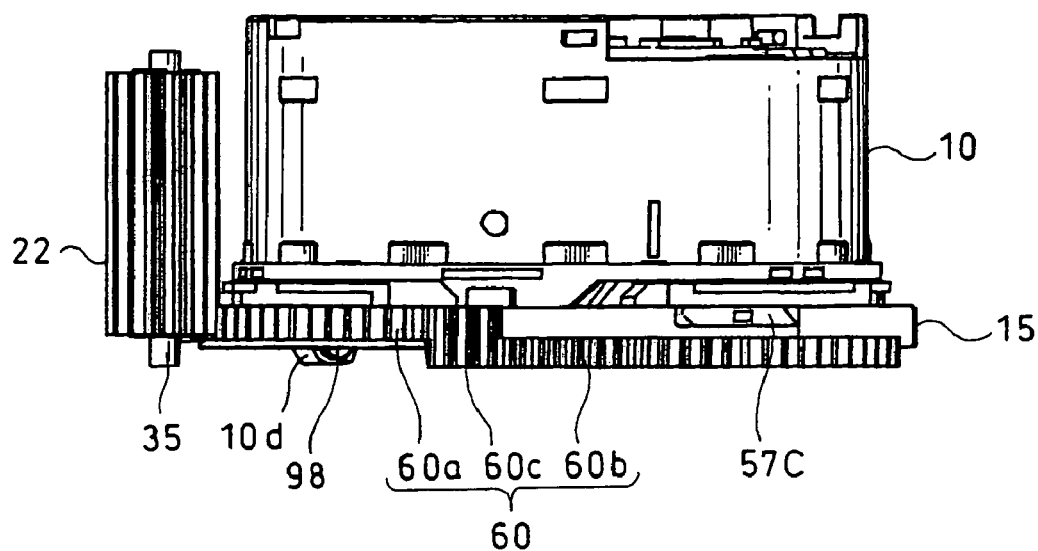
Figure 18B:
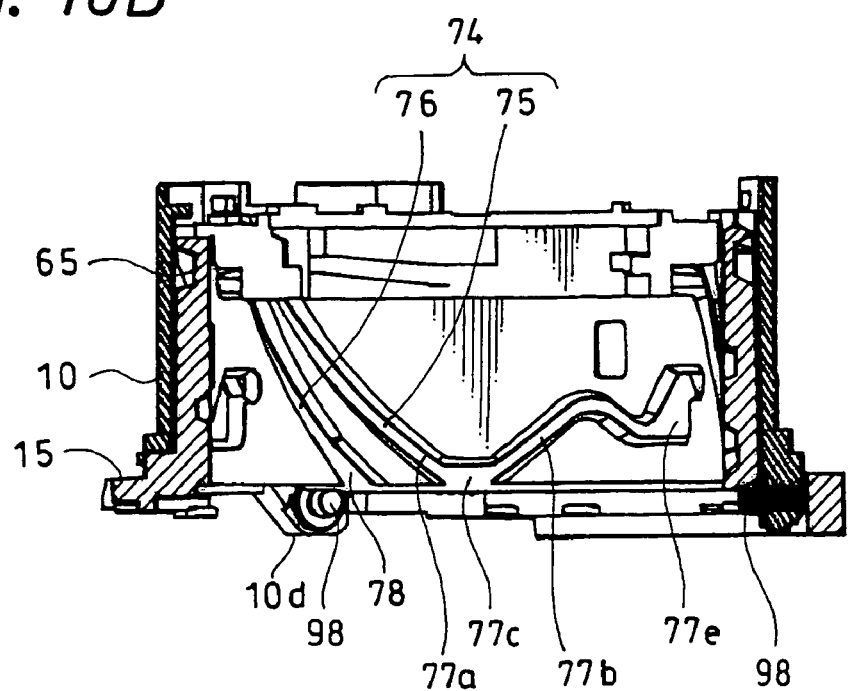
Figure 19A:
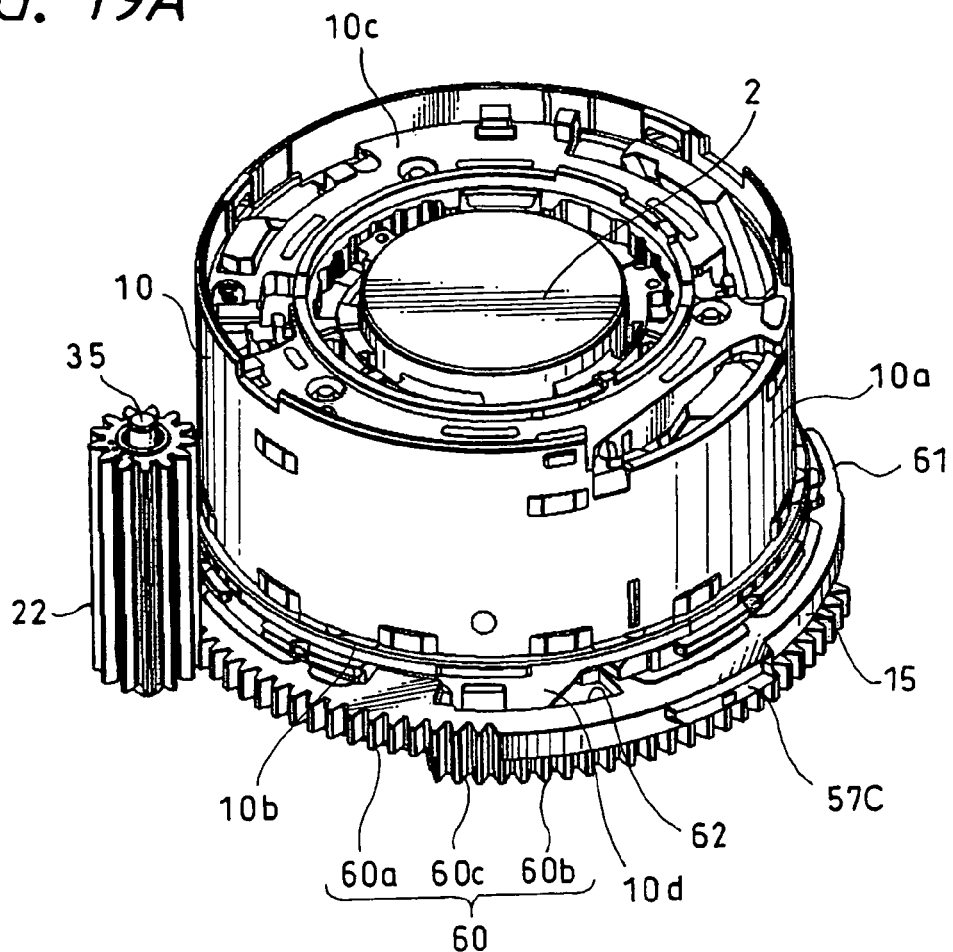
Figure 19B:
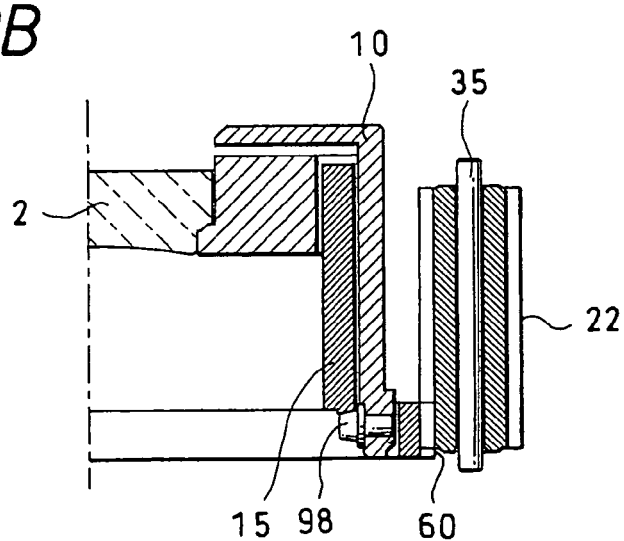
Figure 20A:
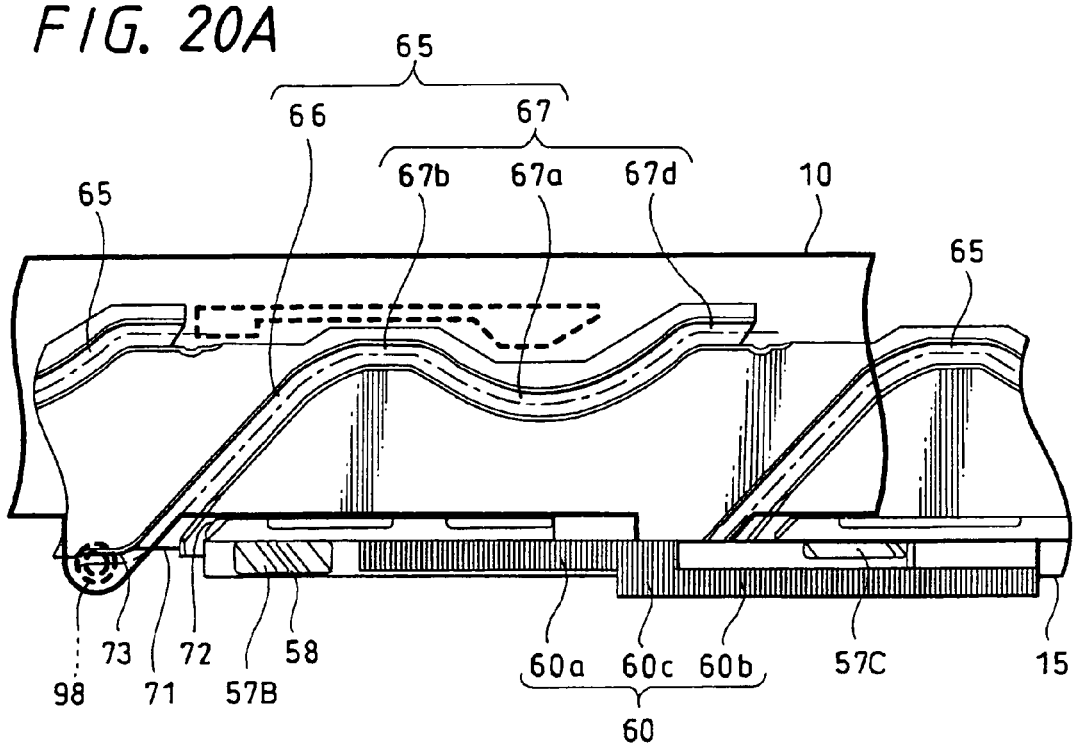
Figure 20B:
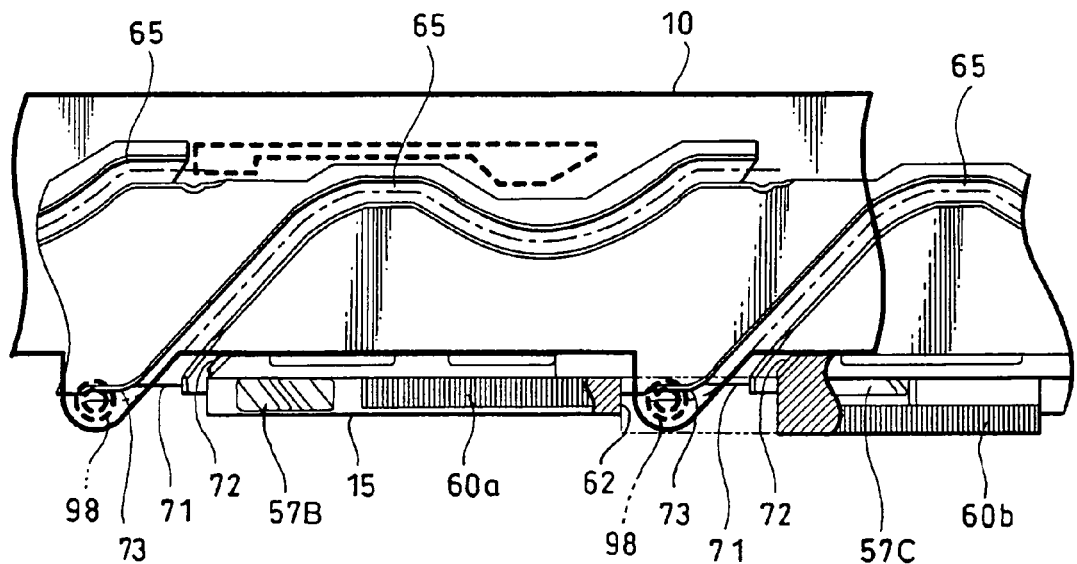
Figure 21A:
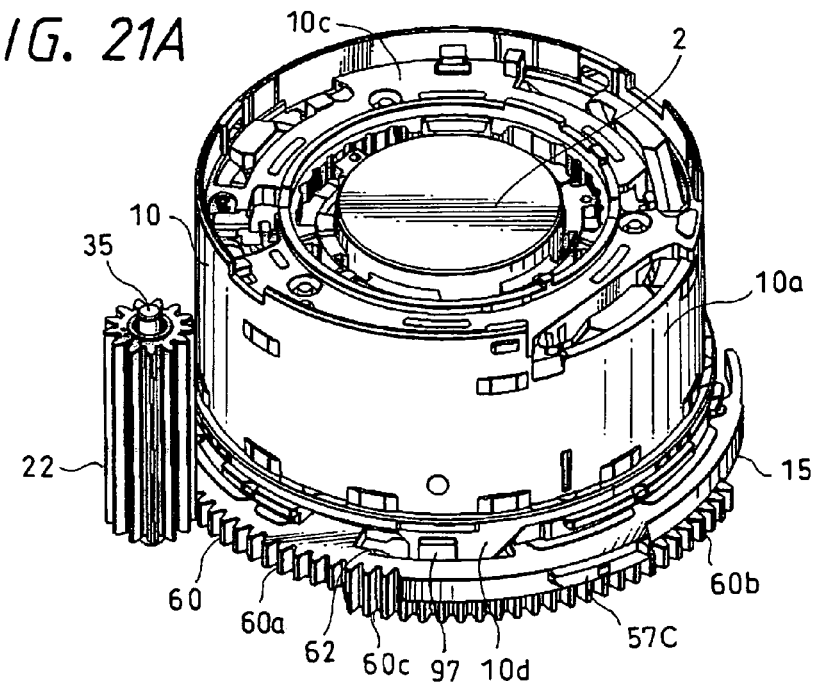
Figure 21B:
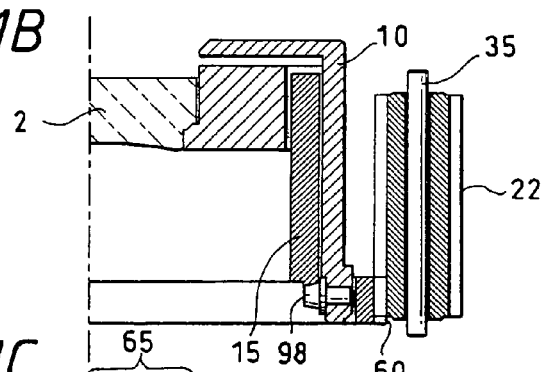
Figure 21C:
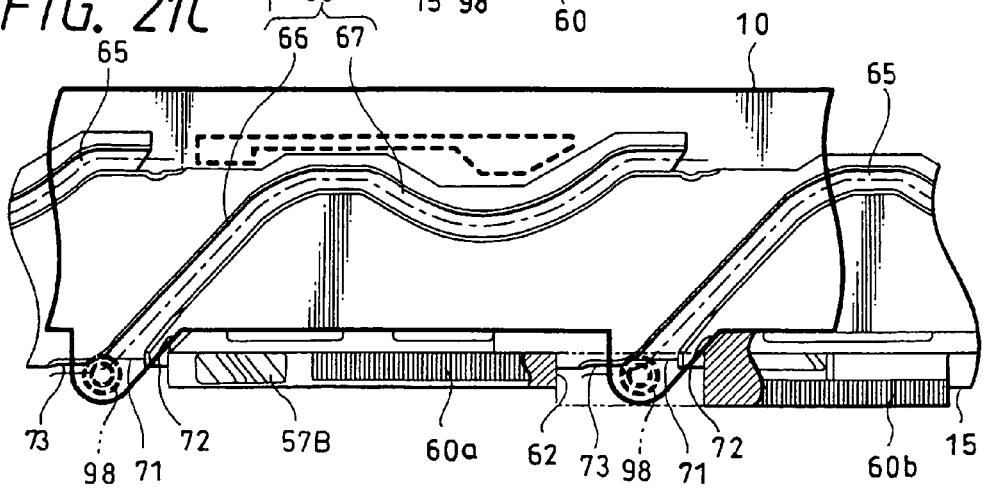
Figure 22A:
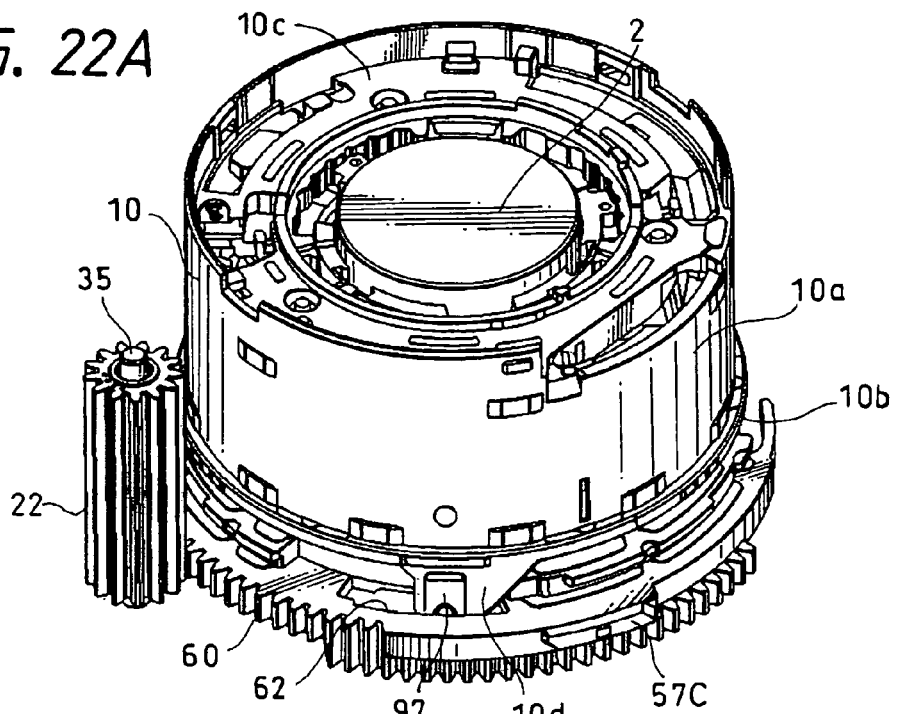
Figure 22B:
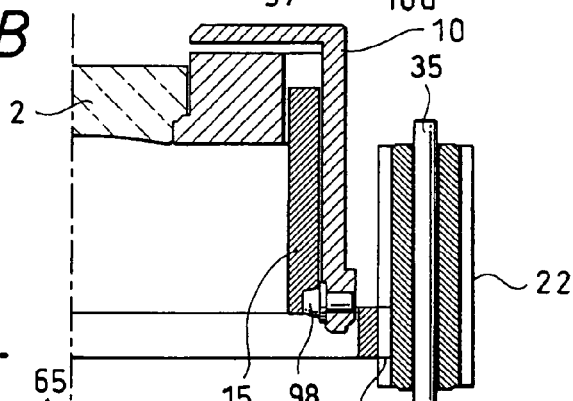
Figure 22C:
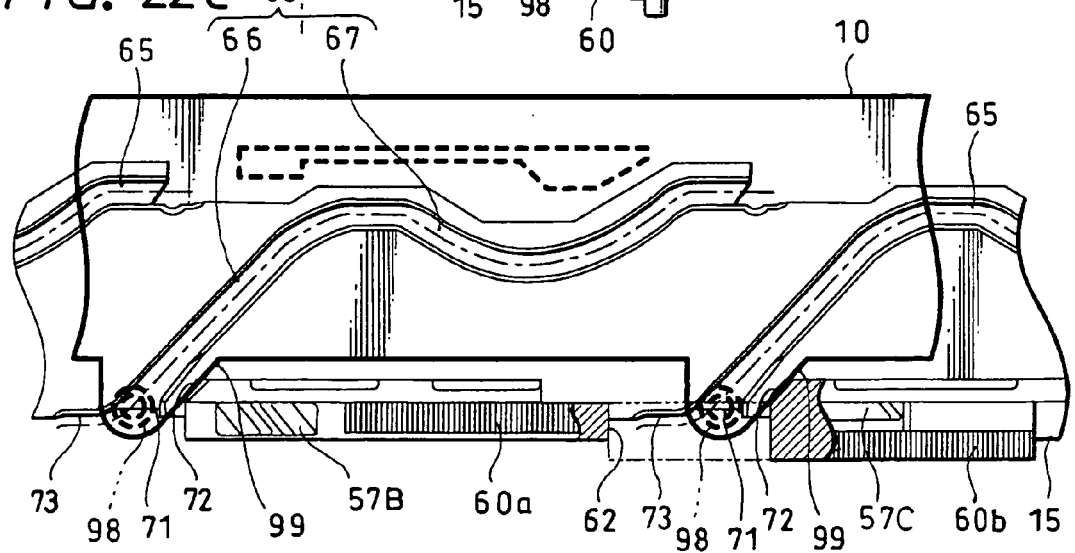
Figure 23A:
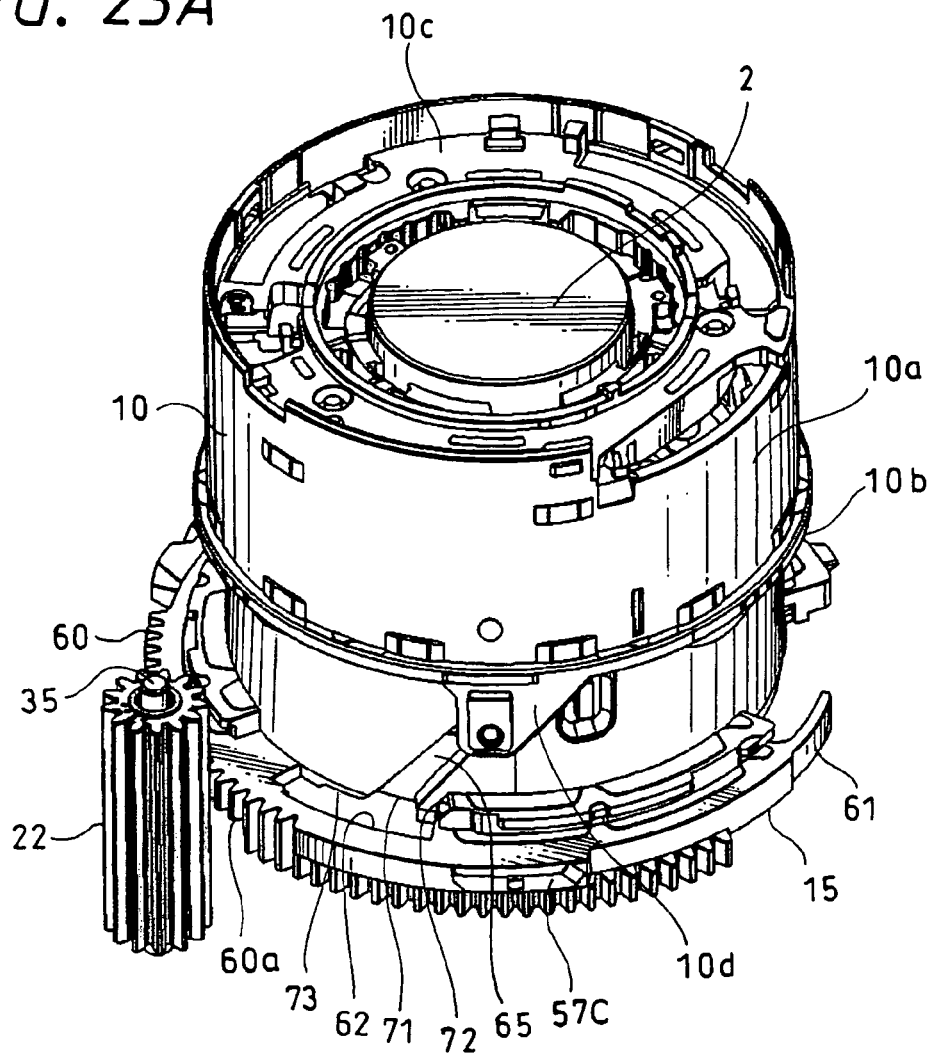
Figure 23B:
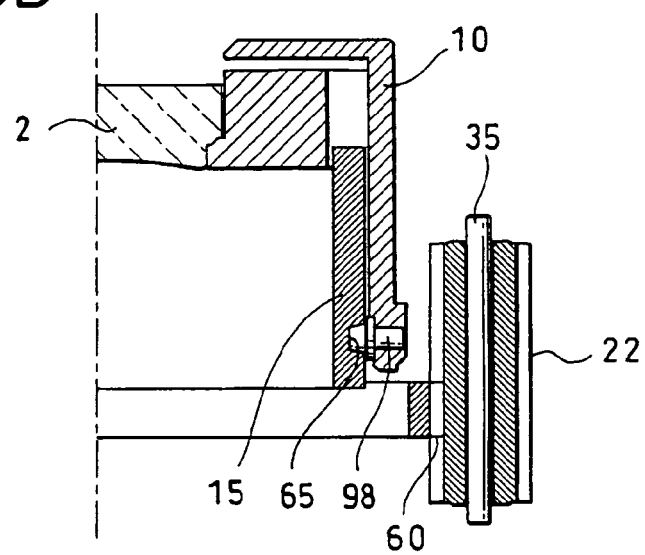
Figure 24:
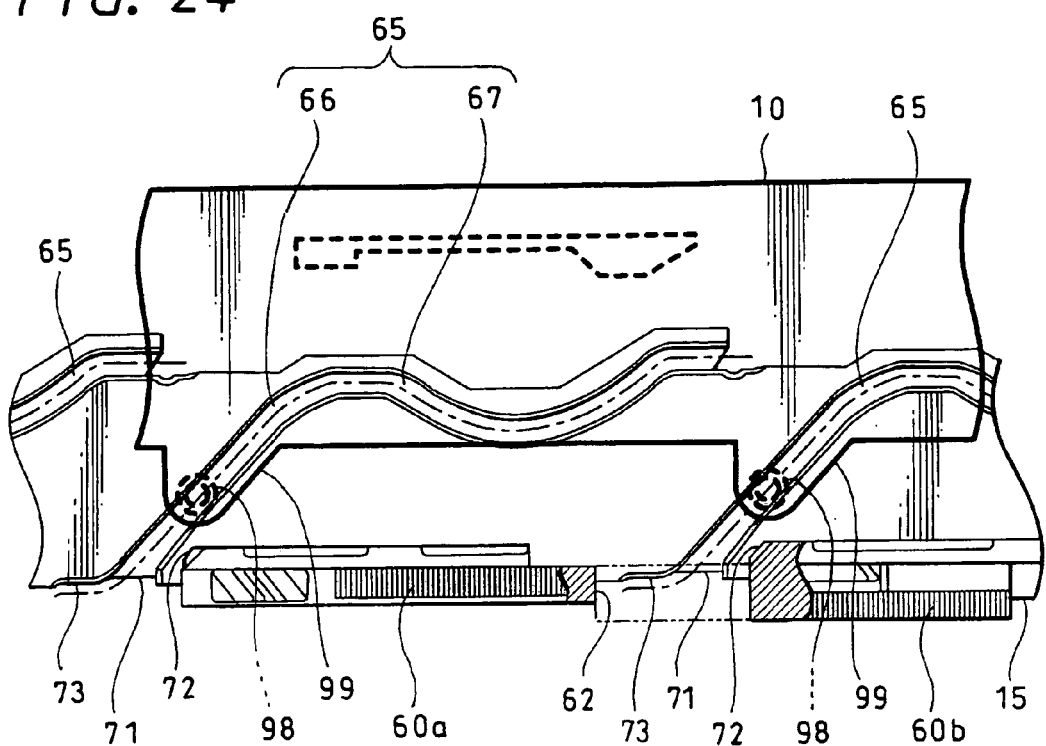
FIG. 24 is a developed view to which reference will be made in explaining a relationship between the assembly body of the one group ring and the cam ring shown in FIGS. 17A and 17B and the drive gear, showing the one group ring and the cam ring shown in FIG. 23A in a developed fashion and also showing a part of the gear portion in a cross-sectional fashion to expose the came groove opening portion.
Figure 25:
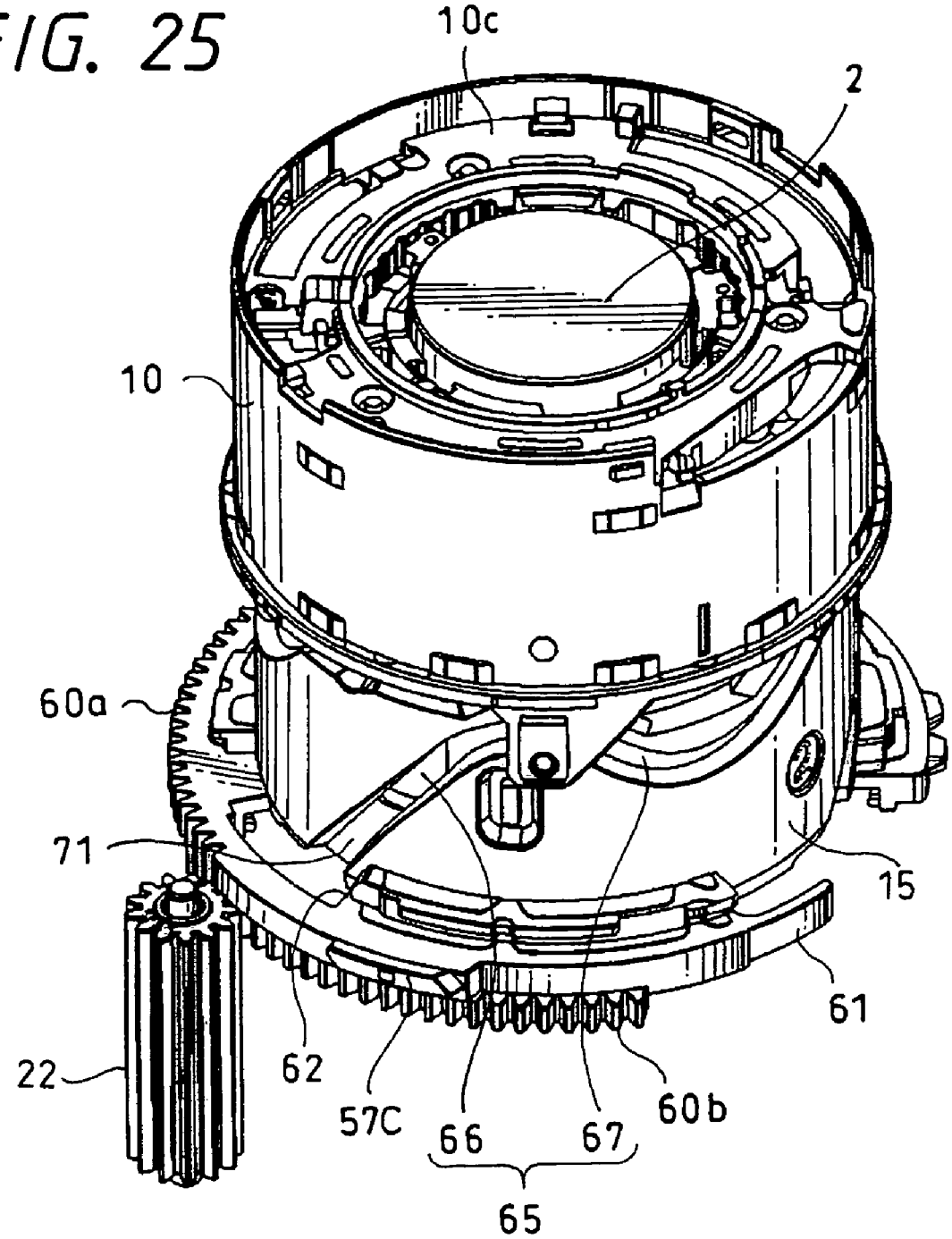
FIG. 25 is a perspective view to which reference will be made in explaining a relationship between the assembly body of the one group ring and the cam ring shown in FIGS. 17A and 17B and the drive gear, showing the state in which the cam follower of the one group ring is moved into the barrel retracted area of the cam groove of the cam ring.
Figure 26A:
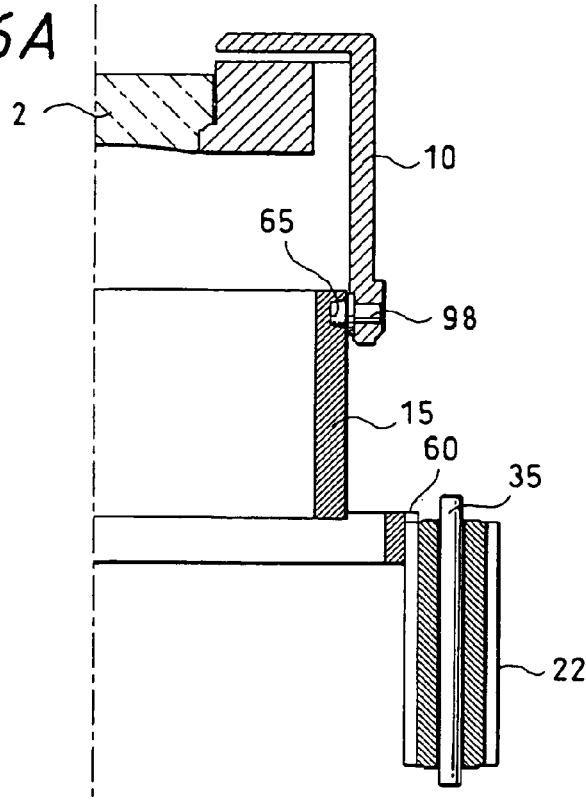
Figure 26B:
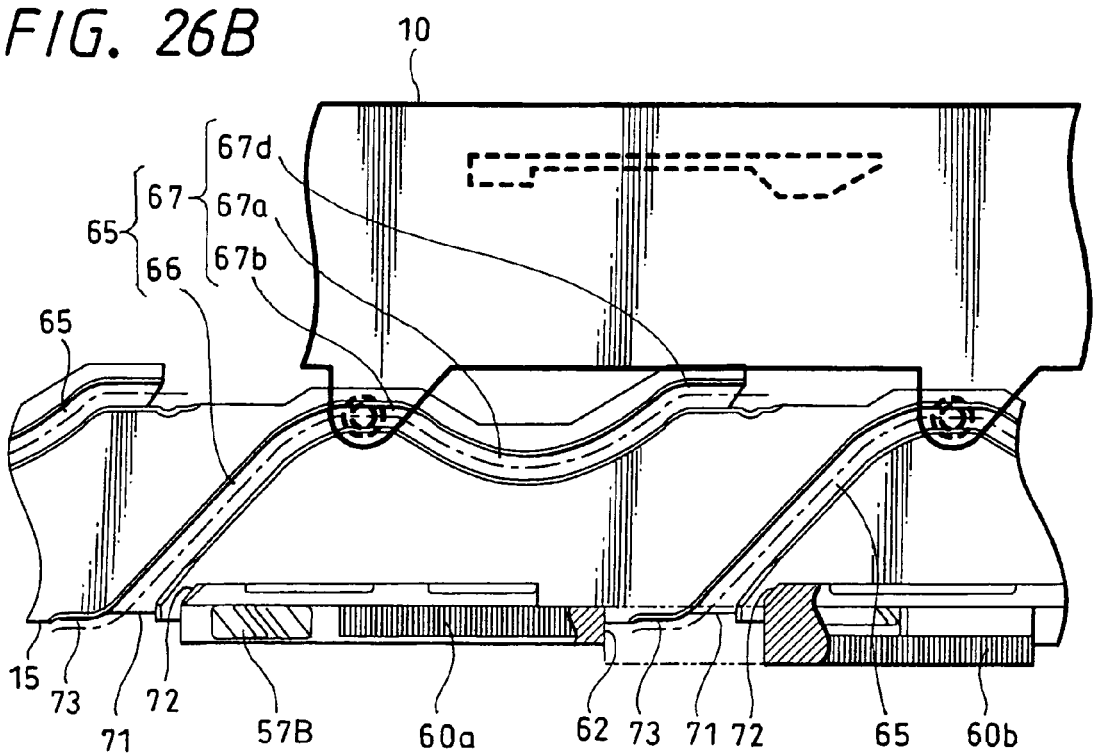
Figure 27A:
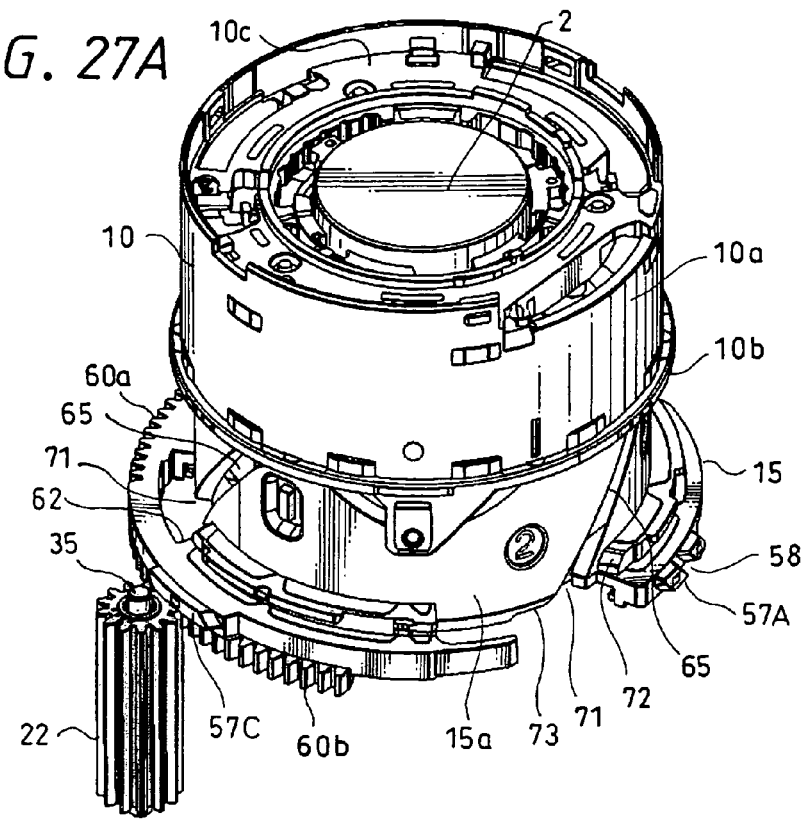
Figure 27B:
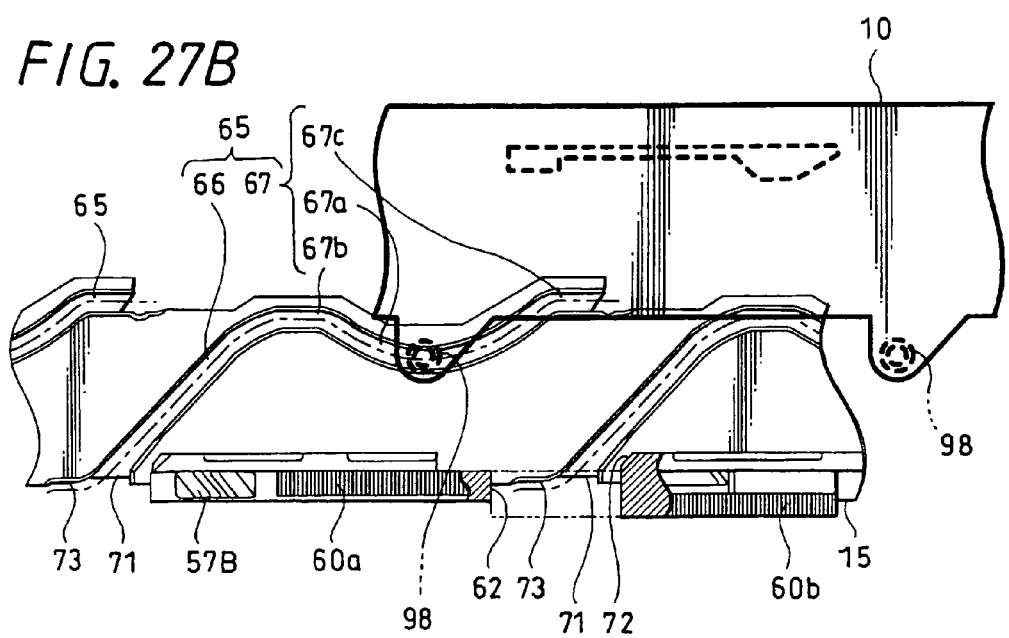
Figure 28A:
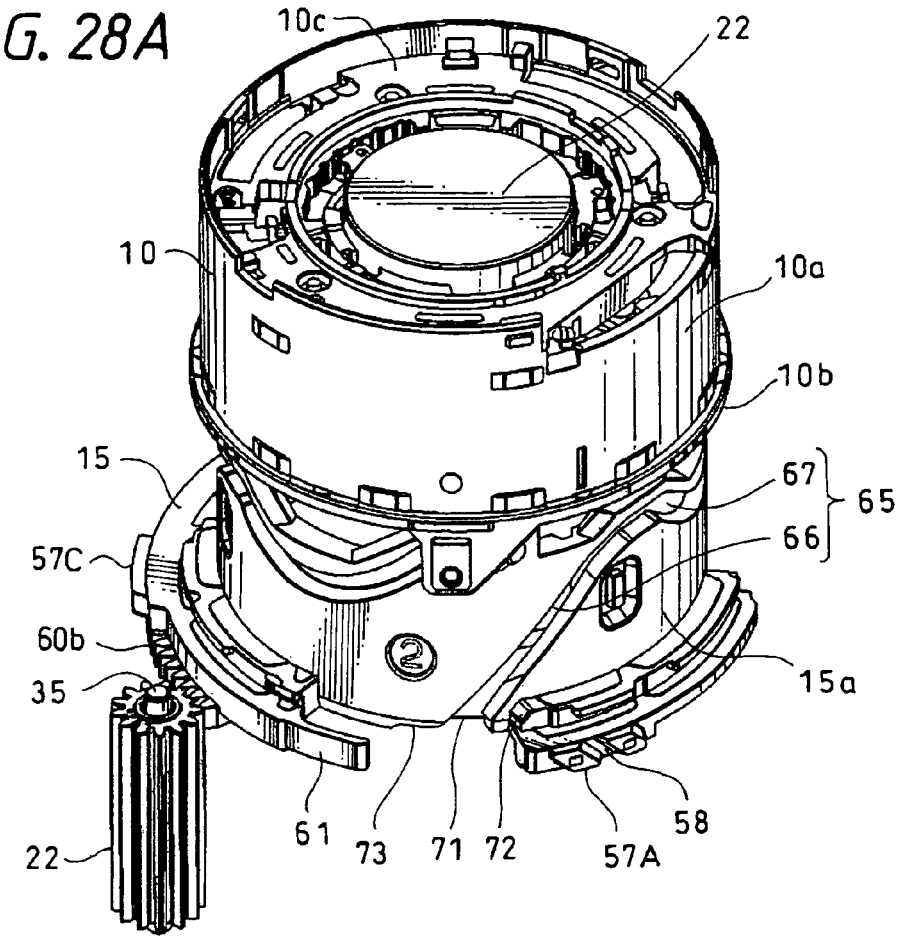
Figure 28B:
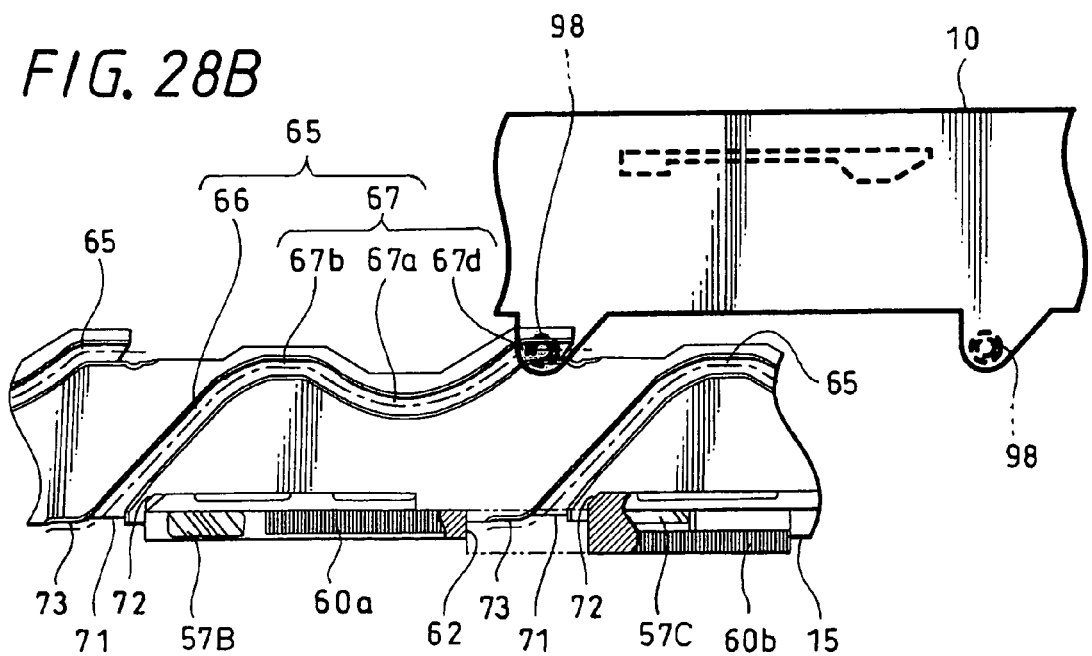

FIG. 12 is a perspective view of an automatic exposure apparatus, a space restricting member and a two group ring. FIG. 13 is a developed view of the two group ring. FIG. 14 is a perspective view of a one group lens, a one group ring and the like. FIG. 15 is a developed view of the one group ring. FIGS. 16A and 16B are respectively a perspective view showing a combination of the cam ring and the one group ring from the bottom side and a diagram showing main portions of such combination of the cam ring and the one group ring in an enlarged-scale. FIGS. 17A and 17B are respectively a front view and a bottom view of the same combination of the cam ring and the one group ring. FIGS. 18A and 18B are respectively a right-hand side elevational view of the same combination of the cam ring and the one group ring and a longitudinal cross-sectional view taken along the line Y-Y in FIG. 17B. Also, FIGS. 19A, 19B to FIGS. 28A, 28B are diagrams to which reference will be made in explaining a positional relationship between the cam follower of the one group ring and the cam groove of the cam ring. More specifically, FIGS. 19A and 19B are respectively a perspective view and a cross-sectional view, FIGS. 20A and 20B are respectively diagrams used to explain main portions, FIGS. 21A, 21B and 21C are respectively a perspective view, a cross-sectional view and a diagram used to explain main portions, FIGS. 22A, 22B and 22C are respectively a similar perspective view, a similar cross-sectional view and a similar diagram used to explain main portions, and FIGS. 23A and 23B are respectively a perspective view and a cross-sectional view. FIG. 24 is a diagram used to explain main portions, FIG. 25 is a perspective view, FIGS. 26A and 26B are respectively a cross-sectional view and a diagram used to explain main portions, FIGS. 27A and 27B are respectively a perspective view and a diagram used to explain main portions and FIGS. 28A and 28B are respectively a perspective view and a diagram used to explain main portions.

Figure 29:
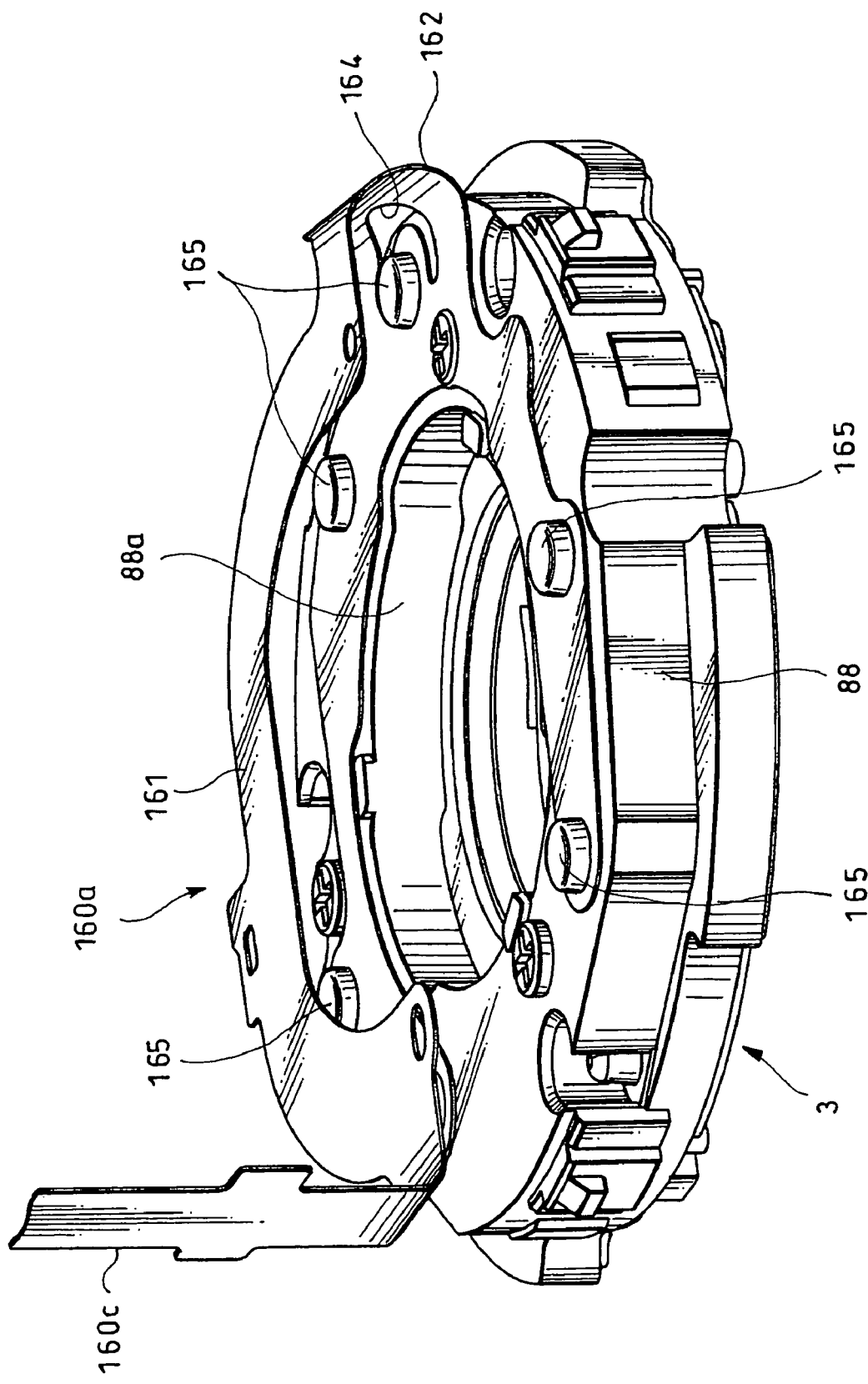
FIG. 29 is an explanatory diagram to which reference will be made in explaining the state in which one end of a flexible wiring board is connected to the automatic exposure apparatus shown in FIG. 12, the flexible wiring board being laid around.
Figure 30:
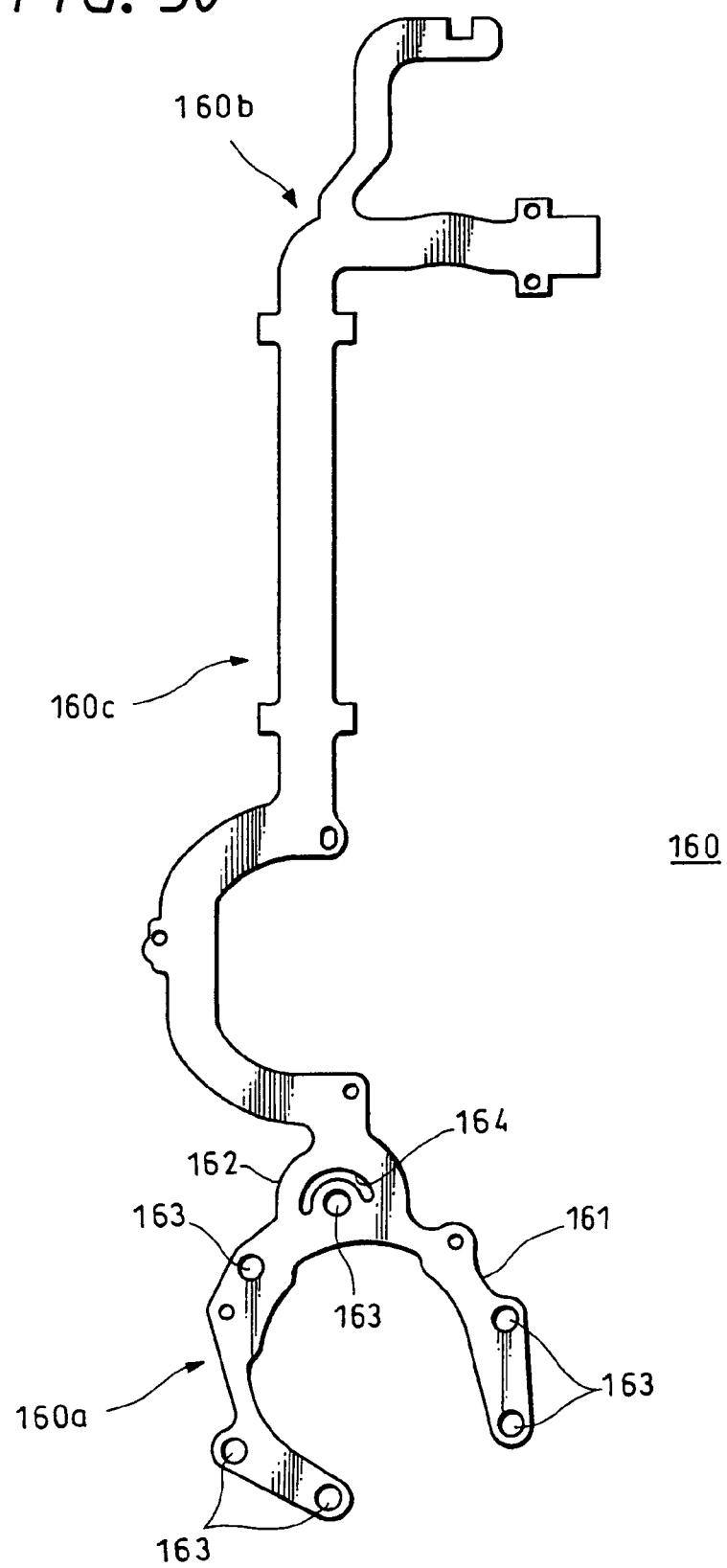
FIG. 30 is a developed view showing a specific example of the flexible wiring board according to the lens barrel of the present invention.

FIG. 29 is a diagram showing the state of a flexible wiring board attached to an automatic exposure apparatus, FIG. 30 is a developed view showing an embodiment of the flexible wiring board and FIG. 31 is a diagram to which reference will be made in explaining a relationship between a relative position of the automatic exposure apparatus and the two group ring in the optical axis direction and slackening of the flexible wiring board.

The lens barrel, generally depicted by reference numeral 1 in FIGS. 1 to 4, shows a first embodiment of a lens barrel according to the present invention. This lens barrel 1 includes a shooting optical system composed of optical elements such as a plurality of lenses and filters, a mechanical system such as ring bodies and frame bodies to support fixedly or movably constituents of the shooting optical system, a power supply system such as motors and gears to operate the mechanical system and the like.

As shown in FIGS. 2 to 4, the shooting optical system of the lens barrel 1 is composed of a first lens group 2 formed of a combination of lenses located in the sequential order from the object side, an automatic exposure apparatus 3 serving as a light amount adjuster composed of a shutter and an iris, a second lens group 4 formed of a combination of a plurality of lenses, a third lens group 5 formed of a combination of one or more than two lenses, a low-pass filter (LPF) 6, an image pickup device (CCD (charge-coupled device)) 7 and the like. The first lens group 2 and the second lens group 4 are able to demonstrate a zooming function and zooming operations of the optical system can be executed by moving the two lens groups 2 and 4 in the optical axis direction by predetermined amounts. Also, the third lens group 5 is able to demonstrate a focusing function and focusing operations of the optical system can be executed by moving the third lens group 5 in the optical axis direction by predetermined amounts.

The mechanical system of the lens barrel 1 includes a one group ring 10 which shows a first specific example of a linearly movable member, a one group lens frame 11 to hold the first lens group 2, a two group ring 12 which shows a second specific example of a linearly movable member and which also shows a specific example of an adjacent member, a two group lens frame 13 to hold the second lens group 4, a linearly movable ring 14, and a cam ring 15 which shows a specific example of a rotary member, a fixed ring 16 fixed to a camera body of a digital still camera and the like. There are also included a three group lens frame 17 to hold the third lens group 5, and a rear lens barrel 18 fixed to the rear portion of the fixed ring 16 and the like. Those elements above are arranged in the sequential order from the object side. Then, a CCD unit 20 including the image pickup device (CCD) 7 is attached to the rear barrel 18.

Also, the power source system of the lens barrel 1 includes a deceleration gear unit 21 and a drive gear 22 to rotate the cam ring 15, an F motor unit 23 to enable the optical system to carry out focusing operation and the like. The deceleration gear unit 21 and the F motor unit 23 are attached to an assembly body of the fixed ring 16 and the rear barrel 18. Then, the drive gear 22 is supported by the fixed ring 16 and the rear barrel 18 so as to rotate freely.

The rear barrel 18 includes an annular rear surface portion 18a having a substantially square through-hole 25 defined at its central portion, an inside boss portion 18b projected on one surface side so as to surround the circumference of the through-hole 25 on the rear surface portion 18a and an outside boss portion 18c projected on one surface side so as to continue the outer edge of the rear surface portion 18a. A unit supporting portion 26 to support the F motor unit 23 is provided at one portion of the outside boss portion 18c. A seat portion 18d is formed by denting the peripheral edge of the back side of the inside boss portion 18b of the rear barrel 18 and the CCD unit 20 is mounted on the seat portion 18d.

As shown in FIGS. 2 to 4, the CCD unit 20 includes a CCD adapter 28 to hold the CCD (image pickup device) 7 and other constituents, a seal rubber 29, a filter pushing device 30 and the like. The CCD 7 is fixed to the CCD adapter 28. The CCD adapter 28 is formed of a substantially square frame body fitted into the through-hole 25 of the rear barrel 18. The CCD 7 is fixed to the CCD adapter 28 through the seal rubber 29 in such a manner that its light-receiving surface may be opposed to the central opening portion of the CCD adapter 28. The low-pass filter 6 is located ahead of the light-receiving surface of the CCD 7. The low-pass filter 6 is fixed by the filter pushing device 30 formed of the substantially square shaped frame body and it is detachably supported to the CCD adapter 28. In FIG. 2, reference numeral 31 denotes a flexible wiring board for use with the CCD 7.

The fixed ring 16 fixed to the front portion of the rear barrel 18 has a configuration shown in FIG. 5. The fixed ring 16 is formed of a cylinder body of a substantially cylindrical shape which serves as the outer casing body of the lens barrel 1. All elements of the shooting optical system can be accommodated within this fixed ring 16. As shown in a developed view of FIG. 6, while the optical axis direction front surface portion 16a, which is one end surface of the fixed ring 16, is formed as the flat surface portion vertical to the optical axis direction, the optical axis direction rear surface portion 16b, which is the other end surface of the fixed ring 16, is formed so as to have uneven portions in the optical axis direction by predetermined stepped portions. The uneven portions of the rear surface portion 16b are provided so as to correspond to the uneven portions of the joint portion of the rear barrel 18. Further, the fixed ring 16 has a first recess 33 to expose a part of the drive gear 22 and a second recess 34 to expose a part of the three group lens frame 17.

The first and second recesses 33 and 34 of the fixed ring 16 are respectively opened to the rear surface portion 16b. In response to the first recess 33, a bearing portion 16c to support one end of the axial direction of the supporting shaft 35, which rotatably supports the drive gear 22, is provided on the outer surface of the fixed ring 16. Then, in response to the second recess 34, a supporting portion 16d to support one portion of the F motor unit 23 is provided on the outer surface of the fixed ring 16. Also, totally three cam grooves 37A, 37B and 37C of two kinds having substantially same cam curves and totally five linearly movable guide grooves 38A, 38B and 38C of three kinds linearly extended in the optical axis direction are provided on the inner peripheral surface of the fixed ring 16.

The totally three cam grooves 37A, 37B and 37C of two kinds of the fixed ring 16 include an inclined surface portion 37a spirally extended in the circumferential direction, a front horizontal portion 37b continued to the side of the front surface portion 16a of the inclined surface portion 37a and which is extended in the circumferential direction perpendicular to the optical axis direction. There is also included a rear horizontal portion 37c continued to the side of the rear surface portion 16b of the inclined surface portion 37a which is extended in the circumferential direction perpendicular to the optical axis direction and which is further extended in the direction opposite to the front horizontal portion 37b. While the respective inclined surfaces 37a of the three cam grooves 37A, 37B and 37C are the same in width, central rims 39 are provided on the respective inclined surfaces 37a of the two first cam grooves 37A and 37B of the first kind so as to halve the width direction. A right path 39a and a left path 39b, which are extended in parallel to each other, are formed on the inclined surface portions 37a by the central rims 39.

The totally three cam grooves 37A, 37B and 37C of the two first cam grooves 37A and 37B and one second cam groove 37C of the second kind which have different points from a configuration standpoint are disposed on the flat surface crossing the optical axis direction at substantially equal interval in the circumferential direction. Three cam followers, which will be described later on, provided on the cam ring 15 are slidably engaged with the totally three cam grooves 37A, 37B and 37C of the two kinds having the above-mentioned configurations.

On the other hand, the totally five linearly movable guide grooves 38A, 38B and 38C of the three kinds are located on the plane crossing the optical axis direction at a right angle in parallel to each other such that they are spaced apart from each other with a proper space in the circumferential direction. The two first linearly movable guide grooves 38A and 38B of the first kind are adapted to guide two of the linearly movable ring 14 and the rotation restricted member 80 in the optical axis direction. The two first linearly movable guide grooves 38A and 38A are slidably engaged with cam followers, which will be described later on, provided on the linearly movable ring 14. The two first linearly movable guide grooves 38A and 38A are located on one side (left-hand side in FIG. 6) of each of the first cam grooves 37A and 37B with a proper space. Then, the two first linearly movable guide grooves 38A and 38A are provided so as to cross the front horizontal portions 37b of the first and second cam grooves 37A and 37B.

On the other hand, the three second linearly movable guide grooves 38B, 38B and 38C of the second kind are adapted to guide a linearly movable restricting member, which will be described later on, in the optical axis direction. Of the three second linearly movable guide grooves 38B, 38B and 38C, the two second linearly movable guide grooves 38B and 38B are provided so as to cross the inclined surface portion 37a of the first cam groove 37A, whereby notch portions 41 to divide the central projected rim 39 in the oblique direction are respectively provided on the respective inclined surface portions 37a. On the other hand, the remaining one second linearly movable guide groove 38C is provided so as to cross the front horizontal portion 37b of the third cam groove 37C similarly to the first linearly movable guide groove 38A.

The fixed ring 16 having the above-mentioned arrangement is located ahead of the rear barrel 18 and it is detachably fixed to the rear barrel 18 by a plurality of fixed screws. The supporting shaft 35 is held by the barrel assembly body of the fixed ring 16 and the rear barrel 18 and part of gear teeth of the drive gear 22 rotatably supported to the supporting shaft 35 is exposed from the first recess 33 to the outside of the barrel assembly body over substantially the whole length of the gear teeth width direction. A deceleration gear unit 21 is detachably attached to the bearing portion 16c of the fixed ring 16 and the flange portion of the rear barrel 18 so as to cover the exposed portion of this drive gear 22 and fastened and fixed thereto by a plurality of fixed screws.

As shown in FIG. 2, the deceleration gear unit 21 is composed of an output gear (not shown) meshed with the drive gear 22, one or more than two reduction gears to transmit power to the output gear, a zoom motor 44 to rotate the output gear by transmitting power to the zoom motor 44 through the reduction gear, a housing 45 to rotatably support the output gear and other gears and which may fixedly support the zoom motor 44 and the like. This housing 45 is fastened and fixed to the barrel assembly body by fixed screws, whereby the deceleration gear unit 21 may be attached so as to be assembled and disassembled. This deceleration gear unit 21 includes a rotation detector composed of a suitable device such as a rotary encoder to detect revolutions of the zoom motor 44 to thereby output a detected signal.

Also, the unit supporting portion 26 of the rear barrel 18 is formed of a pair of supporting pieces to support the F motor unit 23 so as to hold the F motor unit 23. The pair of supporting pieces are projected forward so as to become substantially parallel to each other with a proper space. The F motor unit 23 held by this unit supporting portion 26 and the supporting portion 16d of the fixed ring 16 serves as a power supply source to enable the lens barrel 1 to carry out focusing operation. The F motor unit 23 includes a focus motor 46, a motor bracket 47 to fixedly support this focus motor 46, a carriage 48 movably screwed to a rotary shaft 46a of the focus motor 46, a guide bar 49 to guide this carriage 48 substantially parallelly in the axis direction of the rotary shaft 46a and the like.

The motor bracket 47 is formed like a U-shape and the focus motor 46 is fixed to the outside of one raising piece. The rotary shaft 46a of the focus motor 46 is formed of a feed screw shaft. Its rotary shaft 46a is extended through one raising piece and its tip end portion is supported to the other raising piece so as to become freely rotatable. Between one raising piece and the other raising piece, the carriage 48 is screwed to the rotary shaft 46a so as to become movable in the axis direction. A guide bar 49 of which axis line is set substantially parallel to the axis line of the rotary shaft 46a is slidably extended through the carriage 48. Both end portions of the axis direction of the guide bar 49 are supported to the motor bracket 47, and the carriage 48 can be guided by this guide bar 49 so that it can be moved forward and backward relative to the optical axis direction.

The third lens group 5 can be moved forward and backward relative to the optical axis direction by the F motor unit 23 having the above-mentioned arrangement. The third lens group 5 is located ahead of the low-pass filter 6 disposed in front of the CCD 7 and it is held by the three group lens frame 17. The third group lens frame 17 is composed of a lens holding portion 17a to hold the third lens group 5 and an arm portion 17b continued to one side of the lens holding portion 17a. The arm portion 17b has a slide bearing portion 17c into which the guide shaft 51 is slidably inserted and an engagement portion 17d which is engaged with the carriage 48 of the F motor unit 23.

One end of a three group spring 52 formed of a coil spring is engaged with this three group lens frame 17. The other end of the three group spring 52 is engaged with the fixed ring 16. Under spring force of this three group spring 52, the engagement portion 17d of the three group lens frame 17 is constantly urged against the carriage 48 with suitable springbiasing force. Thus, when the focus motor 46 of the F motor unit 23 is driven to rotate, the carriage 48 is guided by the guide bar 49 and moved forward and backward in the optical axis direction against the spring force of the three group spring 52 in response to the rotation direction of the focus motor 46 of the F motor unit 23. As a result, in response to a rotation amount of the F motor unit 23, the third lens group 5 is moved a predetermined amount in the optical axis direction, thereby resulting in predetermined focusing operation being carried out.

A cam ring 15 is located in the inside of the fixed ring 16. The cam ring 15 has an arrangement shown in FIGS. 7 to 9. As shown in FIGS. 7 to 9, the cam ring 15 has a cylindrical body portion 15a with an outer diameter slightly smaller than an inner diameter of the fixed ring 16 and a flange portion 15b continued to one end surface side of its body portion 15a. The flange portion 15b is developed to the outside of the radial direction. The flange portion 15b is composed of a first flange portion 54a of an arc shape which shares substantially ½ of the circumferential direction and a second flange portion 54b of an arc shape located on the opposite side so as to oppose the first flange portion 54a. The second flange portion 54b is formed as an area that shares substantially ⅙ of the circumferential direction. First and second recess portions 55a and 55b of substantially the same size as that of the second flange portion 54b are formed between the second flange portion 54b and the first flange portion 54a in both sides of the circumferential direction.

As shown in FIGS. 8A and 8B, the flange portion 15b of the cam ring 15 has three cam projected portions 57A, 57B and 57C that show the first embodiment of the cam followers. The three cam projected portions 57A, 57B and 57C are disposed in the circumferential direction at substantially equal space. The first cam projected portion 57A is provided on one side of the first flange portion 54a, the second cam projected portion 57B is provided on the other side of the first flange portion 54a and the third cam projected portion 57C is provided on the second flange portion 54b. Of the three cam projected portions 57A, 57B and 57C, the first and second cam projected portions 57A and 57B have provided thereon engagement grooves 58 extended in the oblique direction.

The three cam projected portions 57A, 57B and 57C are slidably engaged with the three cam grooves 37A, 37B and 37C provided on the inner peripheral surface of the fixed ring 16. The three cam projected portions 57A, 57B and 57C are formed so as to correspond to the three cam grooves 37A, 37B and 37C. The central projected rims 39 provided on the first and second cam grooves 37A and 37B are slidably engaged with the respective engagement grooves 58 provided on the first and second cam projected portions 57A and 57B. Since the right and left paths 39a and 39b are formed by providing the central projected rims 39 on the wide inclined surface portions 37a of the cam grooves 37A, 37B and 37C as described above, a follower of a linearly movable restricting member, which will be described later on, which can be moved along the second linearly movable guide groove 38B extended in the direction crossing the left and right paths 39a and 39b can be linearly moved smoothly without being displaced from the second linearly movable guide groove 38B.

While the three cam projected portions 57A, 57B and 57C are set on the same plane that crosses at a right angle the axis line of the body portion 15a, as shown in FIGS. 7A and 7B, only the third cam projected portion 57C is formed thinner than other cam projected portions 57A and 57B. A gear portion 60 formed of spur gears is provided on the first flange portion 54a of the flange portion 15b so as to surround the third cam projected portion 57C. The gear portion 60 is composed of a first gear portion 60a continued to one side of the circumferential direction of the first cam projected portion 57A and which has the same tooth width, a second gear portion 60b formed to the outside of the axis line direction of the third cam projected portion 57C and which may have substantially the same tooth width as that of the first gear portion 60a and a third gear portion 60c connecting the first and second gear portions 60a and 60b and which may have a tooth width that results from adding tooth widths of the first and second gear portions 60a and 60b.

The drive gear 22 is constantly meshed with this gear portion 60 in any of the gear portions 60a, 60b and 60c. Thus, when the drive gear 22 is rotated by actuation of the deceleration gear unit 21, the cam ring 15 is rotated left or right in response to the rotation direction of the drive gear 22. The length of the circumferential direction of this gear portion 60 has gear teeth of the number large enough to rotate the cam ring 15 by a predetermined angle. For this reason, although the cam ring 15 is also moved in the axis line direction at the same time the cam ring 15 is rotated by the drive gear 22, since the tooth width of the drive gear 22 is set to be sufficiently longer than a movement amount (stroke) of the axis line direction of the cam ring 15, the cam ring 15 may be rotated within a predetermined range in the state in which the drive gear 22 and the gear portion 60 are constantly meshed with each other.

Further, a fin 61 to detect the rotation position of the cam ring 15 is provided on the first flange portion 54a of the flange portion 15b of the cam ring 15. The fin 61 is continued to the end portion of the side of the third cam projected portion 57C of the first flange portion 54a and it may be formed with a predetermined length in the circumference direction. Although not shown, a photosensor is provided on the rear barrel 18 in order to detect this fin 61. When the photosensor is switched by movement of the fin 61, it is possible to detect the rotation position of the cam ring 15. Thus, when a control apparatus, which will be described later on, processes these information based on rotation position information obtained from this rotation position detecting device and detection information obtained from the rotary encoder provided on the aforementioned deceleration gear unit 21, it is possible to control a rotation speed and a rotation position of the cam ring 15.

Furthermore, the first flange portion 54a of the flange portion 15b of the cam ring 15 has a through-hole 62 that may penetrate the first flange portion 54a in the tooth width direction. The through-hole 62 is formed like an arc that may become concentric with respect to the outer peripheral surface of the body portion 15a or the teeth of the gear portion 60 at the position of the opposite side opposing the second flange portion 54b. The end portion of the body portion 15a facing to this through-hole 62 is shaped similarly to the first and second recess portions 55a and 55b as will be described later on.

Three outer cam grooves 65 having the identical cam curve (trajectory) are provided on the outer periphery of the body portion 15a of the cam ring 15. The three outer cam grooves 65 enable the lens barrel 1 to carry out optical zooming operations and barrel retracting operations and they are located at substantially equal space in the circumferential direction. As shown in FIGS. 7A, 7B and FIG. 9A, each of the three outer cam grooves 56 is composed of a barrel retracting operation area 66 to apply the barrel retracting operation to the lens barrel 1 and a zooming operation area 67 continued to the barrel retracting operation area 66. The barrel retracting operation area 66 of the outer cam groove 65 is spirally extended in the slanting direction with an angle of inclination of approximately 45 degrees on the outer peripheral surface of the body portion 15a. One end of this barrel retracting operation area 66 is opened to the end portion of the side of the flange portion 15b of the body portion 15a and one end of the zooming operation area 67 is continued to the other end of the barrel retracting operation area 66.

The zooming operation area 67 of the outer cam groove 65 includes a zoom groove portion 67a formed of a groove shaped like an arc by a predetermined curve, a communicating portion 67b formed of a groove to gently communicate one end of this zoom groove portion 67a and the barrel retracting operation area 66 and a closing portion 67c or an opening portion 67d to close the other end of the zoom groove portion 67a or to open the other end of the zoom groove portion 67a to the end portion of the opposite side (anti-flange side) of the side of the flange portion 15b of the body portion 15a. The zoom groove portion 67a of the zooming operation area 67 is formed like a convex shape relative to the side of the flange portion 15b in the anti-flange side of the body portion 15a. The communicating portion 67b of the zooming operation area 67 is formed of a groove of which straight line portions are continued gently. Also, the closing portion 67a and the opening portion 67b are formed of grooves which are continued in the circumferential direction.

In order to form these communicating portion 67b and closing portion 67c or opening portion 67d, three kinds of projected portions 68a, 68b and 68c are provided on the anti-flange side of the body portion 15a. The three first projected portions 68a provided in response to the communicating portion 67b are formed of trapezoidal portions having inclined surfaces formed at their both sides. Also, the one second projected portion 68b provided in response to the closing portion 67c and the two third projected portions 68c and 68c provided in response to the opening portion 67d are formed of trapezoidal portions having inclined surfaces formed only at their one sides. On the other hand, as shown by chain double-dashed lines in FIG. 9A, in the two third projected portions 68c and 68c, their vertical surfaces are set to the intermediate portion of the cam groove with the result that the cam groove is opened to the end surface side of the body portion 15a.

The opening end on the side of the flange portion 15b of the barrel retracting operation area 66 of the outer cam groove 65 forms a groove opening portion 71 into and from which a cam follower, which will be described later on, of the one group ring 10 is inserted and extracted. A pressing portion 72 to press the cam follower of the one group ring 10 to transmit rotation force of the cam ring 15 to the one group ring 10 is provided at the outside of the side surface of one cam groove that forms the cam groove opening portion 71. Further, a holding portion 73 to hold the cam follower at the position distant from the outer cam groove 65 is provided on the cam groove opening portion 71 at its opposite side of the pressing portion 72.

As shown in FIGS. 7A, 7C and FIG. 9B, three sets of inner cam groove groups 74 having identical cam curves (trajectories) are located in the inner periphery of the body portion 15$a$ of the cam ring 15 at an equal space in the circumferential direction. The three sets of the inner cam grooves 74 are formed of combinations of front inner peripheral cam grooves 75 and rear inner peripheral cam grooves 76 having identical cam curves (trajectories). The front inner peripheral cam groove 75 and the rear inner peripheral cam groove 76 are distant from each other by a predetermined space in the axis line direction, which is the optical axis direction, of the body portion 15$a$. Also, the front inner peripheral cam groove 75 and the rear inner peripheral cam groove 76 are set to be slightly displaced in the circumferential direction and they are located in the state in which they are slightly twisted from each other.

Fundamental cam curves of the front inner peripheral cam groove 75 and the rear inner peripheral cam groove 76 include a first inclined surface portion 77$a$ inclined in the direction similar to the barrel retracting operation area 66 of the outer cam groove 65, a second inclined surface portion 77$b$ inclined in the opposite side of the first inclined surface portion 77 and a horizontal portion 77$c$ to connect one end of the first inclined surface portion 77$a$ and one end of the second inclined surface portion 77$b$ in the circumferential direction. There are also included an opening portion 77$d$ continued to the other end of the first inclined surface portion 77$a$ and a circulating portion 77$e$ continued to the other end of the second inclined surface portion 77$b$, respectively. While the first inclined surface portion 77$a$ is inclined at an angle of approximately 45 degrees, its intermediate portion is curved a little in the rear side. Also, the second inclined surface portion 77$b$ and the circulating portion 77$e$ are joined together by a joint portion curved in the front side and they are returned to the second inclined surface portion 77$b$ after they were moved in the circumferential direction within the circulating portion 77$e$.

The front inner peripheral cam groove 75 and the rear inner peripheral cam groove 76 have the fundamental cam curve as described above. The front inner peripheral cam groove 75 includes most of the first inclined surface portion 77$a$, the horizontal portion 77$c$, the second inclined surface portion 77$b$ and the circulating portion 77$d$. On the other hand, the rear inner peripheral cam groove 76 is composed of only a part of the first inclined surface portion 77$a$ and the opening portion 77$d$. More specifically, the first inclined surface portion 77$a$ of the front inner peripheral cam groove 75 is opened to the end surface of the projected portion 68$b$ in the first inner cam groove group 71 and it is also opened to the side surfaces of the projected portions 68$c$ and 68$c$ in the second and third inner cam groove group 74. A part of the horizontal portion 77$c$ of the front inner peripheral cam groove 75 is opened to the end surface of the flange side of the body portion 15$a$.

Also, the rear inner peripheral cam groove 76 includes only the opening portion 77$d$ and the portion of the side of the opening portion 77$d$ of the first inclined surface portion 77$a$. More specifically, one end of the opening portion 77$d$ is opened to the end surface on the anti-flange side of the body portion 15$a$ and one end of the first inclined surface portion 77$a$ is opened to the end surface of the flange side of the body portion 15$a$. Then, introducing portions 78 which are widened toward the end so as to facilitate insertion and removable of the cam follower are respectively formed on respective opening portions of the front inner peripheral cam groove 75 and the rear inner peripheral cam groove 76.

A linearly movable rotation restricted member 80 which is restricted such that it may be prohibited from being moved in the optical axis direction although it can be rotated in the rotation direction is fitted into the flange portion 15$b$ of the cam ring 15 having the above-mentioned arrangement. As shown in FIGS. 2 and 10, the linearly movable restricted member 80 includes an annular ring portion 80$a$ having outer and inner diameters substantially the same as those of the body portion 15$a$, two linearly movable guide pieces 80$b$ and 80$b$ continued to the inner periphery of the ring portion 80$a$ and two convex portion pieces 80$c$ and 80$c$ continued to the outer periphery of this linearly movable restricted member 80. Three recesses 81 are provided on the outer periphery of the ring portion 80$a$ of this linearly movable restricted member 80 at an equal space in the circumferential direction in order to avoid the rotation restricted member 80 from contacting with the cam follower, which will be described later on, of the one group ring 10.

The two linearly movable guide pieces 80$b$ and 80$b$ of the linearly movable restricted member 80 are located at positions displaced with each other 180 degrees in an opposing fashion and they are also protruded in the direction vertical to the plane direction of the ring portion 80. The two linearly movable guide pieces 80$b$ and 80$b$ are slidably engaged with two linearly movable guide grooves which will be described later on. Also, the two convex portion pieces 80$c$ and 80$c$ are projected toward the outside of the radius direction with a predetermined space in the circumferential direction. The two convex portion pieces 80$c$ and 80$c$ are slidably engaged with the aforementioned two first linearly movable guide grooves 38A and 38A of the fixed ring 16. In order to rotatably accommodate the ring portion 80$a$ of the linearly movable restricted member 80, an annular seat portion 15$c$ is provided at the inner periphery of the flange portion 15$b$ of the cam ring 15 as shown in FIGS. 7C and 8B.

The two group ring 12 of which rotation is restricted by the linearly movable restricted member 80 and which can be moved only in the optical axis direction is attached to the inner periphery of the cam ring 15. As shown in FIGS. 12 and 13, the two group ring 12 includes a cylindrical body portion 12$a$ having a cylindrical shape and a two group lens frame 12$b$ which forms an inner flange portion developed toward the inside of the radius direction in the intermediate portion of the axis direction of the cylindrical body portion 12$a$. A boss portion 12$c$ is provided at the inner periphery of the two group lens frame 12$b$ of the two group ring 12. The second lens group 4 formed of a combination of a plurality of lenses is attached to the boss portion 12$c$.

Two linearly movable guide grooves 83 and 83 with which the two linearly movable guide pieces 80$b$ and 80$b$ of the linearly movable restricted member 80 are slidably engaged are provided on the outer periphery of the cylindrical body portion 12$a$ of the two group ring 12. The two linearly movable guide grooves 83 and 83 are located at positions displaced from each other 180 degrees and they are shaped like straight line guide grooves so as to become parallel to the optical axis direction. Further, three sets of cam pin groups 84 which are slidably engaged with three sets of inner cam groove groups 74 provided in the inner periphery of the cam ring 15 are provided at the outer periphery of the cylindrical body portion 12a. The three sets of cam pin groups 84 are the same in height in the optical axis direction and they are also located at an equal space in the circumferential direction.

Each of the cam pin groups 84 is composed of a front cam pin 85 and a rear cam pin 86 located in the front and back of the optical axis direction. The front cam pin 85 and the rear cam pin 86 are slightly displaced from each other also in the circumferential direction. The front cam pin 85 of the cam pin group 84 is engaged with the front inner peripheral cam groove 75 of the inner cam groove group 84 and the rear cam pin 86 is engaged with the rear inner peripheral cam groove 76. At that time, while the two linearly movable guide pieces 80b and 80b of the linearly movable restricted member 80 are engaged with the two linearly movable guide grooves 83 and 83 provided in the outer periphery of the two group ring 12, the two convex portion pieces 80c and 80c of the linearly movable restricted member 80 are slidably engaged with the two first linearly movable guide grooves 38A and 38A of the fixed ring 16. For this reason, when the cam ring 15 is rotated, the two group ring 12 can be moved forward and backward only in the optical axis direction along the cam curve of the inner cam groove group 74 set by the front inner peripheral cam groove 75 and the rear inner peripheral cam groove 76 without being rotated relative to the fixed ring 16.

Operations done by the two group ring 12 and the cam mechanism of the cam ring 15 are as follows. The state in which the two group ring 12 is completely accommodated into the cam ring 15 is the non-shooting state of the camera apparatus. At that time, while the front cam pin 85 is located at the circulating portion 77e of the front inner peripheral cam groove 75, the rear cam pin 85 is projected rearward from the body portion 15a so that it is not engaged with the rear inner peripheral cam groove 76. When the cam ring 15 is rotated in the extending direction from this non-shooting state, the front cam pin 85 is moved from the circulating portion 77e to the second inclined surface portion 77b by the engagement between the front inner peripheral cam groove 75 and the front cam pin 85. As a consequence, the two group ring 12 is moved forward and backward in the optical axis direction without being rotated.

When the cam ring 15 is further rotated in the extending direction, the front cam pin 85 is moved along the second inclined surface portion 77b and reaches the horizontal portion 77c. Consequently, although the front cam pin 85 and the front inner peripheral cam groove 75 are disengaged from the cam engagement, one end of the two group ring 12 is brought in contact with the linearly movable restricted member 80 with the result that the front cam pin 85 can be prevented from being completely disengaged from the front inner peripheral cam groove 75. Subsequently, when the cam ring 15 is rotated in the extending direction, the front cam pin 85 is entered into the first inclined surface 77a so that the front cam pin 85 is again engaged with the front inner peripheral cam groove 75 in a cam engagement fashion. Further, when the cam ring 15 is rotated, the rear cam pin 86 approaches the rear inner peripheral cam groove 76 and then the rear cam pin 86 is engaged with the rear inner peripheral cam groove 76 in a cam engagement fashion. Consequently, the front and rear cam pins 85 and 86 are engaged with the front and rear inner peripheral cam grooves 75 and 76 in a cam engagement fashion.

When the cam ring 15 is further rotated in the extending direction, if the two group ring 12 is advanced so much that the front cam pin 85 is passed through the first inclined surface 77a, then the cam engagement between the front cam pin 85 and the front inner peripheral cam groove 75 is disengaged. However, in this case, the rear cam pin 86 is engaged with the rear inner peripheral cam groove 76 in a cam engagement fashion, whereby a further cam engagement can be maintained. Therefore, it is possible to further advance the two group ring 12 greatly by the cam engagement of only the rear cam pin 86 and the rear inner peripheral cam groove 76. At that time, since the introducing portions 78 which are widened in their ends are formed on the respective opening portions of the front and rear ends of the front inner peripheral cam groove 75 and the rear end of the rear inner peripheral cam groove 76, switching operations done when the cam engagement between the front cam pin 85 and the rear cam pin 86 can be carried out smoothly. It should be noted that operations done when the shooting state is changed to the non-shooting state become opposite to the aforementioned operations.

The automatic exposure apparatus 3 is attached to the front portion of the two group ring 12 in such a manner that it can be moved toward the optical axis direction by a predetermined distance while its movement in the rotation direction is being restricted. The automatic exposure apparatus 3 is the optical apparatus having a shutter function to shut and open a light path through which light passes, a variable iris function to change a diameter of the light path and a filter function to insert and extract a filter into and from the light path. This automatic exposure apparatus 3 includes an annular hollow holder 88, and a shutter diaphragm, an iris diaphragm and a filter diaphragm are disposed around a central hole so as to surround the central holes as shown in FIG. 12. Three guide protrusions 89 are disposed on the outer surface of the holder 88 at an equal spacing in the circumferential direction.

The two group ring 12 includes three protruded receiving portions 91 corresponding to the three guide protrusions 89 of the automatic exposure apparatus 3. The guide protrusions 89 are respectively engaged with these protruded receiving portions 91, whereby the automatic exposure apparatus 3 can be moved forward and backward in the optical axis direction by an amount of the spacing within the protruded receiving portion 91. Further, a plurality of compression coil springs 92 which show a specific example of a resilient member to bias the automatic exposure apparatus 3 and the two group ring 12 under spring force are interposed between the automatic exposure apparatus 3 and the two group ring 12. The position at which a plurality of compression coil springs 92 are extended most so that the automatic exposure apparatus 3 may become distant from the two group ring 12 most is the position of the shooting state. Conversely, the position at which a plurality of compression coil springs 92 are contracted most so that the automatic exposure apparatus 3 may become closet to the two group ring 12 is the position of the non-shooting state.

As shown in FIG. 29, one end of the flexible wiring board 160 is attached to the rear surface of the automatic exposure apparatus 3 and it is electrically connected to an actuator group of the automatic exposure apparatus 3. The automatic exposure apparatus 3 includes the actuator group (not shown) and the shutter mechanism, the variable iris mechanism and the filter mechanism can be moved selectively. The flexible wiring board 160 formed of a material with proper rigidity and which can be bent is electrically connected to this actuator group.

The flexible wiring board 160 is laid within the two group ring 12 so as to have proper reaction force so that a bad influence may not be imposed by its own reaction force even when the space between the two group ring 12 and the automatic exposure apparatus 3 is changed. The flexible wiring board has an arrangement shown in FIG. 30. More specifically, the flexible wiring board 160 is composed of a first end portion 160a on the side of the automatic exposure apparatus 3, a second end portion 160b led out to the outside of the two group ring 12 and a joint portion 160c for joining the first end portion 160a and the second end portion 160b.

The first end portion 160a of the flexible wiring board 160 is composed of a fixed portion 161 of substantially C-like shape and a connecting portion 162 provided between the fixed portion 161 and the joint portion 160c. Attachment holes 163 to fix this fixed portion 161 to the holder 88 of the automatic exposure apparatus 3 are provided on the fixed portion 161 of the flexible wiring board 160 at a plurality of places (six places in this embodiment) at a proper space in the circumferential direction. Of the six attachment holes 163, a recess portion 164 extended in an arc shape with a proper space in the radius direction is formed around the attachment hole 163 provided in the connecting portion 162. It is possible to set strength (rigidity) of the connecting portion 162 to desired strength by suitably selecting the shape, size and the like of this recess portion 164.

The first end portion 160a of the flexible wiring board 160 having the above-mentioned arrangement is fixed by using a fixing device based on soldering, for example. Reference numeral 165 in FIG. 29 denotes a soldered portion. However, it is needless to say that fixed screws, rivets or adhesives and other various kinds of fixing devices can be used as the fixing device of the fixed portion 161.

When the automatic exposure apparatus 3 to which this flexible wiring board 160 is connected is pushed by the one group ring 10 just before the non-shooting state and the cam groove is disposed such that the space between the two group ring 12 and the automatic exposure apparatus 3 may be minimized in the non-shooting state, it becomes possible to configure a collapsing type lens barrel 1 which is thinner than the related-art arrangement.

Figure 31A:
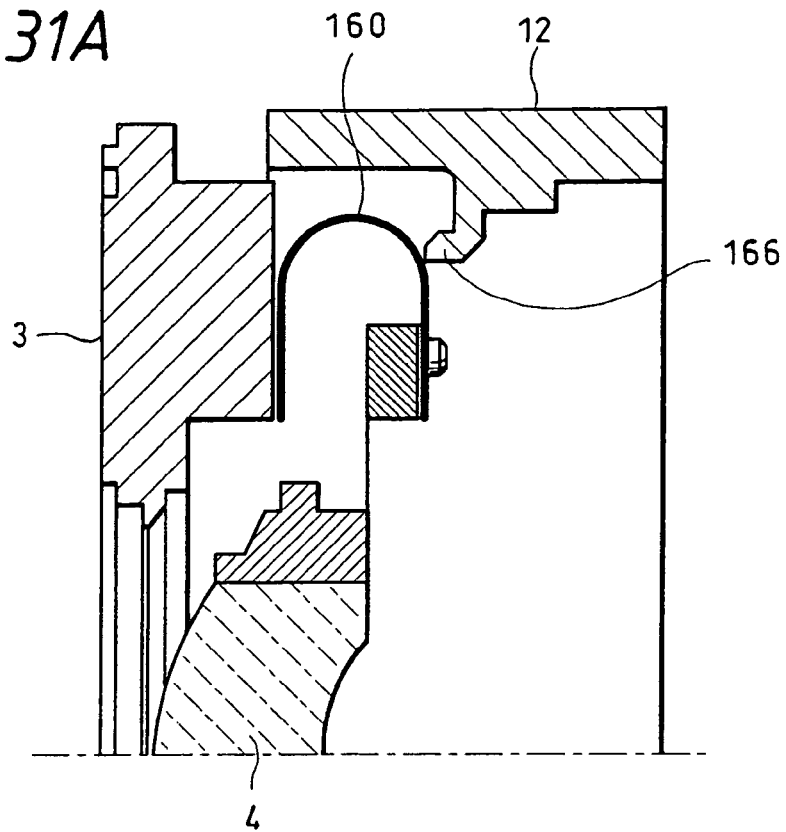
Figure 31B:
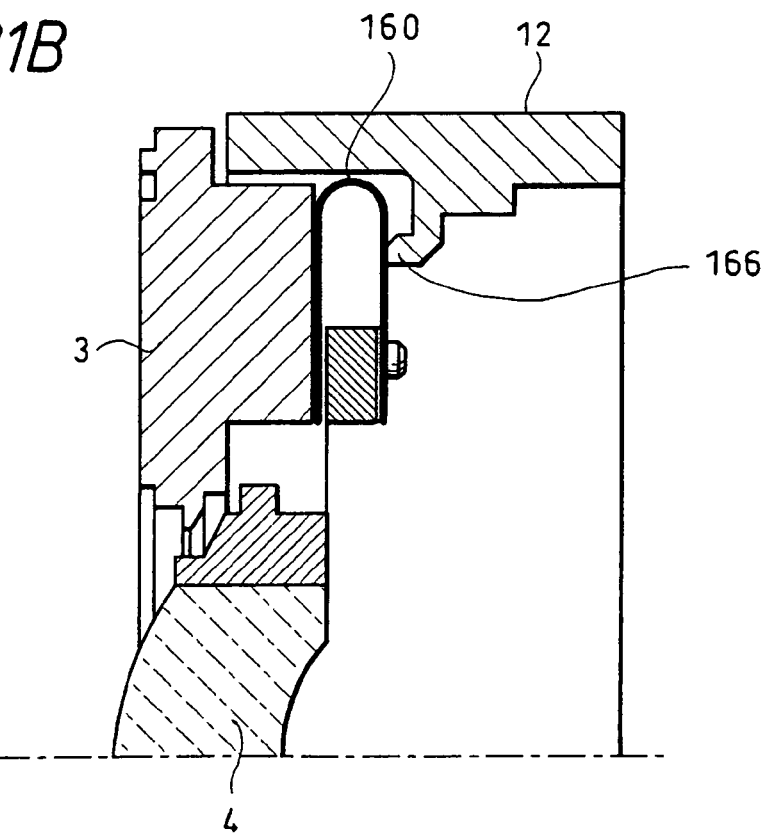

The flexible wiring board 160 having the above-mentioned arrangement is folded and accommodated within a space between the two group ring 12 and the automatic exposure apparatus 3 as shown in FIGS. 31A and 31B. According to the arrangement of the flexible wiring board 160, even when the space between the two group ring 12 and the automatic exposure apparatus 3 is changed in the shooting state and the non-shooting state, slackening produced by deformation of the flexible wiring board 160 can be accommodated into the above-described space. Thus, it becomes possible to decrease the whole thickness in the non-shooting state as compared with the case in which the accommodating space is provided in the outside of the two group ring 12. FIG. 31A shows the state presented before the convex portion 166 provided on the two group ring 12 is brought in contact with the flexible wiring board 160. FIG. 31B shows the state presented after the convex portion 166 was brought in contact with the flexible wiring board 160. Also, since the flexible wiring board 160 can be prevented from slidably contacting with other assemblies, breaking of wire and scratches can be prevented.

Further, since the flexible wiring board 160 is electrically connected to the automatic exposure apparatus 3 by the soldered portion 165, reaction force produced by deformation of the flexible wiring board 160 can be alleviated and stress applied to the soldered portion 165 can be decreased. Furthermore, since restrictions on the layout of the soldered portion 165 and the bent portion can be removed by the shape and layout of the above-described recess portion 164, freedom in design can be increased, which can contribute to miniaturization and decrease of thickness of the lens.

Also, in the non-shooting state, the boss portion 12c of the two group ring 12 is entered into the central hole 88a of the holder 88 of the automatic exposure apparatus 3. To this end, the diameter of the central hole 88a is set to be larger than that of the boss portion 12c. Further, the tip end surface of the boss portion 12c is configured to extend through the central hole 88a and to become substantially flush with the front surface of the holder 88. Therefore, in the non-shooting state, diaphragms of the shutter function, the variable iris function and the filter function of the automatic exposure apparatus 3 should be moved from the central hole 88 to the outside. In order to maintain these functions, a space restricting member 94 is interposed between the automatic exposure apparatus 3 and the two group ring 12.

The space restricting member 94 has an arrangement shown in FIG. 12. The space restricting member 94 includes a ring portion 94a rotatably fitted into the boss portion 12c of two group ring 12 and a lever portion 94b formed so as to project from the outer periphery of the ring portion 94a to the outside of the radius direction. A cam protrusion 94c that is extended in the direction vertical to the direction of the plane of the ring portion 94a is provided at the tip end of the lever portion 94. This cam protrusion 94c is extended through a hole defined in the two group lens frame 12b to the opposite side of the automatic exposure apparatus 3 in the state in which the space restricting member 94 is assembled into the two group ring 12. Then, the space restricting member 94 is constantly biased in a predetermined rotation direction by a torsion spring 95 which shows a specific example of a resilient member.

Further, the ring portion 94a of the space restricting member 94 includes three stopper portions 94d to prevent the automatic exposure apparatus 3 and the two group ring 12 from approaching each other more than a predetermined amount. The three stopper portions 94d are located at substantially an equal space in the circumferential direction on the surface opposite to the side in which the cam protrusion 94c of the ring portion 94a is protruded. When the lens barrel 1 is set to the state just before the non-shooting state, the cam protrusion 94c of the space restricting member 94 is brought in contact with the cam protrusion 18e protruded forward from the rear surface portion 18a of the rear barrel 18. When the lens barrel 1 is further moved to the direction of the non-shooting state from this state, the space restricting member 94 is rotated in accordance with the cam surface of the cam protrusion 94c and the cam surface of the cam protrusion 18e by a predetermined amount.

As a result, when the space restricting member 94 is rotated by a predetermined amount, the three stopper portions 94d are moved to the rearward of the optical axis direction. As a consequence, since the automatic exposure apparatus 3 becomes able to move to the direction in which it may approach the two group ring 12, it becomes possible to shorten the length of the optical axis direction 12 by accommodating the two group ring 12 into the automatic exposure apparatus 3. On the other hand, in the shooting state, the three stopper portions 94d of the space restricting member 94 are interposed between the automatic exposure apparatus 3 and the two group ring 12. Therefore, it is possible to prevent the space between the automatic exposure apparatus 3 and the two group ring 12 from being decreased more than necessity by restricting the space therebetween with the stopper portions 94d.

According to the above-mentioned arrangement, even when unintentional external force and shock is applied to the lens barrel 1 in the shooting state, the space between the automatic exposure apparatus 3 and the two group ring 12 can be prevented from being narrowed more than a predetermined amount. For this reason, the automatic exposure apparatus 3 can be prevented from being urged against the two group ring 12, whereby suitable functions such as the shutter function and the variable iris function of the automatic exposure apparatus 3 can be protected. In addition, the thickness from the two group ring 12 to the automatic exposure apparatus 3 in the non-shooting state can be decreased as compared with the thickness in the shooting state.

As shown in FIGS. 2 and 3 and the like, the one group ring 10 is relatively attached to the outer periphery of the body portion 15a of the cam ring 15 so as to become rotatable freely. As shown in FIGS. 2 and 4 and so on, the one group ring 10 includes a cylindrical body portion 10a into which the body portion 15a is inserted inside, an outer flange portion 10b continued to one end of the axial direction of the cylindrical body portion 10a and which is developed to the outside of the radius direction and an inner flange portion 10c continued to the front side serving as the other end of the axial direction of the cylindrical body portion 10a and which is continued to the inside of the radius direction. Further, three brackets 10d projected in the backward of the optical axis direction are provided on the cylindrical body portion 10a of the one group ring 10 at an equal space in the circumferential direction.

The three brackets 10d include guide convex portions 97 projected toward the outside of the radius direction and cam pins 98 which show a specific example of the cam follower projected toward the inside of the radius direction. Although the guide convex portions 97 and the cam pins 98 are located so as to overlap with each other at the same position, while the guide convex portions 97 are integrally formed with part of the brackets 10d, the cam pins 98 are formed integrally with the brackets 10d by inserting different members thereto with pressure. That is, the guide convex portion 97 is formed of a block-like portion extended in the optical axis direction and the three guide convex portions 97 are slidably engaged with a linearly movable guide groove, which will be described later on, of the linearly movable ring 14.

The three cam pins 98 are cam followers which are slidably engaged with the three outer cam grooves 65 provided at the outer periphery of the body portion 15a of the cam ring 15. The cam pin 98 includes a pin head portion 98a in slidable contact with the outer cam groove 65, a fixed portion 98b fitted into an attachment hole of the bracket 10d with pressure and a flange portion 98c provided between the fixed portion 98b and the pin head portion 98a. The flange portion 98c plays a role to limit the insertion depth of the fixed portion 98b to thereby hold a projected amount of the pin head portion 65a at a predetermined amount. An operation surface 99 with which the pressing portion 72 of the cam ring 15 contacts is provided at one side surface of the bracket 10d in which suitable members such as the cam pin 98 are provided. The operation surface 99 is set to an inclination angle corresponding to the inclined surface of the pressing portion 72 and this inclination angle is approximately 45 degrees.

This one group ring 10 is attached to the inner periphery of the linearly movable ring 14 in such a manner that it can be restricted from moving toward the rotation direction and that it can be moved only in the optical axis direction. As shown in FIGS. 2 and 11, the linearly movable ring 14 includes a cylindrical body portion 14a into which the one group ring 10 is inserted and an outer flange portion 14b provided at one end of the optical axis direction of the cylindrical body portion 14a and which is also developed at the outside of the radius direction. The outer flange portion 14b includes three projected portions 14c which are slidably engaged with the three linearly movable guide grooves 38B, 38B and 38C provided on the inner periphery of the fixed ring 16. The three projected portions 14c are located at positions corresponding to the three linearly movable guide grooves 38B, 38B and 38C, respectively.

Three linearly movable guide grooves 101 which are slidably engaged with three guide convex portions 97 provided on the outer periphery of one group ring 10 are provided at the inner periphery of the cylindrical body portion 14a of the linearly movable ring 14. The three linearly movable guide grooves 101 are located at substantially an equal space in the circumferential direction and they are linearly extended in the optical axis direction in parallel to each other. In each of the linearly movable guide grooves 101, while the end portion of the side of the outer flange portion 14b is opened to the end surface of the cylindrical body portion 14a, the end portion of its opposite side is interrupted at the intermediate portion of the optical axis direction. Thus, while the one group ring 10 is able to enter the linearly movable ring 14 on the side of the outer flange portion 14b, it comes to a dead end on the tip end side of the side of the anti-outer flange portion 14b so that the one group ring 10 can be prevented from being dropped from the tip end side unintentionally.

A decorative ring 102 for use with the linearly movable ring 14 so as to mainly save an appearance of the lens barrel 1 is attached to and integrally formed with the outer periphery of the linearly movable ring 14. Then, the cam ring 15 is attached to the inner periphery of the linearly movable ring 14 attached to the inner periphery of the fixed ring 16.

More specifically, the three cam pins 98 provided at the inner periphery of the one group ring 10 are slidably engaged with the three outer cam grooves 74 provided at the outer periphery of the cam ring 15, respectively. Then, the three guide convex portions 97 provided at the outer periphery of the one group ring 10 are slidably engaged with the three linearly movable guide grooves 101 formed in the inner periphery of the linearly movable ring 14. Further, the three projected portions 14c projected to the outer periphery of the linearly movable ring 14 are slidably engaged with the three linearly movable guide grooves 38B, 38B and 38C provided in the inner periphery of the fixed ring 16, respectively. Concurrently therewith, the three cam projected portions 57A, 57B and 57C provided on the flange portion 15b of the cam ring 15 are slidably engaged with the three cam grooves 37A, 38B and 37C provided in the inner periphery of the fixed ring 16, respectively. Further, the two convex portion pieces 80c of the linearly movable restricted member 80 held on the cam ring 15 are slidably engaged with the two linearly movable guide grooves 38A and 38A provided in the inner periphery of the fixed ring 16, respectively.

As described above, in the linearly movable ring 14 and the linearly movable restricted member 80, since the three projected portions 14c of the linearly movable ring 14 are engaged with the three cam grooves 37A, 37B and 37C of the fixed ring 16 and the two convex portion pieces 80c of the linearly movable restricted member 80 are engaged with the two linearly movable guide grooves 38A and 38A of the fixed ring 16, the linearly movable ring 14 and the linearly movable restricted member 80 can be integrally moved in the optical axis direction by a length in which the cam ring 15 is moved in the optical axis direction without being relatively rotated to the fixed ring 16. Also, since the three guide convex portions 97 of the one group ring 10 are engaged with the three linearly movable guide grooves 101 of the linearly movable ring 14, the one group ring 10 can be moved forward and backward in the optical axis direction in response to a rotation amount of the cam ring 15 without being rotated. It should be noted that the one group ring 10 and the two group ring 12 are biased so as to be attracted with each other in the optical axis direction under spring force of a plurality of coil springs 103 which show a specific example of a resilient member.

Operations of the one group ring 10 and the cam mechanism of the cam ring 15 are as follows. As shown in FIGS. 16A, 16B, FIGS. 17A, 17B and FIGS. 18A, 18B, the state in which the one group ring 10 is completely retracted into the cam ring 15 is the non-shooting state of the camera apparatus. At that time, the rear end side of the outer cam groove 65 of the cam ring 15 is opened and the cam pin 98 in this camera non-shooting state is located at the holding portion 73 of the opened cam groove opening portion 71 and it is therefore disengaged from the outer cam groove 65. When the cam ring 15 is rotated in the extending direction from this state, the pressing portion 72 of the cam ring 15 collides with the operation surface 99 of the bracket 10d of the one group ring 10 so that the one group ring 10 is elevated by the thus inclined operation surface 99. The one group ring 10 is moved in the optical axis direction by pushing and elevating force of this cam ring 15 without being rotated relative to the fixed ring 16.

Further, when the cam ring 15 is rotated to an extent that the cam ring 15 lies in the extending direction, the cam pin 98 is engaged with the outer cam groove 65. When the cam ring 15 is further rotated, the contacted state between the pressing portion 72 of the cam ring 15 and the operation surface 99 of the one group ring 10 is released. After that, the one group ring 10 can be moved forward and backward in the optical axis direction along the cam curve (trajectory) of the outer cam groove 65 in response to the rotation amount of the cam ring 15 without being rotated relative to the fixed ring 16. At that time, since the open end of the outer cam groove 65 is increased in width to the end, it is possible to reliably and easily engage the cam pin 98 with the outer cam groove 65. It should be noted that movements obtained when the camera apparatus is changed from the shooting state to the non-shooting state become opposite to the aforementioned operations.

As shown in FIGS. 2 and 14, a plurality of staircase-like fixed portions 105 of which heights are changed in the optical axis direction are provided on the inner flange portion 10c provided on the inner periphery of the one group ring 10. The one group lens frame 11 is held to and fixed to the one group ring 10 by using a plurality of fixed portions 105 provided on the inner flange portion 10c. The one group lens frame 11 is formed of an annular member fitted into the inner flange portion 10c and the first lens group 2 formed of a combination of a plurality of lenses is held at the inner periphery of the one group lens frame 11. A plurality of sets (three sets in this embodiment) of sandwiching protrusions 106 to fix the one group lens frame 11 to the one group ring 10 are provided on the outer periphery of the one group lens frame 11 at substantially an equal space in the circumferential direction.

Each of the sandwiching protrusions 106 is formed of a combination of a front protrusion 106a and a rear protrusion 106b which are located in the front and back of the optical axis direction at a predetermined clearance. The front protrusion 106a and the rear protrusion 106b are located with a small displacement in the circumferential direction. When the fixed portion 105 of the inner flange portion 10c is sandwiched from front and back by a plurality of sandwiching protrusions 106 having the above-mentioned arrangement, the one group lens frame 11 is fixed to one group ring 10. In this fixed state, when the one group lens frame 11 is rotated in the circumferential direction, the one group lens frame 11 may be moved forward and backward in the optical axis direction by an amount of a stepped portion of the staircase shape in response to the rotation amount. Reference numeral 108 in FIG. 14 and the like denotes a decorative ring which covers the circumference of the first lens group 2.

As shown in FIGS. 2 to 4, a lens barrier unit 110 to close the light path serving as the shooting opening to thereby protect the shooting optical system in the non-shooting state is provided at the front end of the one group ring 10. The lens barrier unit 110 includes an annular barrier main body 110a, a pair of opening and closing diaphragms 110b rotatably supported to the barrier main body 110a, a diaphragm opening and closing mechanism 110c to open and close the opening and closing diaphragms 110b and the like. A plurality of engagement clicks 110d are provided on the barrier main body 110a at substantially an equal space in the circumferential direction. The lens barrier unit 110 is fixed to the one group ring 10 by engaging those engagement clicks 110d with the inner periphery of the cylindrical body portion 10a.

The diaphragm opening and closing mechanism 110c of the lens barrier unit 110 includes a drive arm to rotate the opening and closing diaphragms 10b although not shown. The drive arm may be rotated by relative movement toward the optical axis direction. Accordingly, when the drive arm is rotated by the relative movement toward the optical axis direction, the light path of the lens barrier unit 110 can be opened and closed by opening and closing the opening and closing diaphragms 110b.

Also, as shown in FIGS. 2, 3 and 4, a decorative ring 112 to keep an appearance of the lens barrel 1 is attached to the one group ring 10. This decorative ring 12 may play a role similar to that of the decorative ring 102 for use with the linearly movable ring 14 and it is attached to the one group ring 10, thereby being integrally fixed to the one group ring 10. While suitable materials of these decorative rings 112 and 102 are metals such as aluminum alloy and stainless steel, it is needless to say that engineering plastic can be used as the above-mentioned materials. Also, while suitable materials of the one group ring 10, the one group lens frame 11, the two group ring 12, the linearly movable ring 14, the cam ring 15, the fixed ring 16, the three group lens frame 17 and the rear barrel 18 are fiber reinforced plastic (FRP), it is needless to say that ABS (acrylonitrile-butadiene-styrene) resin and other engineering plastic can be used as the above-mentioned materials and that aluminum alloy and other metal can be used as the above-mentioned materials.

As shown in FIGS. 3 and 4, the flexible wiring board 15 is electrically connected to the automatic exposure apparatus 3. One end of the flexible wiring board 115 is connected to a wiring circuit of an actuator to drive the shutter mechanism, the variable iris mechanism of the automatic exposure apparatus 3 and the like. The other end of the flexible wiring board 115 is electrically connected to an electric power source installed at the outside of the lens barrel 1. One end of the flexible wiring board 115 is laid within the two group ring 12 with proper slackening such that a bad influence may not be caused by its own reaction force even when a space between the automatic exposure apparatus 3 and the two group ring 12 is changed.

As described above, the outer cam groove 65 of the cam ring 15 is configured in such a manner that the automatic exposure apparatus 3 assembled into the two group ring 12 is urged against the two group ring 12 just before the non-shooting state and that the space between the two group ring 12 and the automatic exposure apparatus 3 may be minimized in the non-shooting state. As a consequence, it becomes possible to realize a thinner collapsing type lens barrel as compared with the related-art lens barrel in the non-shooting state.

FIGS. 19A, 19B, FIGS. 20A, 20B, FIGS. 21A, 21B, 21C, FIGS. 22A, 22B, 22C, FIGS. 23A, 23B, FIG. 24, FIG. 25,

FIGS. 26A, 26B, FIGS. 27A, 27B and FIGS. 28A, 28B are diagrams to which reference will be made in explaining the state in which the lens barrel 1 is extended from the barrel retracted state and changed to the zooming state. Next, the changed states of the lens barrel 1 will be described in brief.

FIGS. 19A, 19B and FIGS. 20A, 20B show the state in which the lens barrel 1 is placed in the barrel retracted state. In this state, the three cam pins 98 of the one group ring 10 are accommodated within the holding portion 73 provided outside the cam groove opening portion 71 opened to the side of the flange portion 15b in the barrel retracting operation area 66 of the outer cam groove 65 of the cam groove 15. At that time, of the three cam pins 98, the two cam pins 98 are located at the two recess portions 55a and 55b of the flange portion 15b. On the other hand, the remaining one cam pin 98 is inserted into the through-hole 62 defined in the first flange portion 54a and thereby it is exposed to the rear surface side of the flange portion 15b as shown in FIGS. 16A and 16B.

Operations in which the one group ring 10 is moved forward and backward are executed when the cam ring 15 is rotated relative to the one group ring 10 based on rotation of the drive gear 22 by the deceleration gear unit 21. First, the extending operation of the one group ring 10 will be described. When the cam ring 15 is rotated in the extending direction, first, the cam ring 15 is changed to the states shown in FIGS. 21A, 21B and 21C. At that time, the pressing portion 72 provided on the cam ring 15 contacts with the inclined operation surface 99 of the bracket 10d provided on the one group ring 10 so that the pressing portion 72 presses the operation surface 99 in the circumferential direction. At that time, force directing toward the optical axis direction is generated by actions of the inclined surface of the pressing portion 72 and the inclined surface of the operation surface 99.

The pressing portion 72 contacts with the operation surface 99 to change the cam pin 98 from the states shown in FIGS. 21A, 21B and 21C to the states shown in FIGS. 22A, 22B and 22C. More specifically, the contact of the pressing portion 72 and the operation surface 99 is gradually moved from the tip end to the base end side of the bracket 10d. Then, when the cam pin 98 is completely inserted into the outer cam groove 65, as shown in FIGS. 23A, 23B and FIG. 24, the contact between the pressing portion 72 and the operation surface 99 is changed to a contact between the cam pin 98 and one side surface of the outer cam groove 65. After that, by the contact between the cam pin 98 and the outer cam groove 65, the cam pin 98 is guided by the outer cam groove 65 and hence optical zooming operations shown in FIG. 25, FIGS. 26A, 26B, FIGS. 27A, 27B and FIGS. 28A, 28B are executed.

FIG. 25 and FIGS. 26A and 26B show the states in which the lens barrel 1 is moved from the barrel retracting operation area 66 to the zooming operation area 67. When the lens barrel 1 is changed from these states to the states shown in FIGS. 27A and 27B, since such change is a change in which the first lens group 2 approaches the second lens group 4, the wide angle (wide-angle lens) side is increased. On the other hand, when the lens barrel 1 is changed from the states shown in FIGS. 27A and 27B to the states shown in FIGS. 28A and 28B, since such change is a change in which the first lens group 2 comes away from the second lens group 4, a telephoto (telephoto lens) side is increased.

The retracting operations of the one group ring 10 are carried out by operations opposite to those shown in FIGS. 19A, 19B to FIGS. 28A and 28B.

Figure 32:
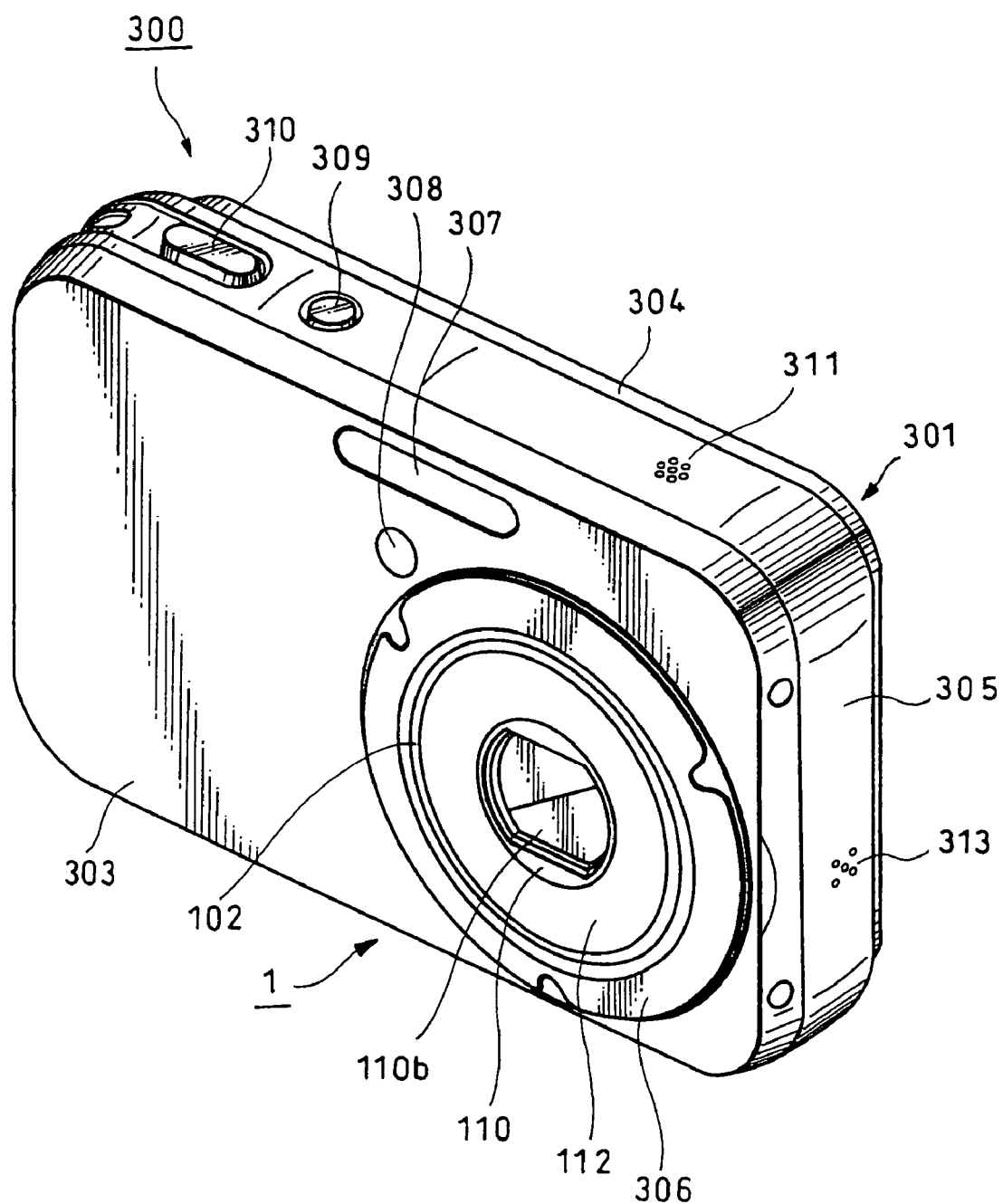
FIG. 32 is a perspective view of a digital still camera showing the embodiment of the camera apparatus using the lens barrel shown in FIG. 1, illustrating the state in which the lens barrel is retracted from the front side.
Figure 33:
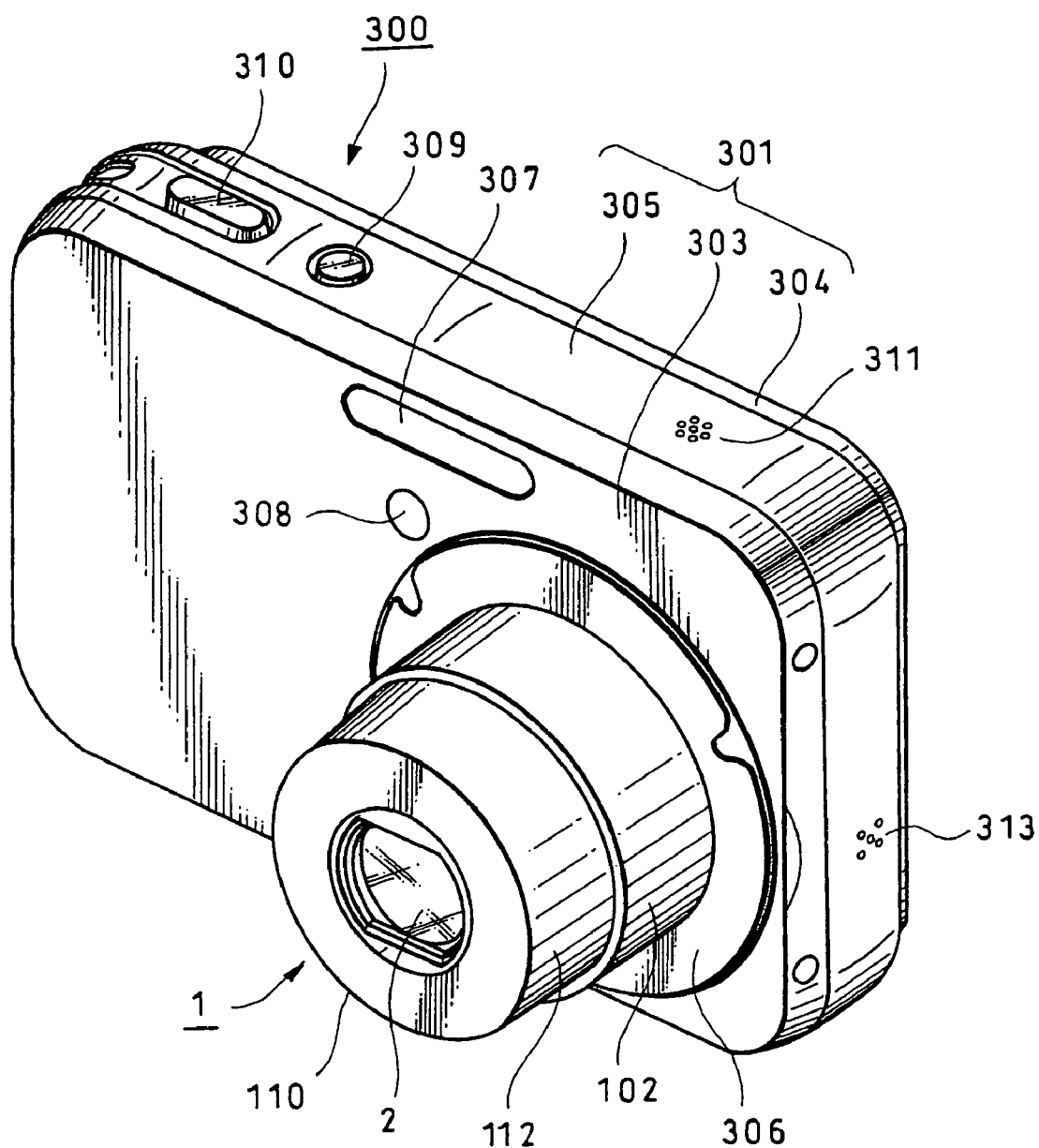
FIG. 33 is a perspective view of a digital still camera showing the embodiment of the camera apparatus using the lens barrel shown in FIG. 1, illustrating the state in which the lens barrel is extended from the front side.
Figure 34:
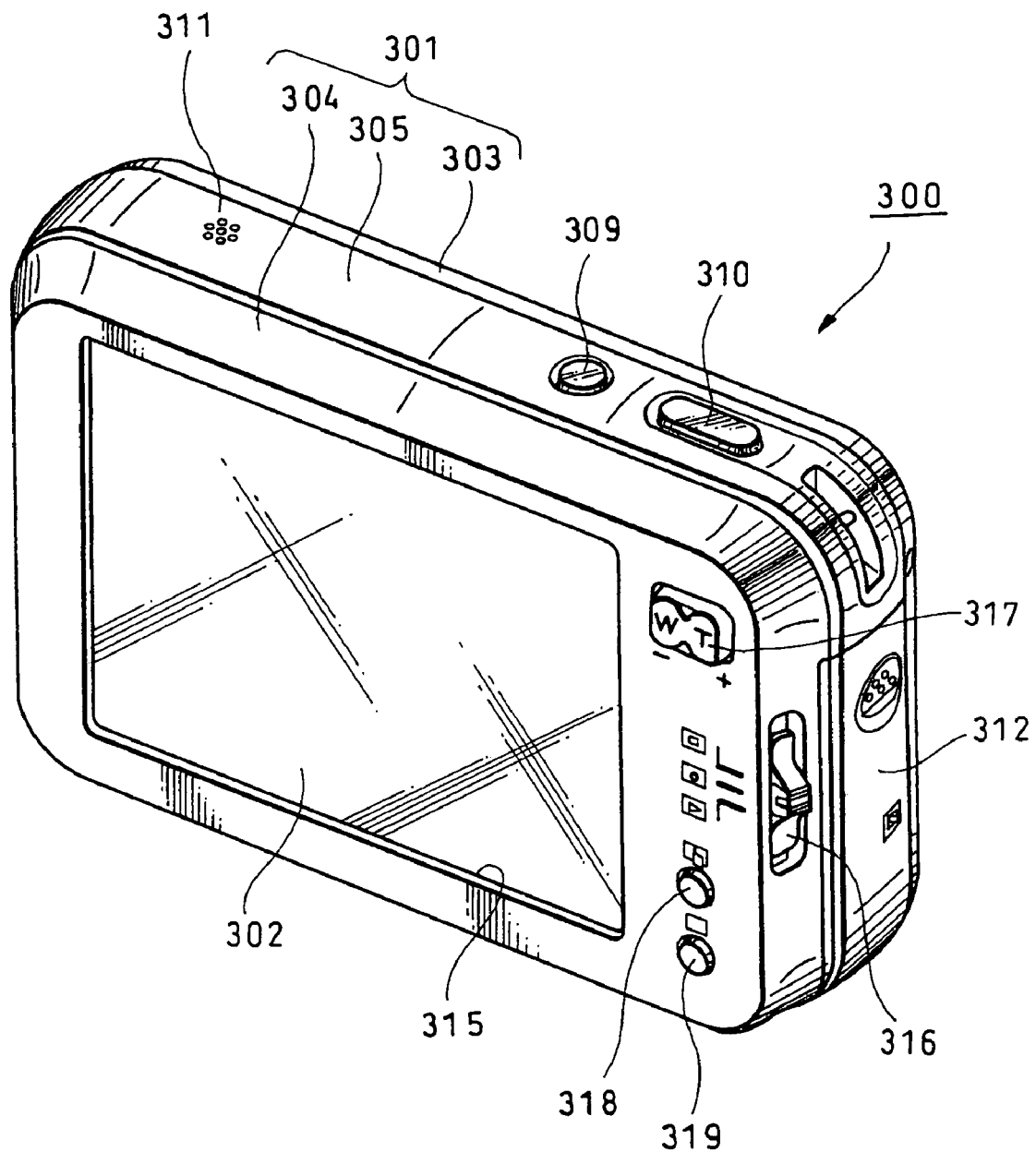
FIG. 34 is a perspective view of a digital still camera showing the embodiment of the camera apparatus using the lens barrel shown in FIG. 1, illustrating the digital still camera from the rear side.

A digital still camera 300 shown in FIGS. 32 to 34 shows a first embodiment of a camera apparatus configured by using the aforementioned lens barrel 1 according to the present invention. This digital still camera 300 may use a semiconductor recording media as an information recording medium, may convert an optical image from an object into an electric signal by a CCD (charge-coupled device (solid-state image pickup device)) and may record such electric signal on the semiconductor recording media or may display such electric signal on a flat display panel 302 that is a display apparatus such as a liquid-crystal display.

This digital still camera 300 includes the above-described lens barrel 1 to pick up an object image as light to introduce this light into a CCD (charge-coupled device) serving as an image pickup device, a camera case 301 in which the lens barrel 1 and other apparatus and equipment are housed, the flat display panel 302 serving as a display apparatus formed of a liquid-crystal display and the like to display an image based on a video signal outputted from the CCD, a control apparatus to control operations of the lens barrel 1, displaying on the flat display panel 302 and the like, a battery power supply (not shown) and the like.

The camera case 301 is formed of an oblong flat container and it is composed of a front case 303 and a rear case 304 which are put one upon another in the front and back direction, a center case 305 formed of a substantially rectangular frame body interposed between the front case 303 and the rear case 304 and the like. An annular decorative ring 306 is attached to the front surface of the front case 303 at its position slightly displaced from the center to one side and the one group ring 10 of the front side of the lens barrel 1 is opposed to a central hole 307 of the decorative ring 306 such that it can be moved forward and backward and the like.

FIG. 32 shows the non-shooting state (barrel retracting state) of the lens barrel 1 and which corresponds to FIG. 1A. A substantially whole of the front surface of the lens barrel 1 is configured to become substantially flush with the front surface of the front case 303. Also, FIG. 33 shows the shooting state (extended state) of the lens barrel 1 and which corresponds to FIG. 1B. As shown in FIG. 33, the decorative ring 112 including the one group ring 10 and the decorative ring 102 including the linearly movable ring 14 are extended in an inserted fashion.

A light-emitting portion 307 of a flash apparatus and a light-emitting/light-receiving portion 308 of an auto-focus mechanism are provided on the slanting upper portion of the lens barrel 1 of the front case 303. Also, a power button 309, a shutter release button 310, sound collecting holes 311 of a sound collecting apparatus such as a microphone and the like are formed on the upper surface of the center case 305. Further, a battery compartment portion in which batteries serving as a power supply are detachably accommodated is provided on one side surface portion of the center case 305 and a battery lid 312 is detachably engaged with the battery compartment portion. Then, speaker holes 313 for use with a speaker apparatus are formed on the side surface portion of the opposite side of the battery lid 312 of the center case 305.

A large display window 315 is opened at the rear case 304 and the flat display panel 302 is attached to the display window 315. The flat display panel 302 has a touch operation function by which a user is able to operate the camera apparatus by touching the display surface. Various kinds of operation switches are provided on one side of the flat display panel 302 of the rear case 304. While a mode change-over switch 316 to select function modes (still picture, moving picture, playback, etc.), an optical zoom operation button 317 to execute zoom operations, a menu button 317 to select various kinds of menus, a display switching button 319 to switch display on the screen and the like may be enumerated as the operation switches, the operation switches are not limited thereto and a direction key to move a cursor for selecting menus, a picture button to switch picture sizes and to delete pictures can also be provided as the operation switches.

A control apparatus to control the lens barrel 1, the flat display panel 302 and the like is housed within the camera case 301 having the above-mentioned arrangement. The control apparatus is configured by mounting a predetermined microcomputer, resistors, capacitors and other electronic parts on the wiring board, for example.

Figure 35:
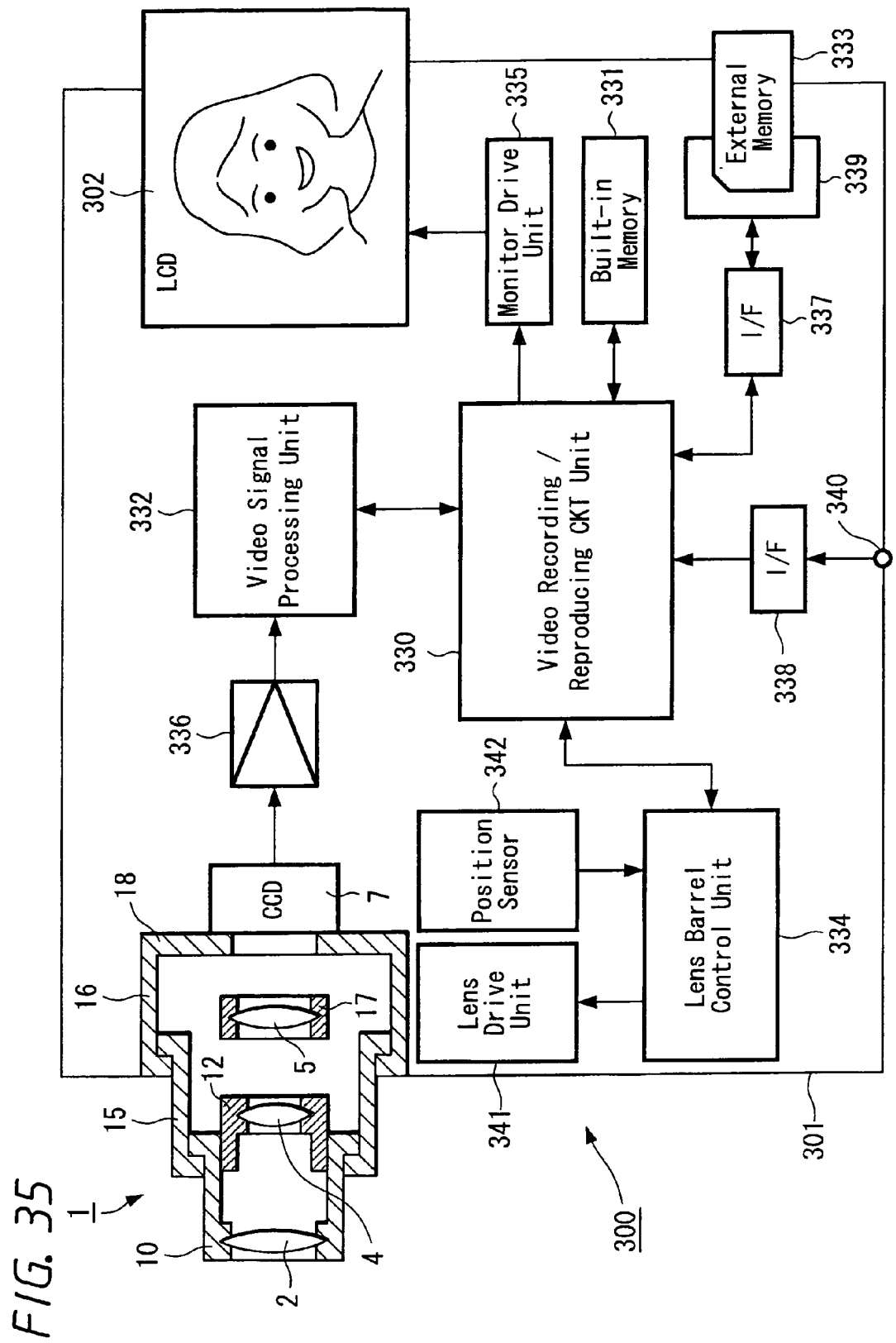
FIG. 35 is a block diagram showing a schematic arrangement of a digital still camera showing the embodiment of the camera apparatus using the lens barrel shown in FIG. 1.

FIG. 35 is a block diagram showing a first embodiment of a schematic arrangement of the digital still camera 300 including the lens barrel 1 having the aforementioned arrangement and actions. As shown in FIG. 35, this digital still camera 300 includes the lens barrel 1, a video recording/reproducing circuit unit 330 which plays a central role of the control apparatus, a built-in memory 331 including a program memory and a data memory to drive the video recording/reproducing circuit unit 330 and other RAM (random-access memory) and ROM (read-only memory), a video signal processing unit 332 to process a shot image and the like to provide a predetermined signal, the flat display panel 302 to display shot images and the like, an external memory 333 to expand a storage capacity, a lens barrel control unit 334 to drive and control the lens barrel 1 and the like.

The video recording/reproducing circuit unit 330 includes an operation circuit including a microcomputer (CPU), for example, and the like. The built-in memory 331, the video signal processing unit 332, the lens barrel control unit 334, the monitor driving unit 334, an amplifier 336 and two interfaces (I/Fs) 337 and 338 are connected to this video recording/reproducing circuit unit 330. The video signal processing unit 332 is connected to the CCD 7 attached to the lens barrel 1 through the amplifier 336. A signal processed as a predetermined signal by the video signal processing unit 332 is inputted to the video recording/reproducing circuit unit 330.

The flat display panel 302 is connected through the monitor driving unit 335 to the video recording/reproducing circuit unit 330. A connector 339 is connected to the first interface (I/F) 337 and the external memory 333 can be detachably connected to this connector 339. Also, a connection terminal 340 provided on the camera case 301 is connected to the second interface (I/F) 338. Then, the lens drive unit 341 to drive and control the lens barrel 1 and a position sensor 342 to detect a rotation amount of the lens barrel 1, a movement amount of the lens barrel 1 to the optical axis direction and the like are connected to the lens barrel control unit 334.

Thus, when an object image is inputted to the lens system of the lens barrel 1 and focused on the focusing screen of the CCD 7, an image signal from the CCD 7 is inputted through the amplifier 336 to the video signal processing unit 332. A signal processed as a predetermined video signal by the video signal processing unit 332 is inputted to the video recording/reproducing circuit unit 330. Accordingly, the signal corresponding to the object image is outputted from the video recording/reproducing circuit unit 330 to the monitor drive unit 335 and the built-in memory 331 or the external memory 333. As a result, an image corresponding to the object image is displayed on the flat display panel 302 or the image corresponding to the object image is recorded on the built-in memory 331 or the external memory 333 as an information signal if necessary.

The digital still camera 300 having the above-mentioned arrangement can be used as follows, for example. FIG. 32 shows the state in which the optical lens system is closed by closing the opening and closing spring lob of the lens barrier unit 110 in the lens barrel 1, that is, the non-shooting state. In this case, the power supply of the digital still camera 300 is set to the off-state. Also, FIG. 33 shows the state in which the optical lens system is opened by opening the opening and closing spring lob of the lens barrier unit 110, that is, the shooting possible state. This shooting possible state can be automatically executed by operating the power supply button 309 to turn on the power supply. As a result, the digital still camera 300 is changed from the state shown in FIG. 32 to the state shown in FIG. 33.

In the shooting possible state of the digital still camera 300, when a cameraman directs the camera lens to the object and presses the shutter release button 310, the cameraman is able to take a picture of the object and is able to get an image of the object. In that case, when the cameraman operates the optical zoom operation button 317, it is possible to obtain a wide (wide-angle lens) picture or telephoto (telephoto-lens) picture by continuously changing a focal length in response to the operation direction without changing an image point.

As set forth above, according to the present invention, in the lens barrel including the cam ring with the outer peripheral gear train, it is possible to increase the length of the optical axis direction of the cam groove without increasing the whole length of the optical axis direction of the cam ring. Therefore, since the length of the optical axis direction of the cam groove is not changed, it is possible to decrease the whole length of the optical axis direction of the cam ring, accordingly, it is possible to miniaturize the whole of the lens barrel. While the lens is used as the optical element as described above in the above-described embodiments, the optical element is not limited to the above-described embodiments and it is needless to say that an optical filter, a prism and other optical elements, for example, can be used.

The present invention is not limited to the embodiments that have been described so far with reference to the drawings and it can be variously modified without departing from the gist thereof. For example, while the digital still camera is applied to a camera apparatus in the above-described embodiments, the present invention is not limited thereto and the present invention can be applied to a digital video camera, a personal computer having a built-in camera, a mobile phone having a built-in camera and other camera apparatus. Further, while the three group lens is used as the optical lens as described above, the present invention is not limited thereto and it is needless to say that lenses less than a two group lens or lenses greater than a four group lens may be used as the optical lens.

It should be understood by those skilled in the art that various modifications, combinations, sub-combinations and alterations may occur depending on design requirements and other factors insofar as they are within the scope of the appended claims or the equivalents thereof.

What is claimed is:

1. A lens barrel comprising:
   a light amount adjuster capable of adjusting a light amount of a lens system and which can be moved in the optical axis direction of said lens system;
   an adjacent member adjacent to said light amount adjuster and which can be moved relatively in said optical axis direction; and
   a flexible wiring board one end of which is fixed to said light amount adjuster and of which the other end is led out through said adjacent member, wherein a fixed portion of one end of said flexible wiring board is fixed to said light amount adjuster in a two-dimensional fashion and an intermediate portion of said flexible wiring board is bent like a U shape at a space portion formed between said light amount adjuster and said adjacent member in the optical axis direction, inverted approximately 180 degrees and opposed to said fixed portion in the optical axis direction, wherein one end of said flexible wiring board is formed of a fixed portion fixed by a predetermined fixing device and a recess portion is formed on a portion extended from said fixed portion to a bent portion of the intermediate portion to thereby decrease rigidity, and wherein said fixed portion is a C-like hole in which an outside of said bent portion is formed as a convex portion.

2. A lens barrel comprising:

a light amount adjuster capable of adjusting a light amount of a lens system and which can be moved in the optical axis direction of said lens system;

an adjacent member adjacent to said light amount adjuster and which can be moved relatively in said optical axis direction; and a flexible wiring board one end of which is fixed to said light amount adjuster and of which the other end is led out through said adjacent member, wherein a fixed portion of one end of said flexible wiring board is fixed to said light amount adjuster in a two-dimensional fashion and an intermediate portion of said flexible wiring board is bent like a U shape at a space portion formed between said light amount adjuster and said adjacent member in the optical axis direction, inverted approximately 180 degrees and opposed to said fixed portion in the optical axis direction, wherein said adjacent member is a linearly movable ring to hold an optical element forming a part of said lens system and which can be moved only in said optical axis direction and of which rotation movement is restricted.

* * * * *